US009859886B2

(12) United States Patent
Emmerich et al.

(10) Patent No.: US 9,859,886 B2
(45) Date of Patent: Jan. 2, 2018

(54) SWITCH DEVICE AND USE OF THE SWITCH DEVICE

(71) Applicant: Fraunhofer-Gesellschaft, Munich (DE)

(72) Inventors: Jan Soeren Emmerich, Solingen (DE); Michael Ten Hompel, Dortmund (DE)

(73) Assignee: Fraunhofer-Gesellschaft zur Foerderung der Angewandte Forschung e.v., Munich (DE)

( * ) Notice: Subject to any disclaimer, the term of this patent is extended or adjusted under 35 U.S.C. 154(b) by 0 days.

(21) Appl. No.: 15/249,629

(22) Filed: Aug. 29, 2016

(65) Prior Publication Data

US 2017/0063375 A1    Mar. 2, 2017

(30) Foreign Application Priority Data

Aug. 27, 2015    (DE) .................. 10 2015 011 181

(51) Int. Cl.
*H03K 17/968* (2006.01)
*H01H 25/04* (2006.01)

(52) U.S. Cl.
CPC ......... *H03K 17/968* (2013.01); *H01H 25/041* (2013.01)

(58) Field of Classification Search
CPC ............................ H01H 25/00; H01H 25/041
See application file for complete search history.

(56) References Cited

U.S. PATENT DOCUMENTS 6,525,280 B2 * 2/2003 Chan .................... H01H 25/041
200/4
6,573,464 B2 6/2003 Yen
6,888,075 B2 * 5/2005 Iwakiri .................. H01H 13/20
200/5 A
2002/0000976 A1 1/2002 Salminen et al.
2006/0131156 A1 6/2006 Voelckers
2006/0181517 A1 8/2006 Zadesky et al.
2006/0250377 A1 11/2006 Zadesky et al.
(Continued)

FOREIGN PATENT DOCUMENTS

DE    2108912 A1    10/1972
DE    7920191 U1    11/1979
(Continued)

OTHER PUBLICATIONS

Copending U.S. Appl. No. 15/120,560 which entered the US national phase on Aug. 22, 2016, based on international application No. PCT/EP2015/000408.
(Continued)

*Primary Examiner* — Jeffrey Zweizig
(74) *Attorney, Agent, or Firm* — Robert Lelkes

(57) ABSTRACT

A switch device (1) and its operation from an actuation side (51) are disclosed, the switch device having a plate-shaped main body (10), a plate-shaped actuation part (20), a connection device (30) located between the main body (10) and the actuation part (20) made from an elastic material, and at least one sensor (41, 42, 43, 44), which are located between the main body (10) and the actuation part (20) and viewed in the thickness direction (Z) are located at the side of the connection device (30), so that each sensor (41, 42, 43, 44) can be used to detect a position of one region, arranged on said sensor, of the second surface in the thickness direction (Z).

13 Claims, 39 Drawing Sheets

(56) References Cited

U.S. PATENT DOCUMENTS

Figure 4:
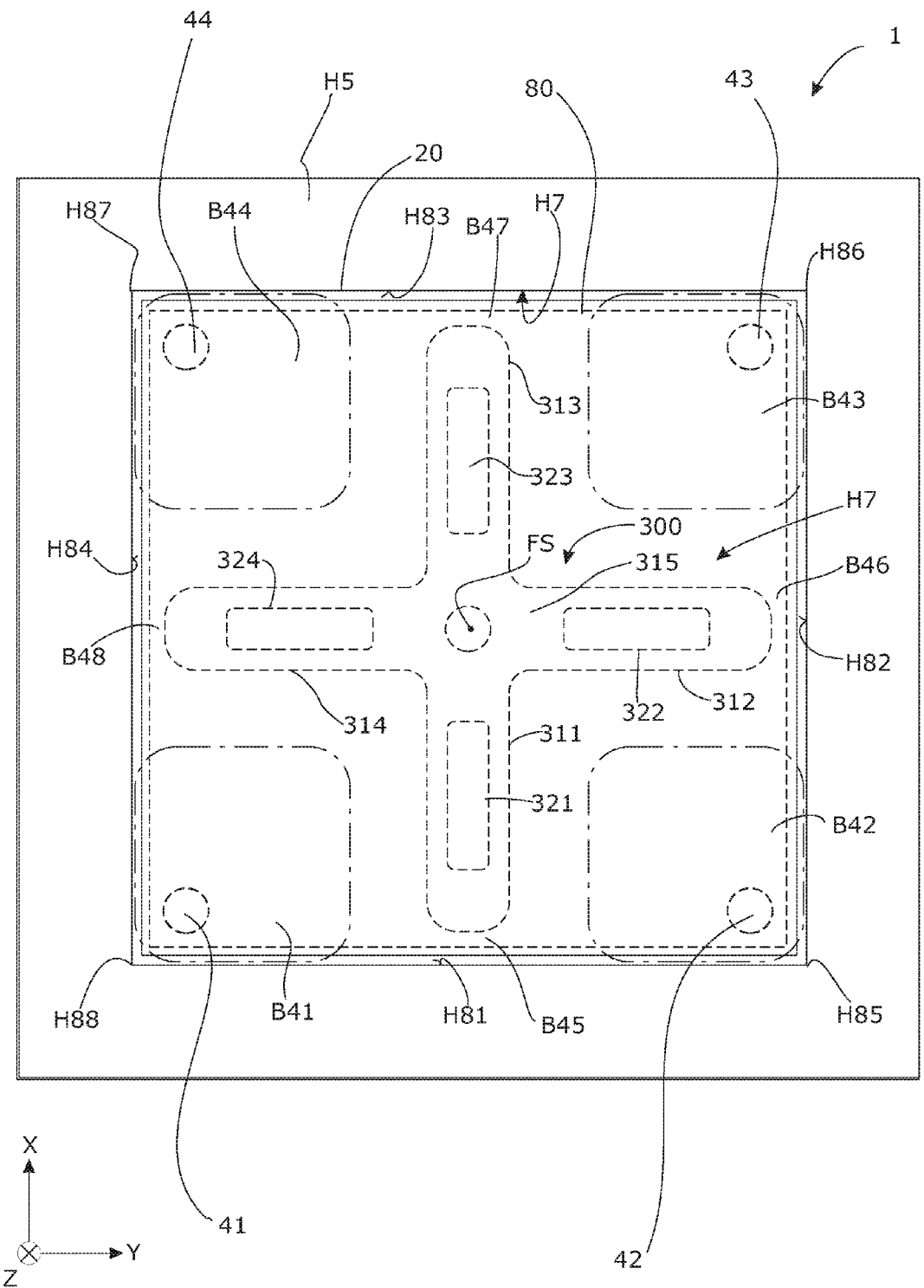

2009/0296341 A1    12/2009   Eldershaw
2015/0049059 A1     2/2015   Zadesky et al.
2015/0062050 A1     3/2015   Zadesky et al.

FOREIGN PATENT DOCUMENTS

| DE | 19535423 A1 | 3/1997 |
| DE | 102004013130 A1 | 10/2005 |
| DE | 102004017579 A1 | 11/2005 |
| DE | 102004035321 A1 | 2/2006 |
| DE | 102006024994 B3 | 8/2007 |
| DE | 1022008035894 A1 | 3/2009 |
| DE | 102013009563 A1 | 1/2014 |
| DE | 102013019354 A1 | 5/2015 |
| EP | 0033910 A1 | 8/1981 |
| EP | 0422589 A1 | 4/1991 |
| EP | 1237179 A1 | 9/2002 |
| EP | 1619704 A1 | 1/2006 |
| EP | 1691263 A1 | 8/2006 |
| EP | 1816664 A1 | 3/2015 |
| GB | 2360500 A | 9/2001 |
| JP | 2003-338232 A | 11/2003 |

OTHER PUBLICATIONS

R. Neveux, "Long-term construction bondings with tesa® ACXplus", a product brochure published in German by tesa SE indicating a publication date of Nov. 2011 (translated into English on Jul. 17, 2017).

\* cited by examiner

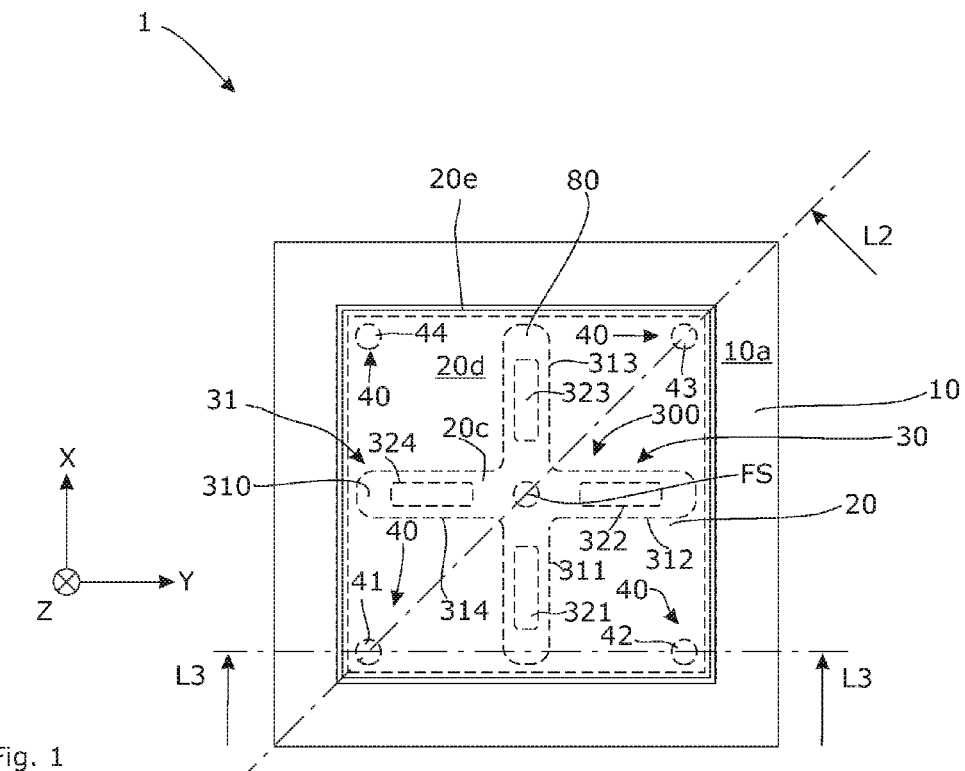
Fig. 1
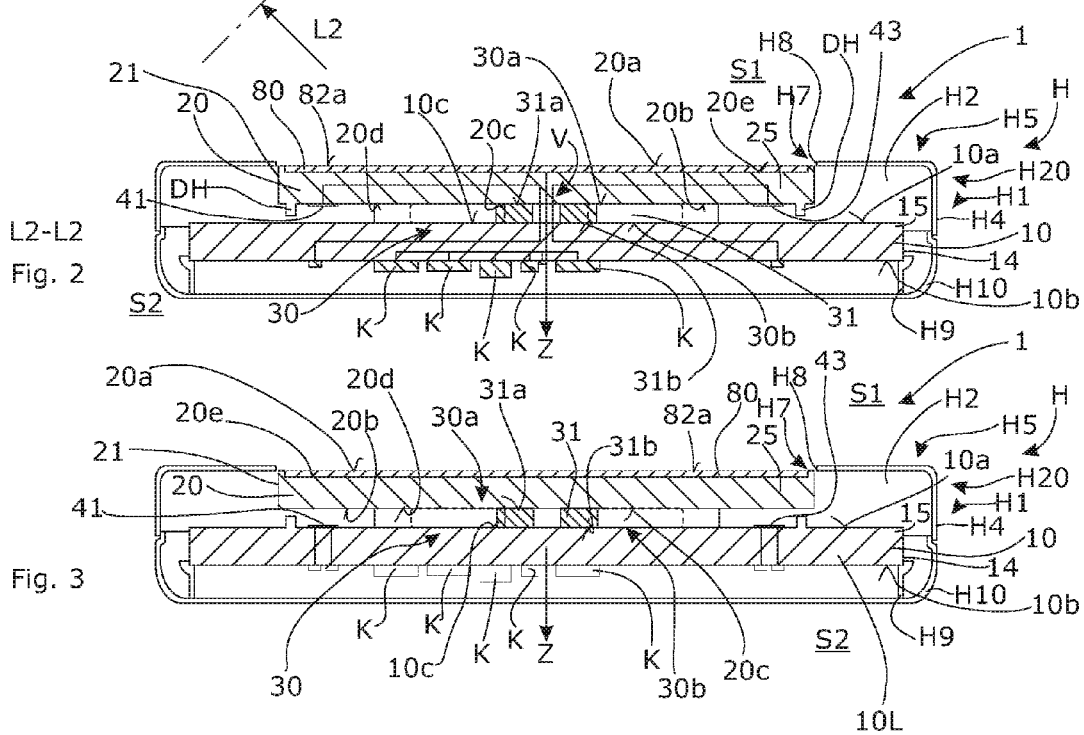
Fig. 2
Fig. 3

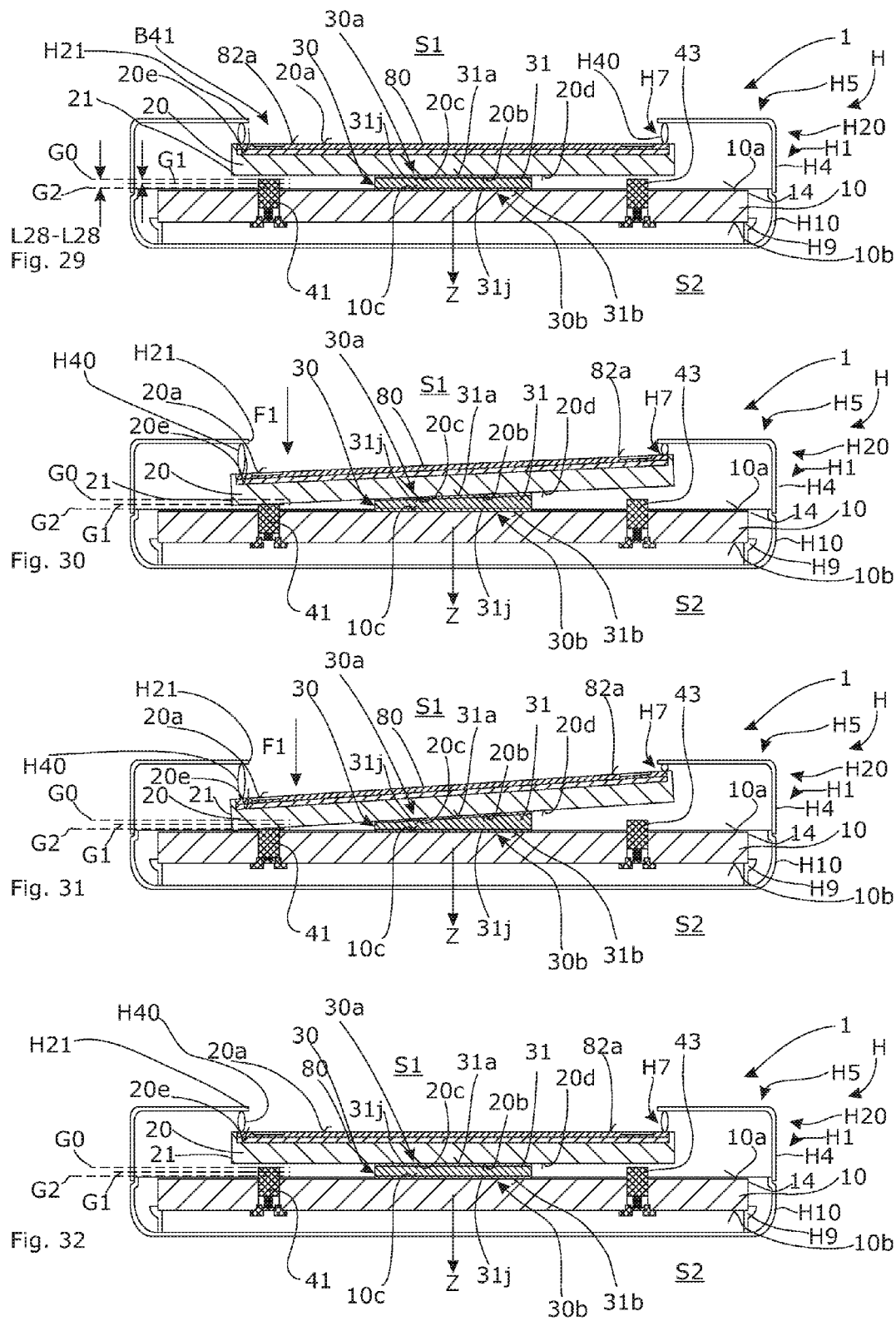

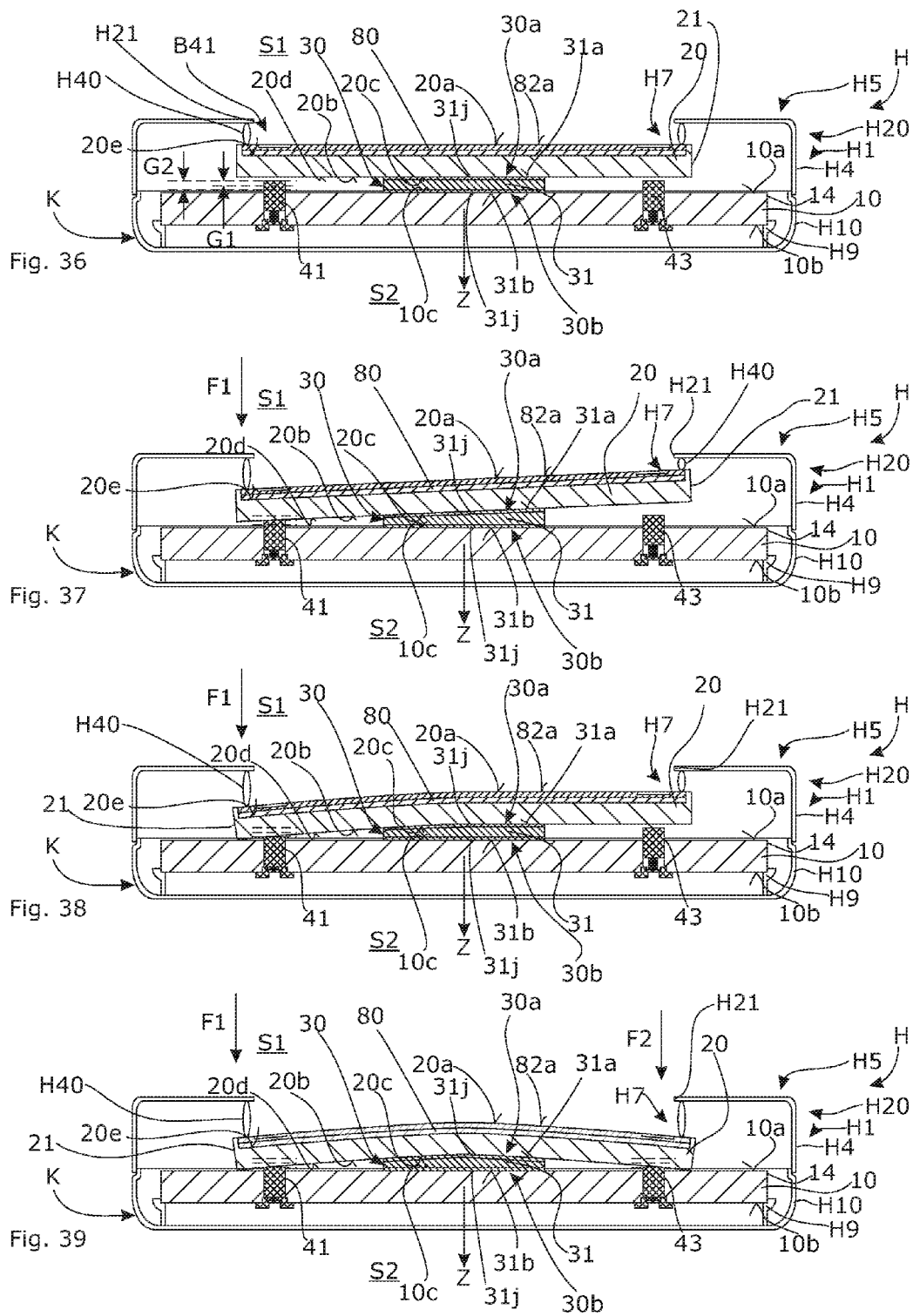

L46-L46

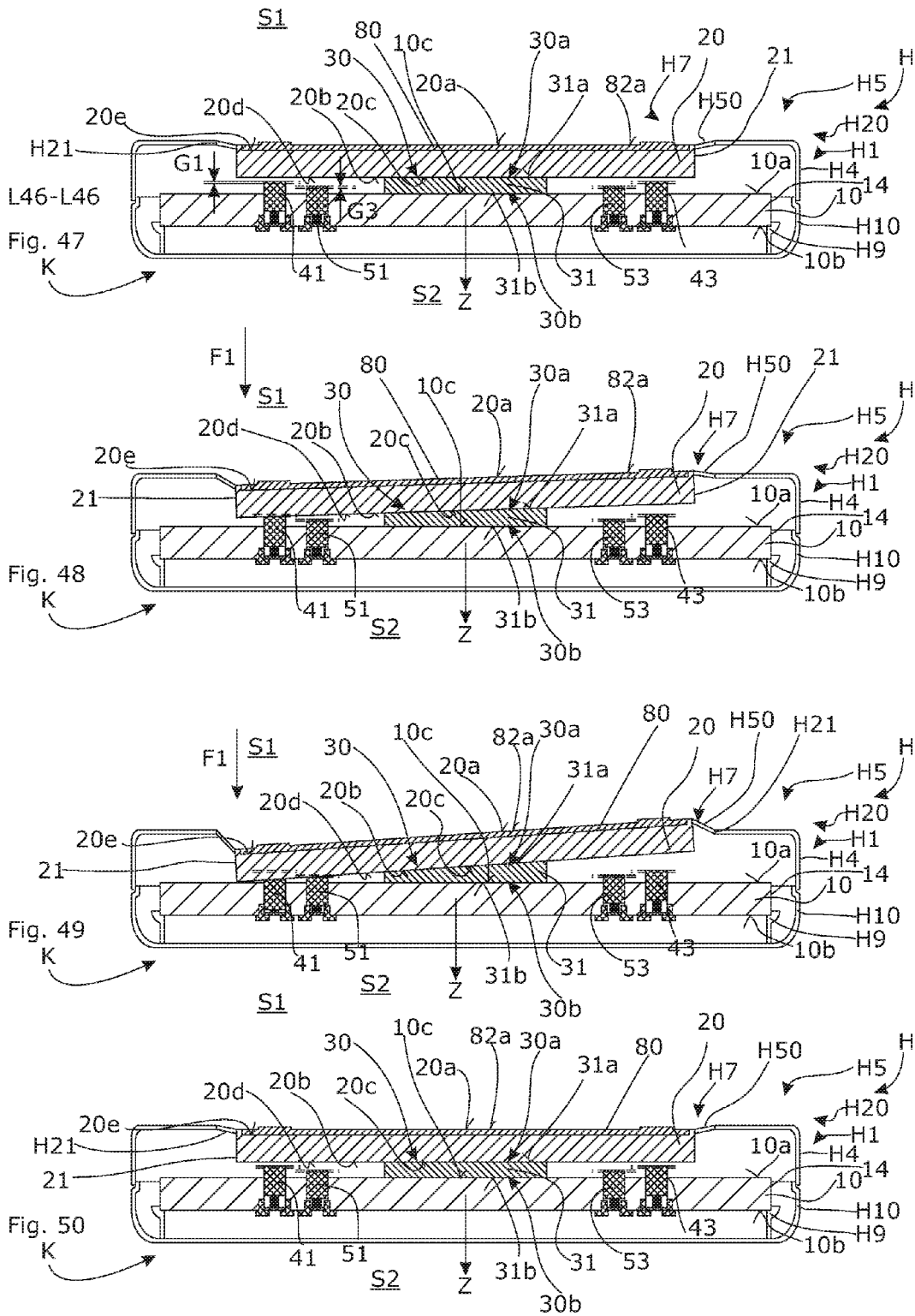

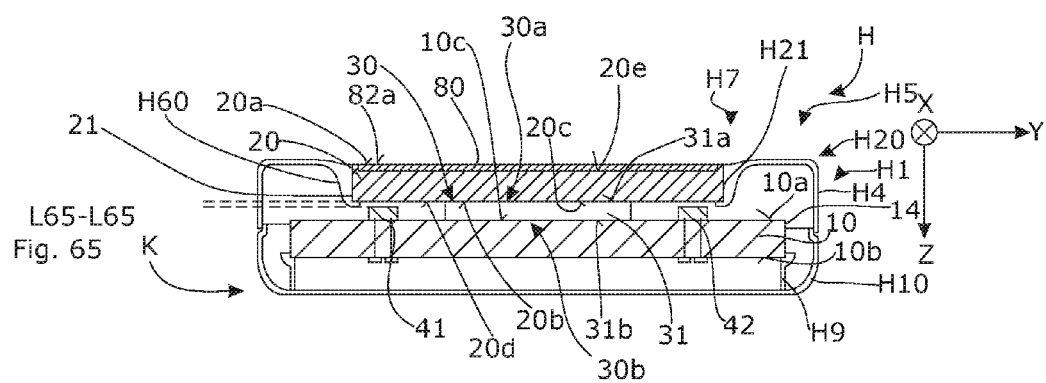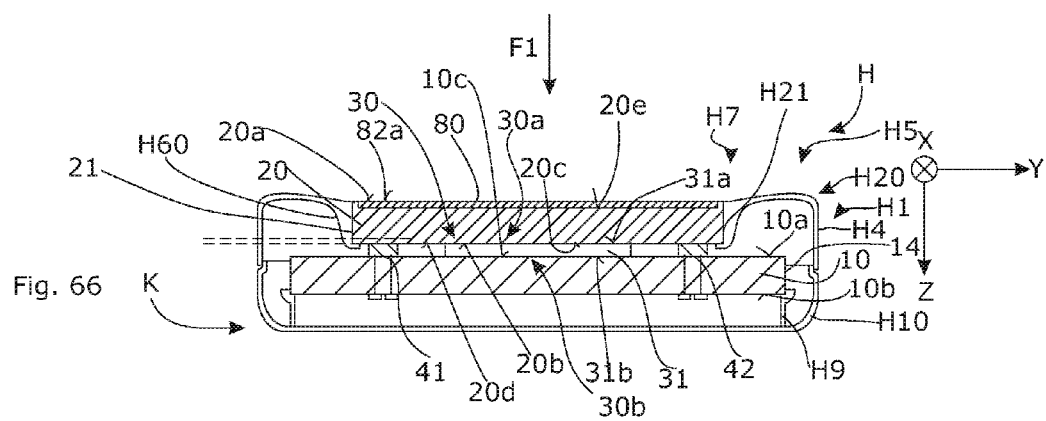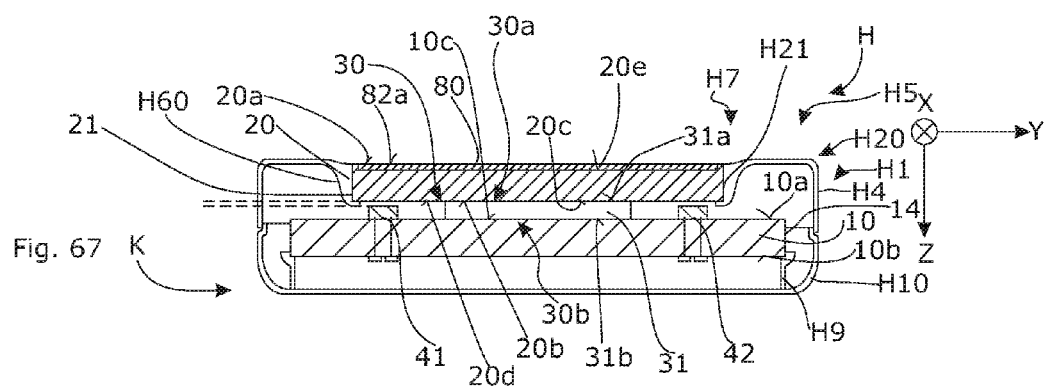

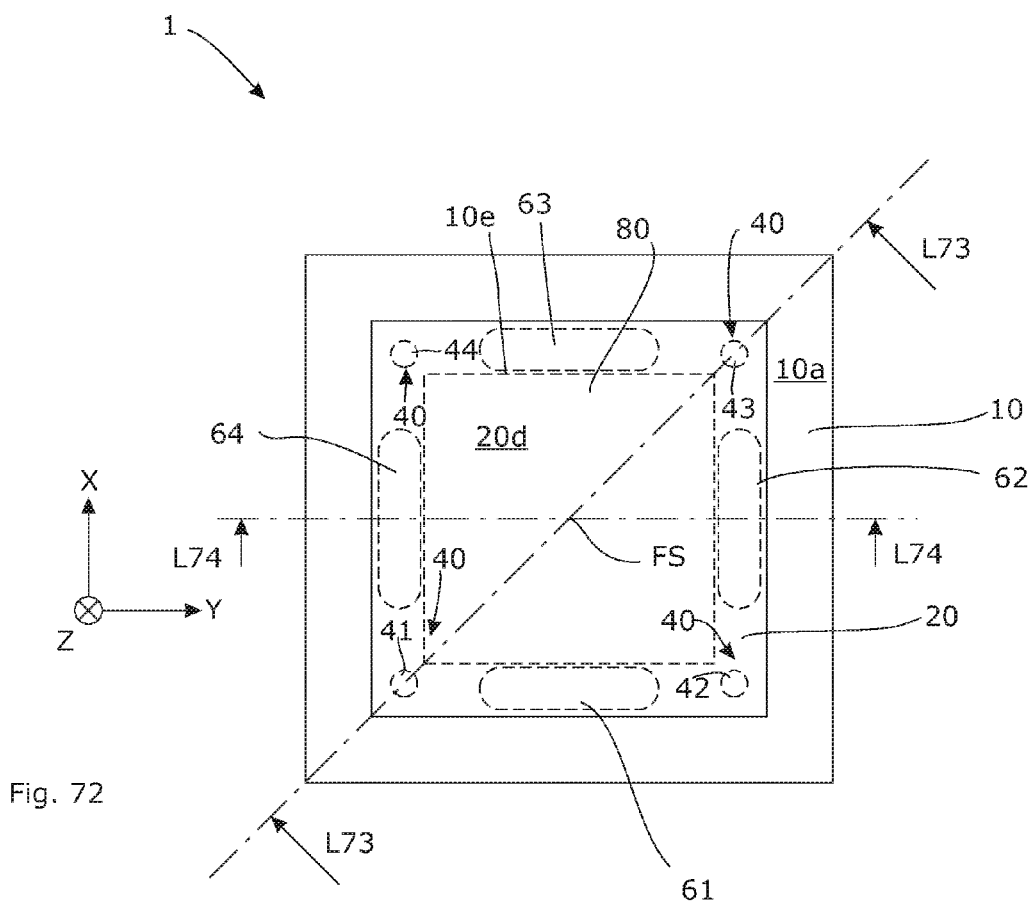
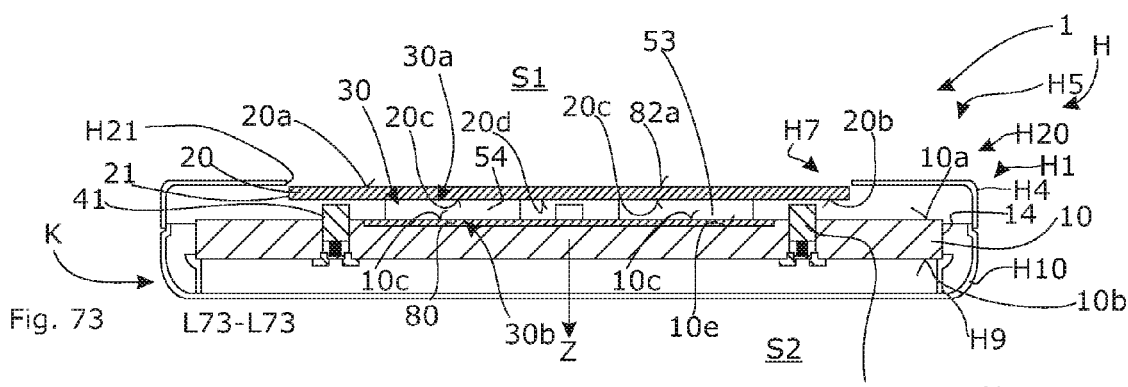
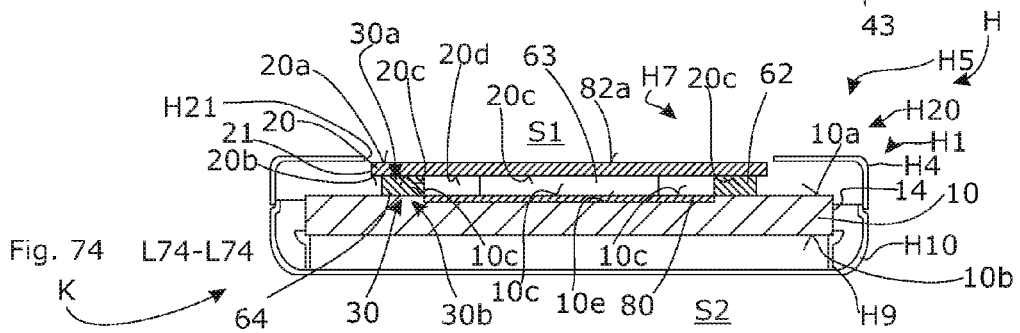

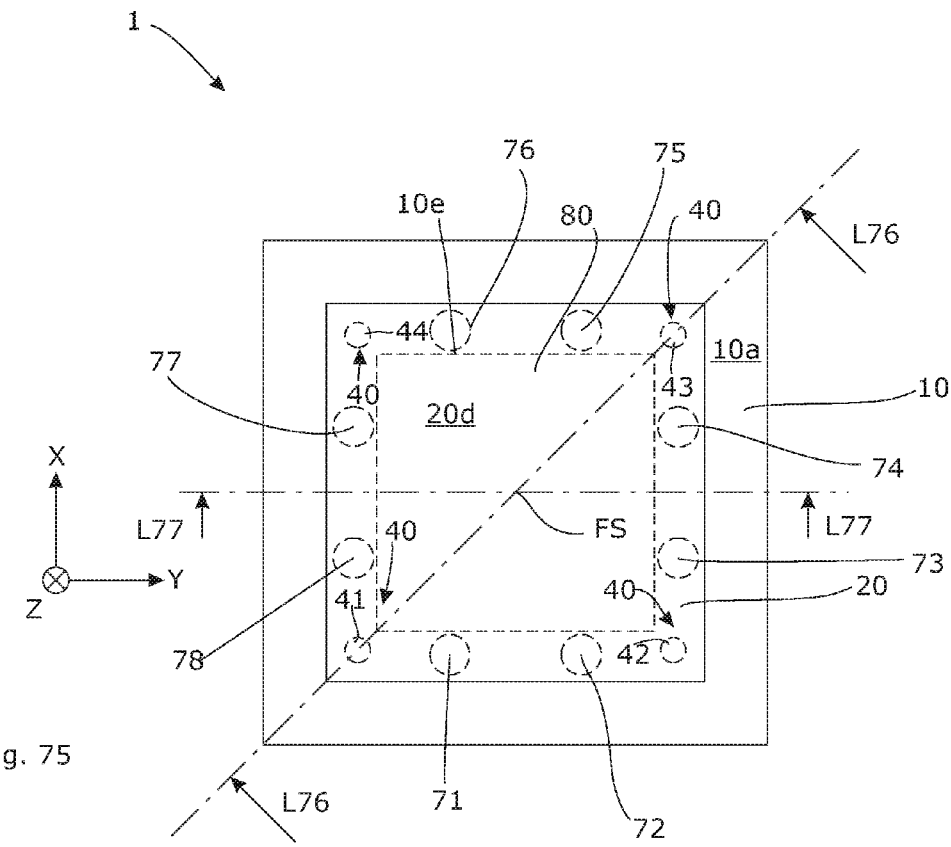
Fig. 75
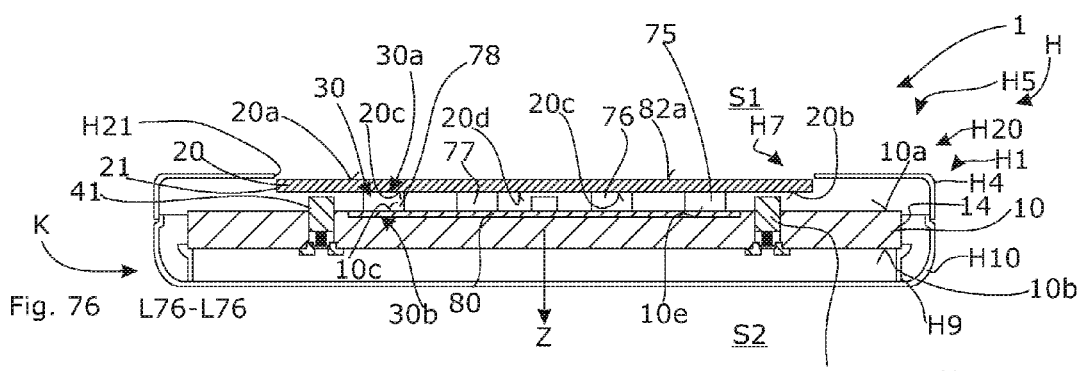
Fig. 76 L76-L76
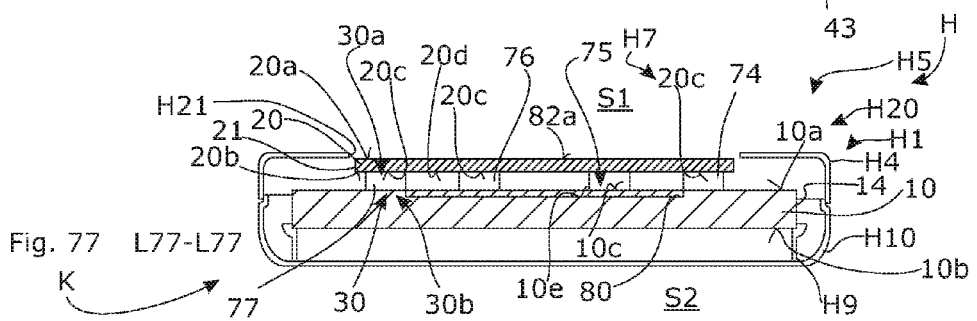
Fig. 77 L77-L77

SWITCH DEVICE AND USE OF THE SWITCH DEVICE

The invention relates to an electrical switch device, a use of the switch device, an operating system and operating methods.

DE 20 2006 001 717 U1 discloses an electrical switch with a wobble plate arranged on a dome.

The object of the present invention is to provide an electrical switch device which is as simple as possible to construct, preferably with a low construction height or a relatively flat housing part, and as simple as possible to produce, and which can be used in an efficient manner as an input device, and to provide a use of the switch device.

These objects are achieved with the features of the independent claims. Further embodiments are specified in the dependent claims which reference this claim.

According to the invention a switch device is in particular provided, which can be operated from an actuation side, the switch device having:
- a plate-shaped main body with a connection surface which is facing the actuation side of the electrical switch device,
- a plate-shaped actuation part arranged thereon, viewed in the thickness direction, with an actuation surface facing the actuation side and a connection surface located opposite to this,
- a connection device for elastically mounting the actuation part with respect to the body,
- at least one sensor, which is located between the main body and the actuation part, so that each sensor can be used to detect a position of one region, arranged on said sensor, of the second surface in the thickness direction.

The at least one sensor is in particular located in a peripheral area of the actuation part, so that this can be used in particular to detect a tilting or rocking motion of the actuation part.

By means of the connection device the actuation part can in general be moved in a translational manner in the Z direction, or tilted or pivoted relative to the main body, to actuate the actuation part at actuation areas that are located at the edge thereof in the Z direction above at least one respective sensor.

According to one embodiment of the switch device, the actuation part can have a display which is located in an inner area, viewed in the thickness direction, of the actuation interface of the actuation part. In a variant of this embodiment, the display can also be the actuation part itself.

Providing the connection device enables the actuation part to be mounted on the main body, and also a local change in the position of an area of the actuation part relative to a sensor respectively located on this area.

The connection device, which is made from elastic material, enables the connection device to have a resilience.

According to one embodiment of the switch device, the connection device consists of at least one connection layer.

According to a further aspect a switch device is provided, which can be operated from an actuation side, the switch device comprising:
- a plate-shaped main body with a connection surface which is facing the actuation side of the electrical switch device,
- a plate-shaped actuation part arranged thereon, viewed in the thickness direction, with an actuation surface facing the actuation side and a connection surface located opposite to this,
- a connection device with at least one connection layer made of an elastic material that is attached to an outer area viewed in the Z direction or from a area centroid of the actuation surface of the actuation part, or a side edge portion of the actuation part, and with a second surface viewed in the Z direction to an outer area of the connection surface of the main body,
- at least one sensor, which is located between the main body and the actuation part and in the side edge section, or viewed in the thickness direction is located at the side of the connection device, so that each sensor can be used to detect one position each of an area of the second surface, which is located on said sensor, in the thickness direction in the event of a tilting motion of the actuation part.

According to a further aspect a switch device is provided, having:
- a housing device with a plate-shaped body with a connection surface, which is facing an actuation side of the electrical switch device, and with a housing part,
- a plate-shaped actuation part arranged thereon, viewed in the thickness direction, with an actuation surface facing the actuation side and a connection surface located opposite to this,
- optionally a display integrated in the actuation part for displaying images on the actuation side, wherein the housing part comprises: a side wall, which surrounds the connection device and the actuation part viewed in the thickness direction at least in some sections, and an edge section which adjoins to the side wall (H4) towards the actuation side and forms a central opening in which the display extends, at least in some sections,
- at least one—at least one sensor, which is located between the main body and the actuation part (20) and is located on an actuation part, so that each sensor can be used to detect one position each of an area of the second surface, which is located on said sensor, in the thickness direction.

According to one alternative, the switch device can additionally comprise: a connection device with at least one connection layer made from an elastic material, which is attached to an inner area of the connecting surface of the actuation part when viewed in the Z-direction, and with a second surface is attached to an inner area of the connection surface of the base body viewed in the Z direction. In this case the at least one sensor is preferably located at the side of the connection device (30), viewed in the thickness direction. Preferably, at least two sensors are located in pairs at points positioned contrary to each other in relation to an area centroid of the actuation part.

According to a further alternative, the connection device is realized by means of an attachment device, with which the edge section is attached to an edge section of the actuation part, wherein the edge section of the housing device is elastic, so that the actuation part can pivot relative to the main body.

According to a further embodiment, the connection device comprises at least one connection layer which is formed from an elastic material and which from the area centroid of the actuation surface of the actuation part is attached to an outer area of the connection surface of the actuation part, and with a second surface is attached to an outer area of the connecting surface of the base body, viewed from the area centroid.

This enables the connection device to consist of at least one connection layer.

In the embodiments of the switch device described herein, a display integrated in the actuation part can be provided for displaying images on the actuation side, wherein the housing part comprises: a side wall extending away from the main body, which viewed in the thickness direction surrounds the actuation part at least in some sections, and an edge section which adjoins to the side wall towards the actuation side and forms a central opening in which the display extends, at least in some sections.

In the embodiments of the switch device described herein, the housing part can comprise: a side wall extending away from the main body, which viewed in the thickness direction surrounds the actuation part at least in some sections, and an edge section which adjoins to the side wall towards the actuation side, which is connected to the actuation part along its circumference at least in some sections and which forms a central opening in which the display extends, at least in some sections. A connection device described herein and in particular, a connection layer described herein, can also be integrated in the switch device.

According to one embodiment of the switch device it is provided,
that the actuation part has a display, which is located in an inner area of the actuation surface of the actuation part, viewed in the thickness direction.
that the internal display area is designed as a recess formed on the actuation surface and the display, viewed in the thickness direction, is located at least partially in the recess.

According to one embodiment of the switch device it is provided that the actuation part is optically transparent, at least in portions of its area, and wherein the main body has an internal display area viewed in the thickness direction, in which the display is arranged, the position of the internal display area being defined according to one of the following alternatives:
the display area viewed in the thickness direction is situated within an area defined by the sensors or between sensors and outside of the at least one connection layer viewed in the thickness direction,
the display area viewed in the thickness direction is situated within an area defined by the sensors or between sensors and viewed in the thickness direction, at least partially inside at least one of the at least one connection layers, wherein the at least one connection layer, which is located within the display area, is optically transparent.

According to one embodiment of the switch device, it is provided that the internal display area is designed as a recess formed on the connection surface and the display, viewed in the thickness direction, is located at least partially in the recess.

According to one embodiment of the switch device, the plate-shaped actuation part is designed as a rigid part.

According to one embodiment of the switch device, the plate-shaped actuation part is designed as a flexible elastic part.

According to one embodiment of the switch device, the switch device comprises two sensors, two of which are in each case arranged opposite each other in relation to the area centroid of the actuation interface.

According to one embodiment of the switch device, the at least one sensor is designed in such a way that each of these detects, in a contactless manner, the distance from the same to the point of the connection surface of the actuation part opposite thereto.

According to one embodiment of the switch device, the at least one sensor is designed as an optical sensor.

According to one embodiment of the switch device, the at least one sensor is designed as an inductive sensor.

According to one embodiment of the switch device, the at least one sensor is designed in the form of a mechanical sensor with a switch component.

According to one variant of this embodiment of the switch device, it is provided that the at least one sensor is designed as a mechanical sensor with a switch component, wherein the switch component has more than one mechanically actuatable switching position (for example, a plurality of locking positions in the actuation direction, a plurality of pressure points, the facility for keying and oversampling, etc.).

According to one embodiment of the switch device, the switch device comprises a link (e.g. via WLAN) to a data network.

According to one embodiment of the switch device it is provided that, after evaluation of the inputs made via the sensors, input-related data content (e.g. in the form of apps) can be downloaded over the data network link from a central database and can be displayed on the display.

According to a further aspect, an embodiment of the switch device can be used as a device for inputting logistical data in a storage area.

According to a further aspect, an embodiment of the switch device can be used as a device for inputting logistical data and outputting logistical data, in each case in a storage area.

A further aspect relates to the use of one embodiment of the switch device with a display as an interactive human-machine interface in the field of logistics and other industrial applications, particularly in warehouse management and other material flow systems,
wherein on the display a number of task-related alternatives can be displayed,
wherein via a user's input, which acts on sensors, a selection is made from the displayed alternatives, whereupon the next action, or the next selection to be made, is displayed from the central database via the WLAN link.

According to a further aspect, the use of an embodiment of the switch device with a display is provided, for the menu-guided selection of a task in the area of warehouse logistics and other industrial applications,
wherein apps are held available in the central database for a multiplicity of tasks, which present on the display via the network link reproducible sequences of actions, alternatives to the task-related selection and/or to necessary inputs of information,
wherein the user selects the app appropriate to the task pending and then processes this interactively using the input facilities via the sensors 41 to 44 and in observance of the representations on the display.

According to a further aspect, the switch device can be used with input means and a display for the menu-guided selection of a task in an operating system, and in particular in a warehouse system or a production plant or other industrial applications, wherein application functions are held available in a central database for a multiplicity of tasks, which present on the display via a network link sequences of actions, alternatives to the task-related selection and/or to necessary inputs of information that can be reproduced, wherein the user selects the application function appropriate to the pending task and processes this interactively using the input facilities via the sensors and in observance of the representations on the display.

According to a further aspect, an operating system is provided having at least one embodiment of the switch device, a central system and a plurality of work-area participants, wherein the switch device comprises an output interface, via which, due to the provision of at least one control field, task execution commands can be generated and optionally submitted by means of a menu control module
- to the central system,
- to all of the plurality of work-area participants,
- to individual participants from the plurality of work-area participants.

According to one aspect an operating method is provided, with a mobile switch device which is designed as a handheld device and comprises input means and a display for the menu-driven selection and execution of a task in an industrial operating system:
- provision of a multiplicity of task-application functions (apps) in a central database,
- the display via a network link of reproducible action sequences of participant tasks and/or alternatives to the task-related selection and/or to the necessary inputs of information on the display of the switch device,
- selection by a user of application functions (apps) appropriate to the pending task,
- processing of these tasks interactively using the input means and in observance of the representations on the display.

According to one embodiment of the operating method, it is provided that
- in the selected application function (app) at least one participant task to be completed by one or more participants (T; T1, T2, T3) of the operating system can be selected on the display,
- after selection of a participant task, a selected participant task is submitted by actuation of the switch device (1) to multiple participants (T; T1, T2, T3),
- that among each of the participants (T; T1, T2, T3) a prioritization of the participant tasks received over a pre-defined work period takes place, by means of task execution commands,
- that a consistency check and a balancing of the participant tasks between the nodes (T; T1, T2, T3) is performed, in such a way as to avoid the highest priority being assigned to the same task,
- that the task with top priority is in each case processed by the respective participant (T; T1, T2, T3), so that each participant (T; T1, T2, T3) fulfils a highest priority task.

In this case it can be provided in particular that the industrial operating system is a warehouse system, and wherein at least two participants (T; T1, T2, T3) are warehouse operating devices.

According to one embodiment of the operating method, it is provided that control fields are made available via an output interface of the switch device in menu formats that are selectable by actuating the switch device, and by means of a menu control module, task execution commands are generated and optionally submitted
- to the central system (Z),
- to all of the plurality of work-area participants (T),
- to individual participants from the plurality of work-area participants (T).

According to one embodiment of the operating method it is provided that the switch device is designed according to an embodiment described herein.

The expression "along" in connection with the direction specifications given herein, which may relate to the profile of a contour line or a surface or which may relate to a direction of a mechanical component such as an axle or shaft, may mean in particular that the tangent to the respective contour line or to the respective surface in its trajectory in accordance with the direction specification, or longitudinal extension and e.g. the central axis of the mechanical component, locally deviates by a maximum angle of 45 degrees and preferably by a maximum of 30 degrees from a reference direction or reference axis, to which the respective direction specification is related.

The expression "perpendicular" in connection with the direction specifications given herein, which may relate to the profile of a contour line or a surface or which may relate to a direction of a mechanical component such as an axle or shaft, may mean in particular that the tangent to the respective contour line or to the respective surface in its trajectory in accordance with the direction specification, or longitudinal extension and e.g. the central axis of the mechanical component, locally deviates by a minimum angle of 45 degrees and preferably by a minimum of 30 degrees from a reference direction or reference axis, to which the respective direction specification is related.

The expression "viewed in the thickness direction Z" used herein for the purpose of designating a relative position of features or components being addressed, means a viewing direction, by reference to which a position of the features or components addressed is specified.

According to one aspect of the invention, a use of the switch device is provided as a device for inputting logistical data throughout the entire field of logistics and industrial applications, for instance in a storage area or in production.

According to a further aspect of the invention, a use of the switch device in the design with a display is provided as a device for inputting logistics data and outputting logistical data throughout the entire field of logistics and industrial applications, for instance either in a storage area or in production.

According to one variant of the invention, a use of switch devices according to the prior art in a design with a display is provided as a device for inputting logistics data and outputting logistical data throughout the entire field of logistics and industrial applications, for instance either in a storage area or in production.

Figure 5:
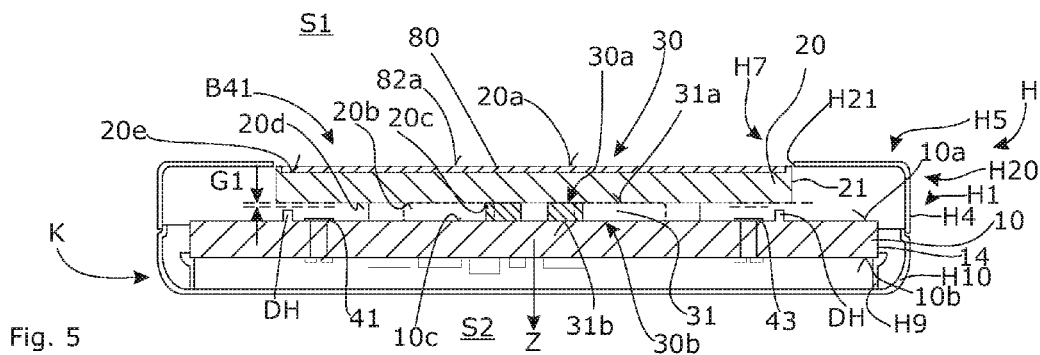
Figure 6:
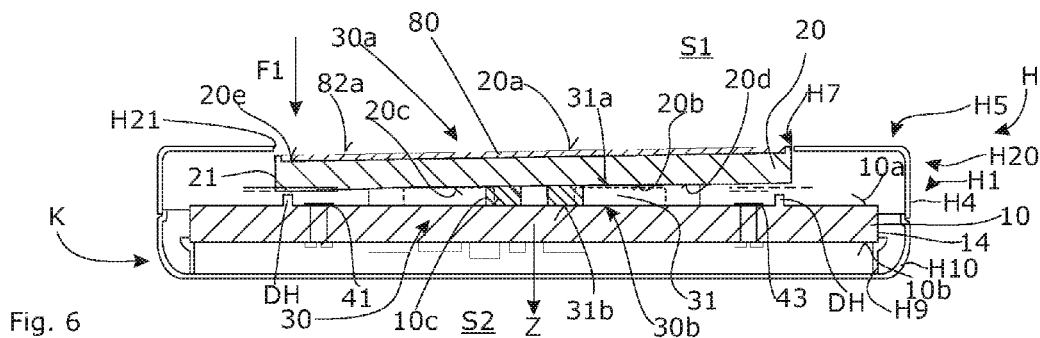
Figure 7:
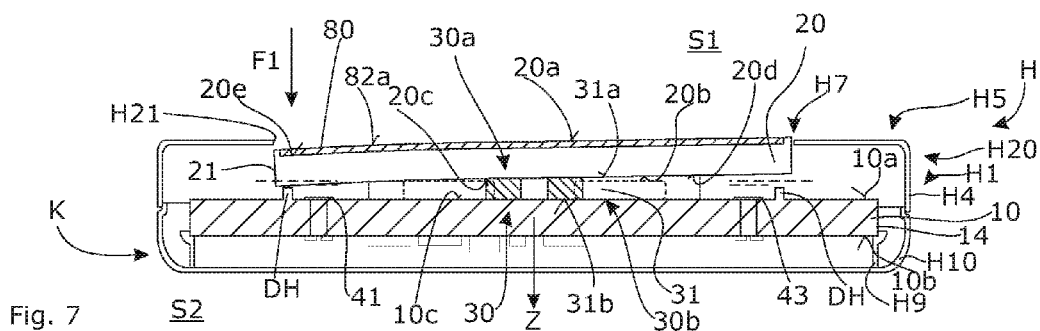
Figure 8:
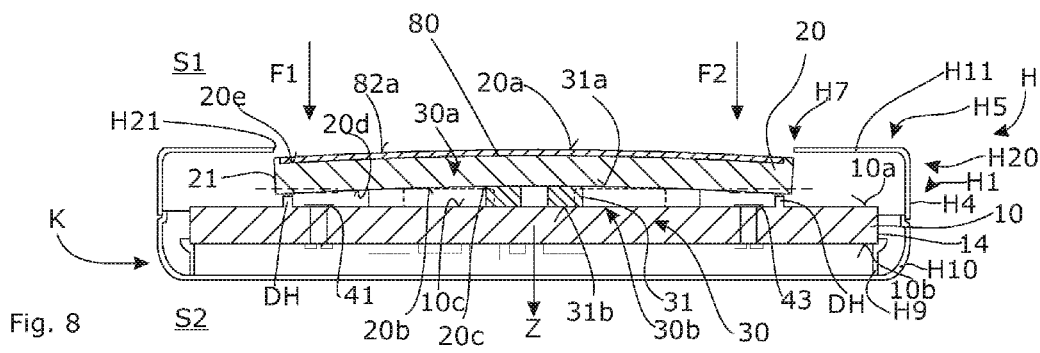
Figure 9:
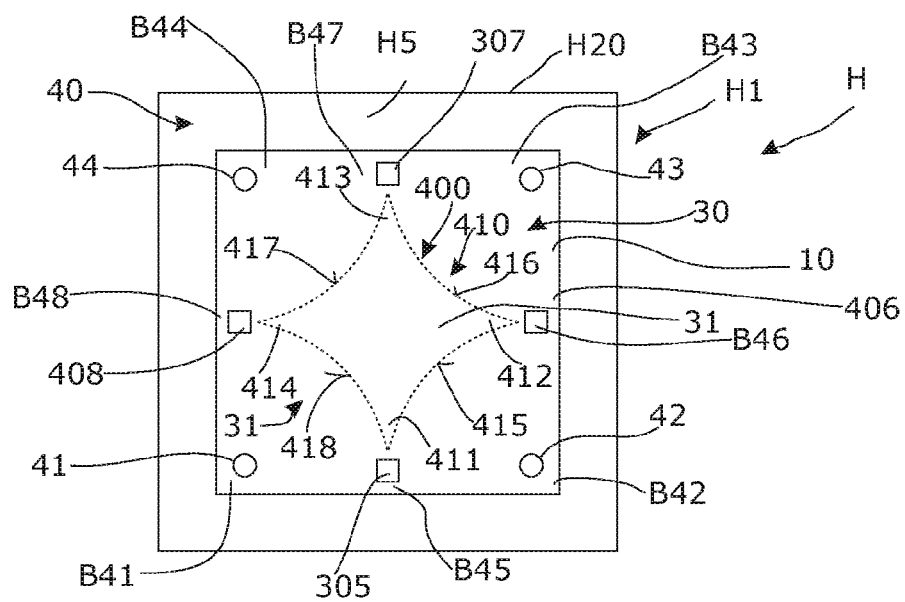
Figure 10:
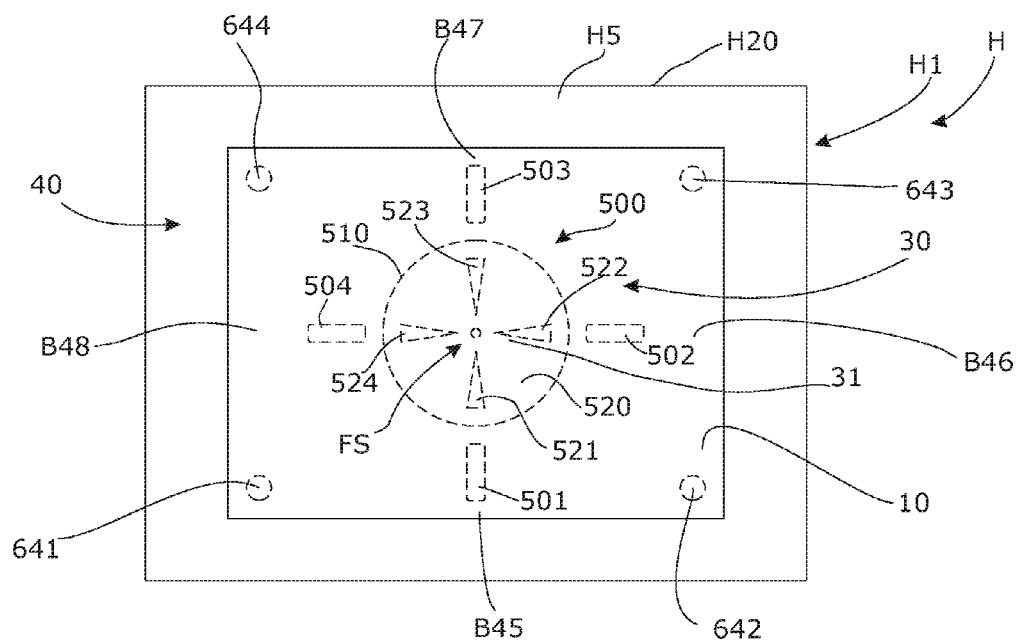
Figure 11:
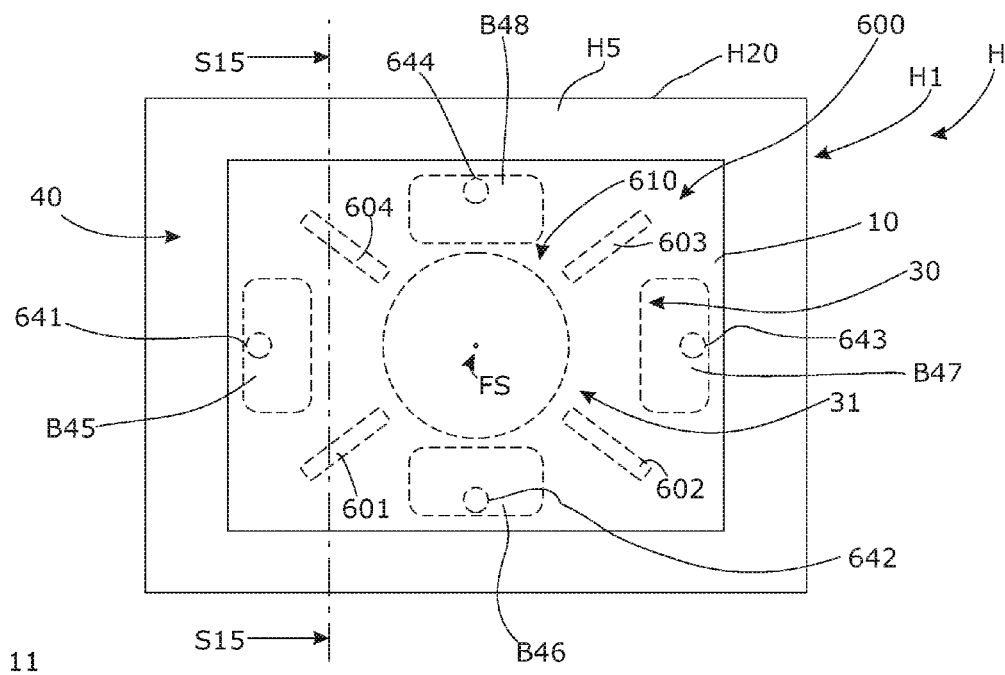
Figure 12:
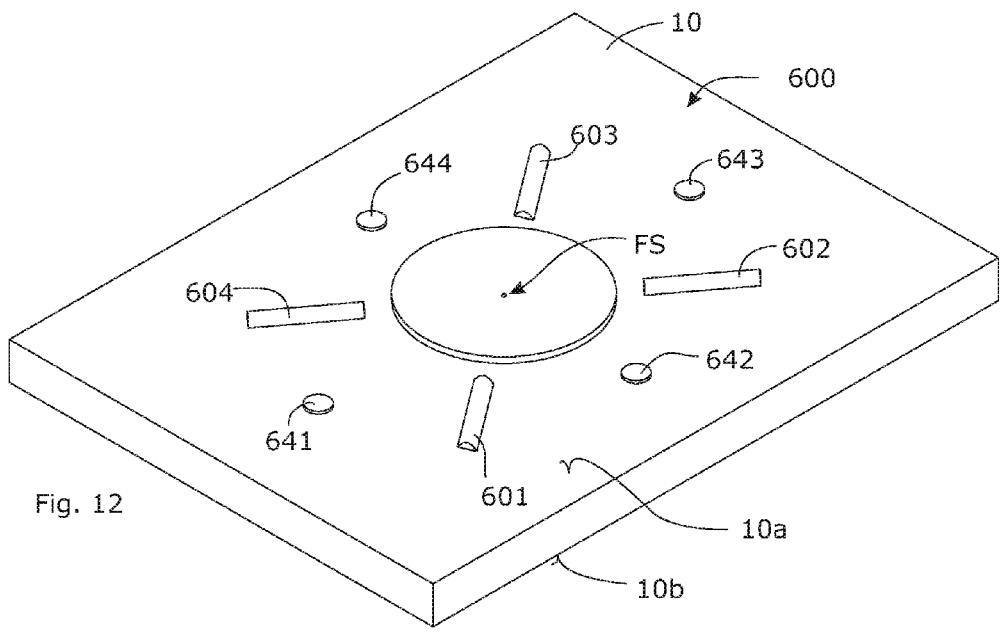
Figure 13:
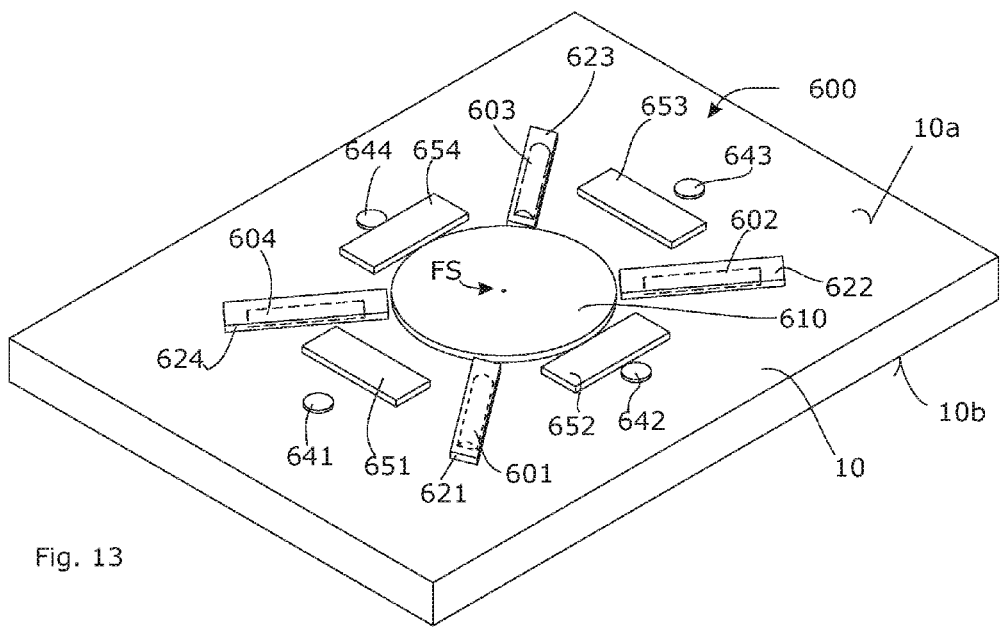
Figure 15:
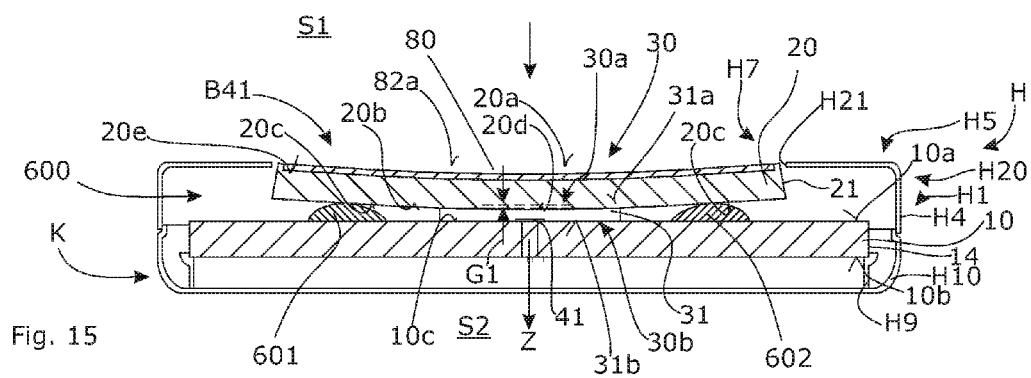
Figure 16:
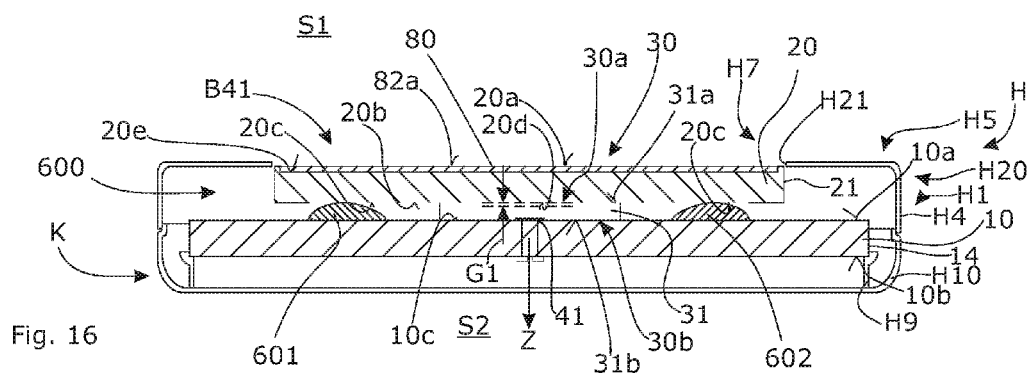
Figure 17:
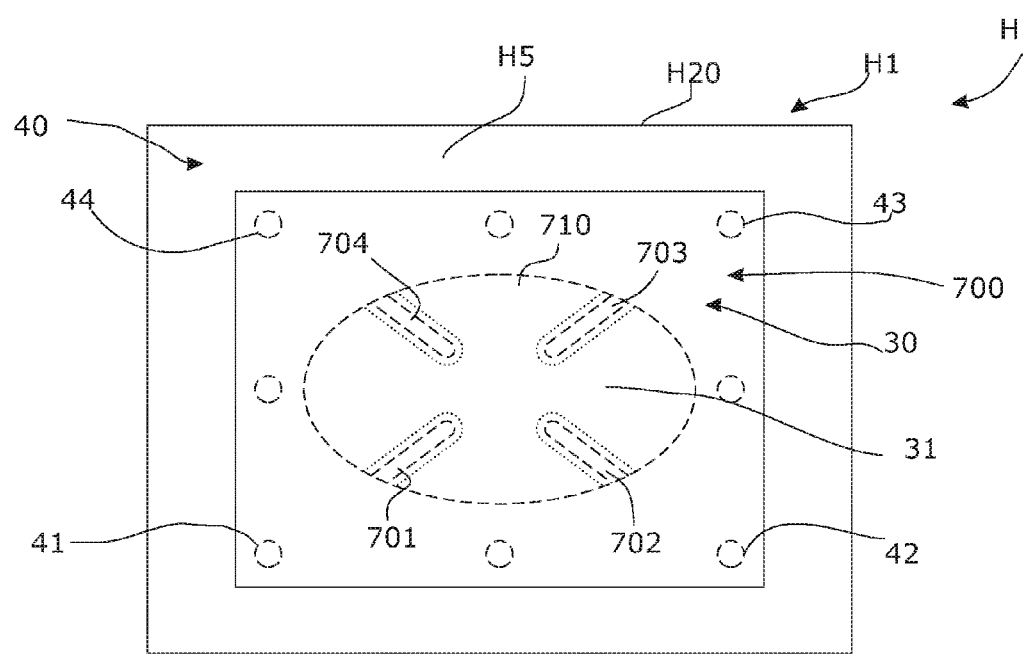
Figure 18:
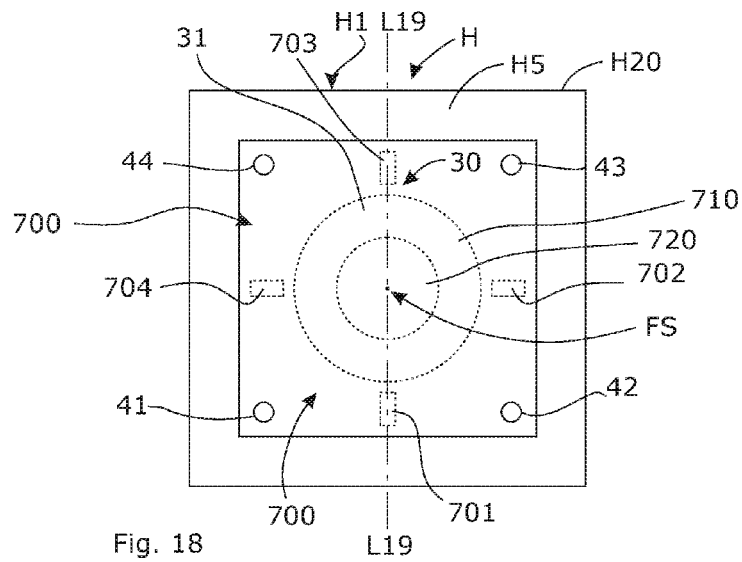
Figure 19:
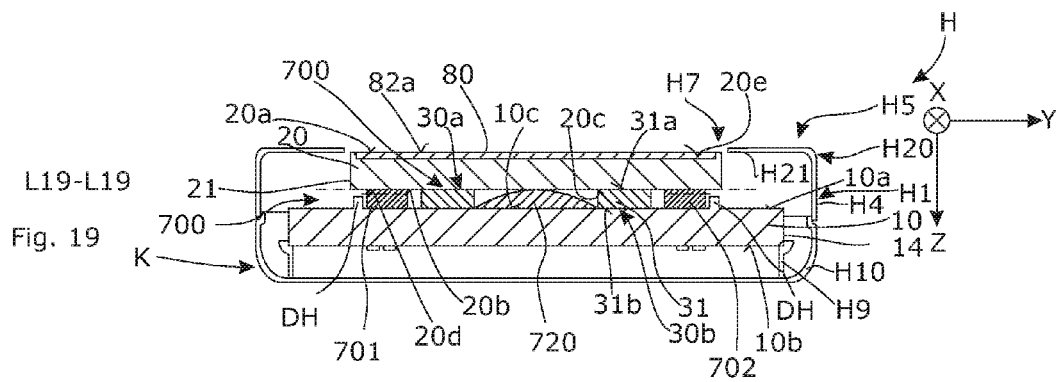
Figure 20:
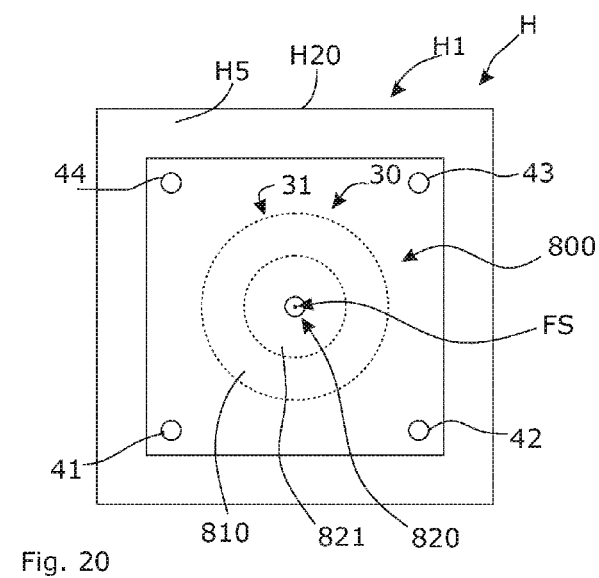
Figure 21:
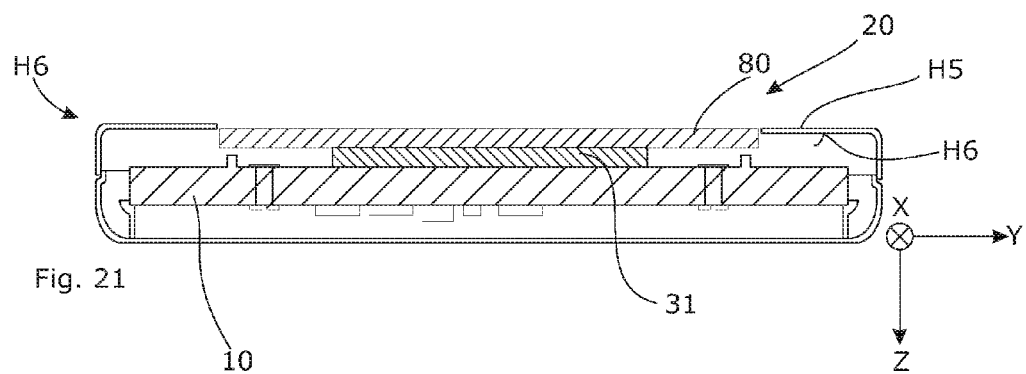
Figure 22:
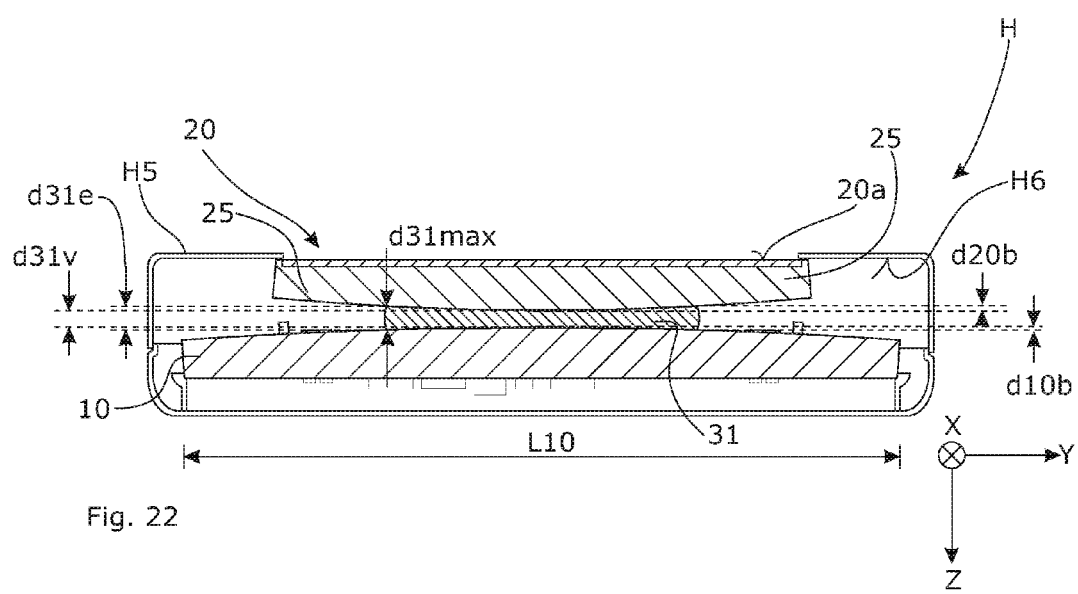
Figure 23:
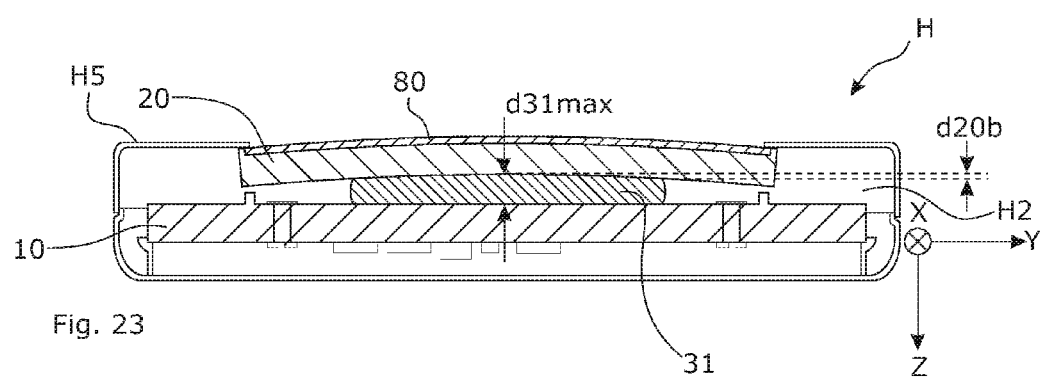
Figure 24:
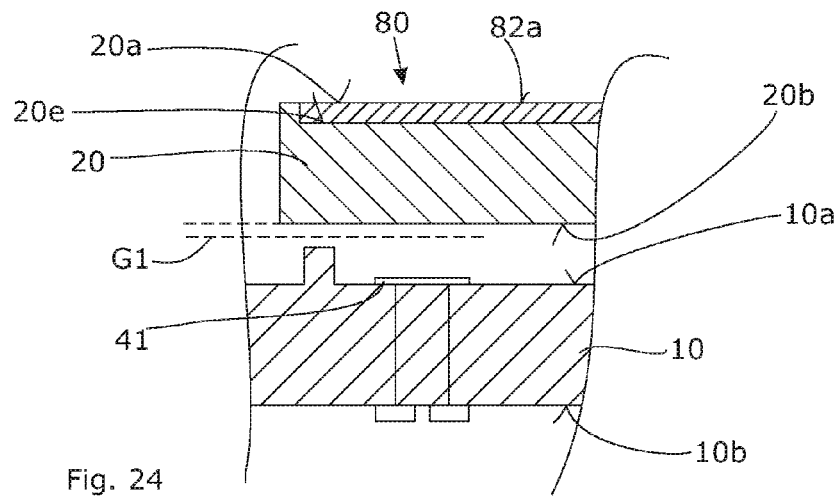
Figure 25:
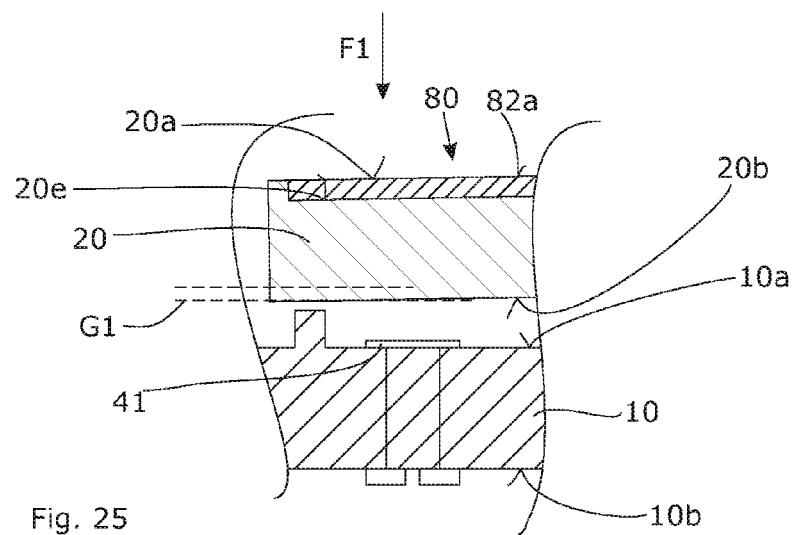
Figure 26:
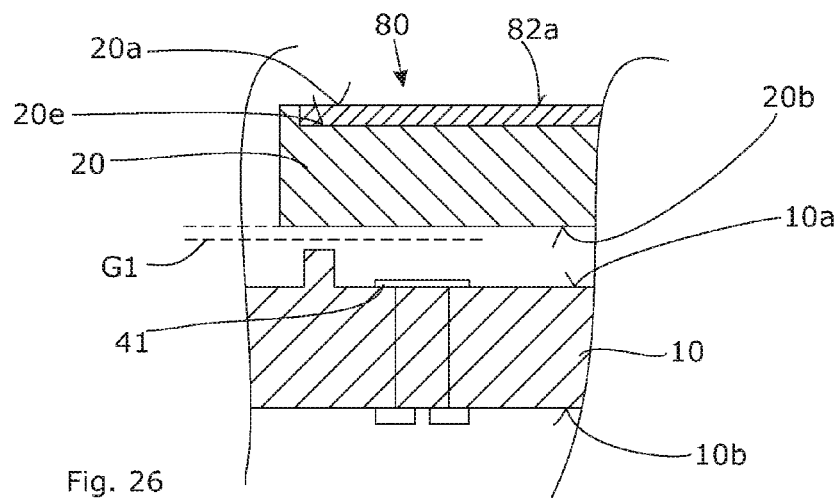
Figure 27:
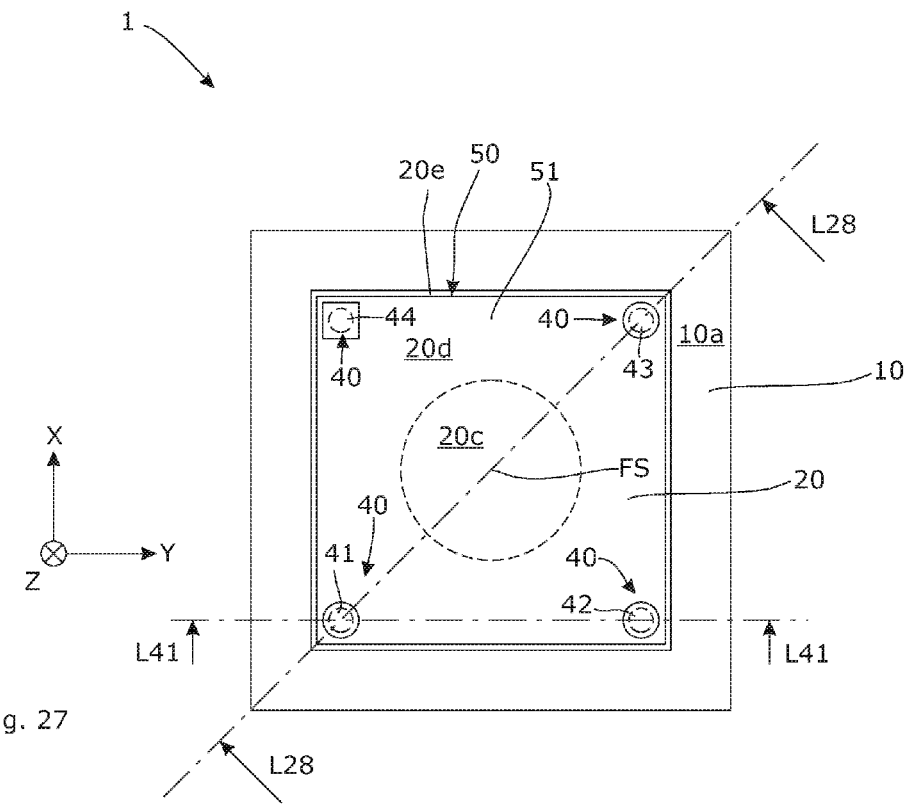
Figure 28:
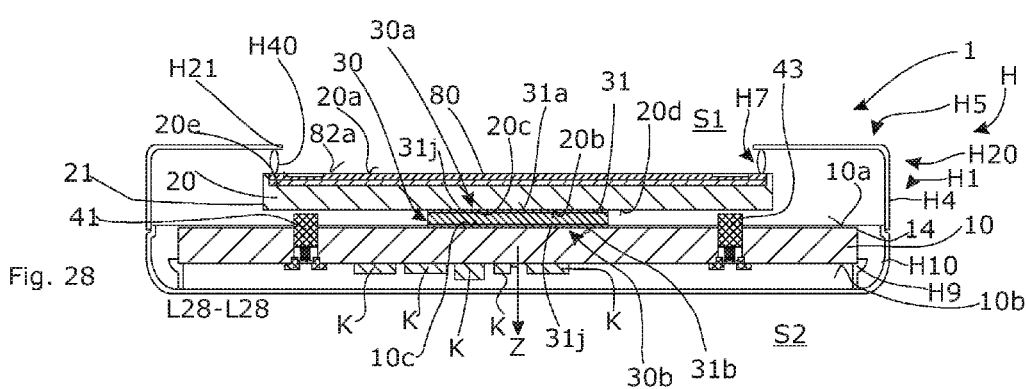
Figure 33:
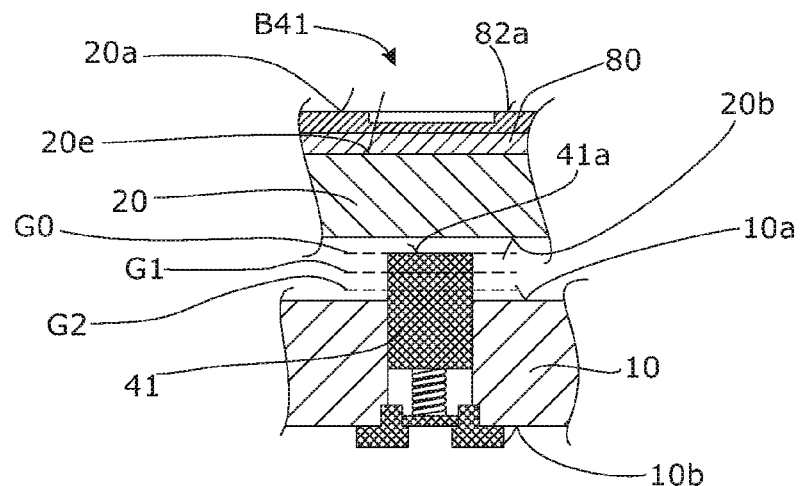
Figure 34:
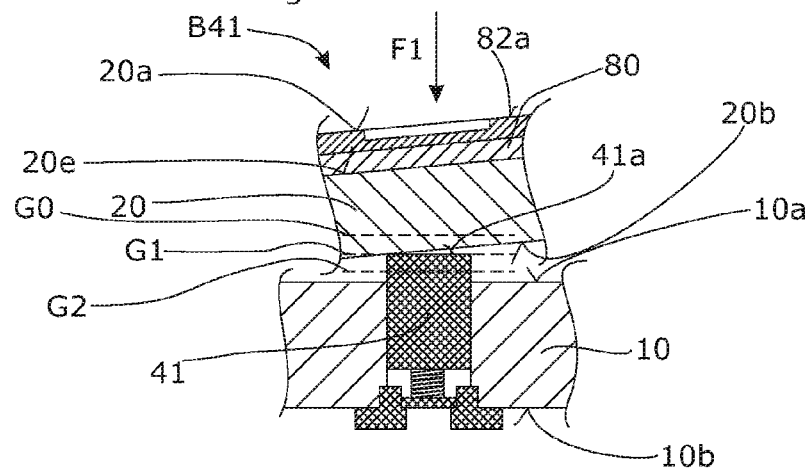
Figure 35:
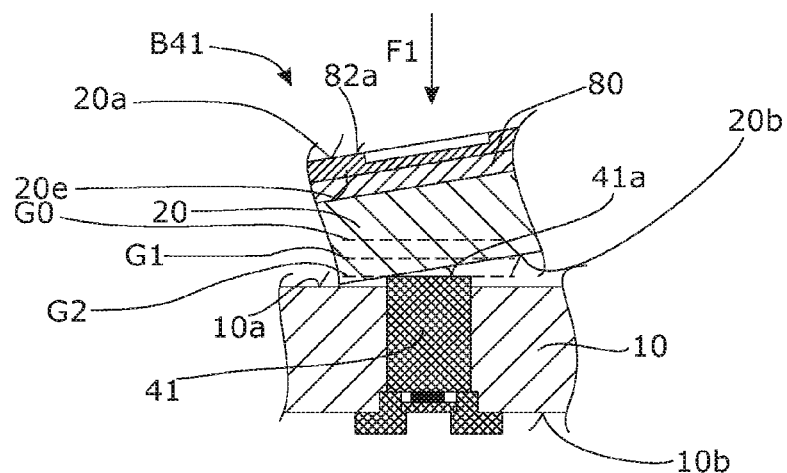
Figure 40:
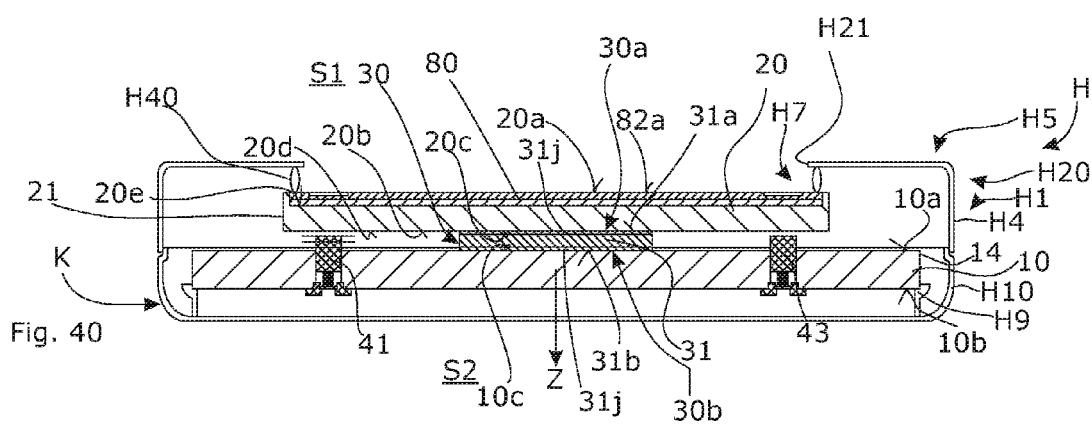
Figure 41:
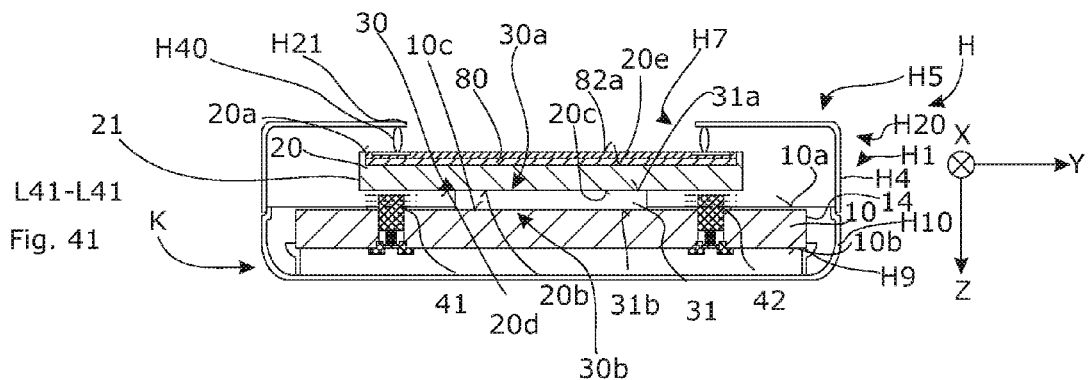
Figure 42:
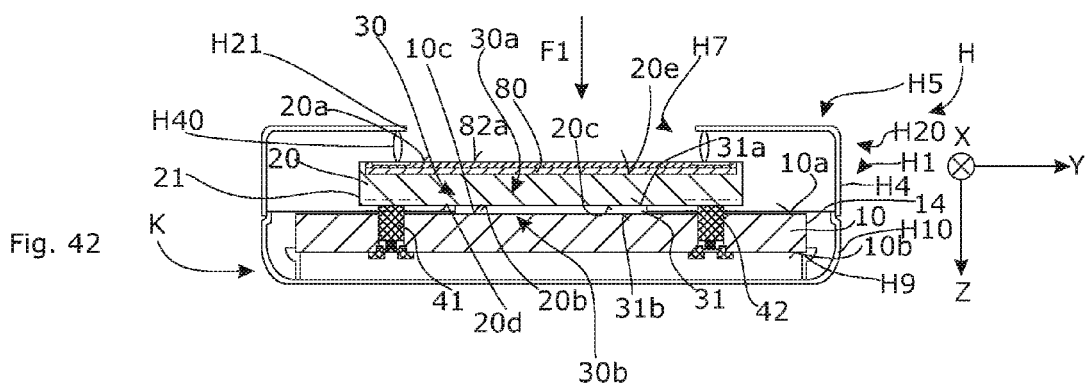
Figure 43:
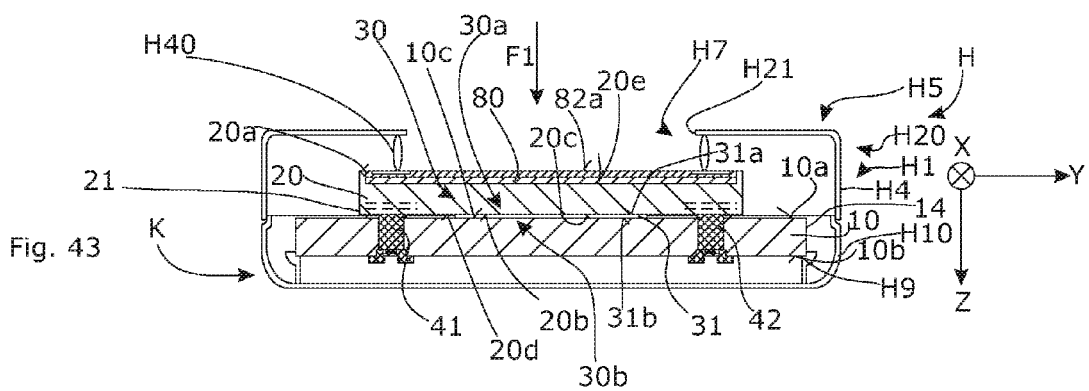
Figure 44:
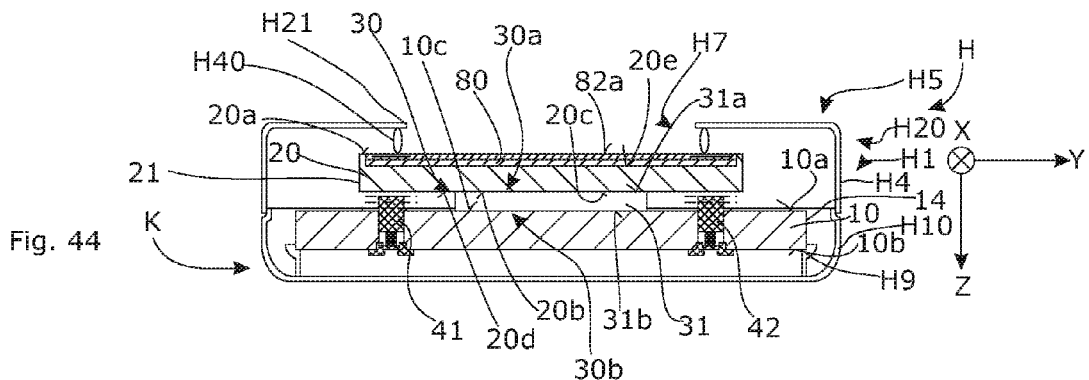
Figure 45:
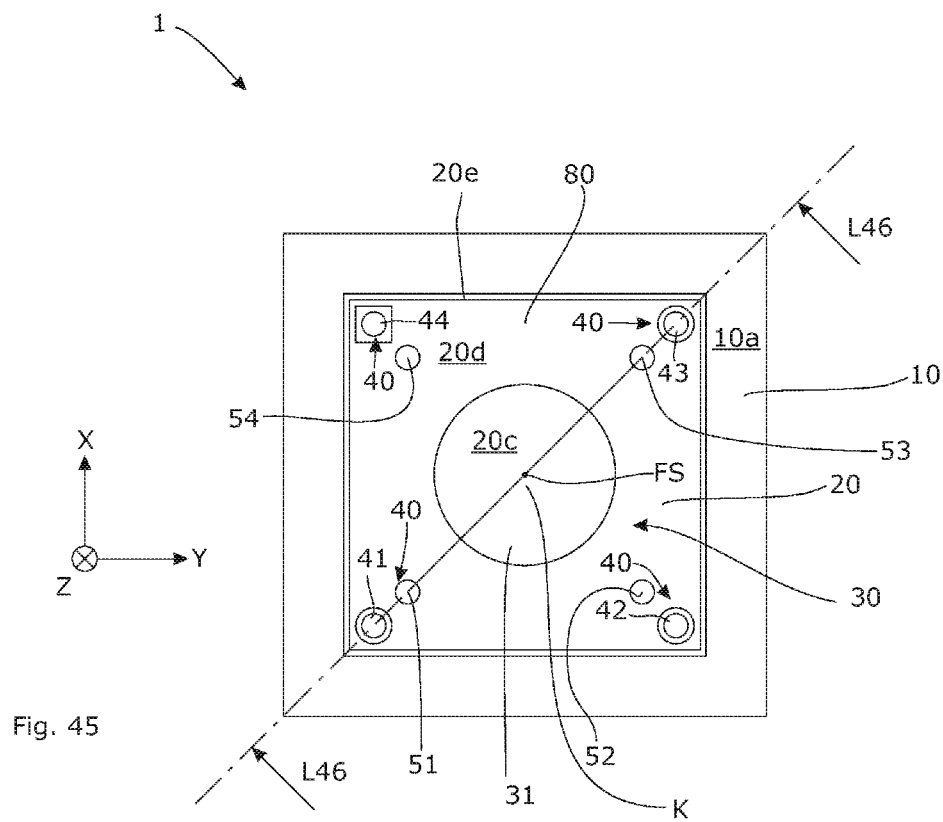
Figure 46:
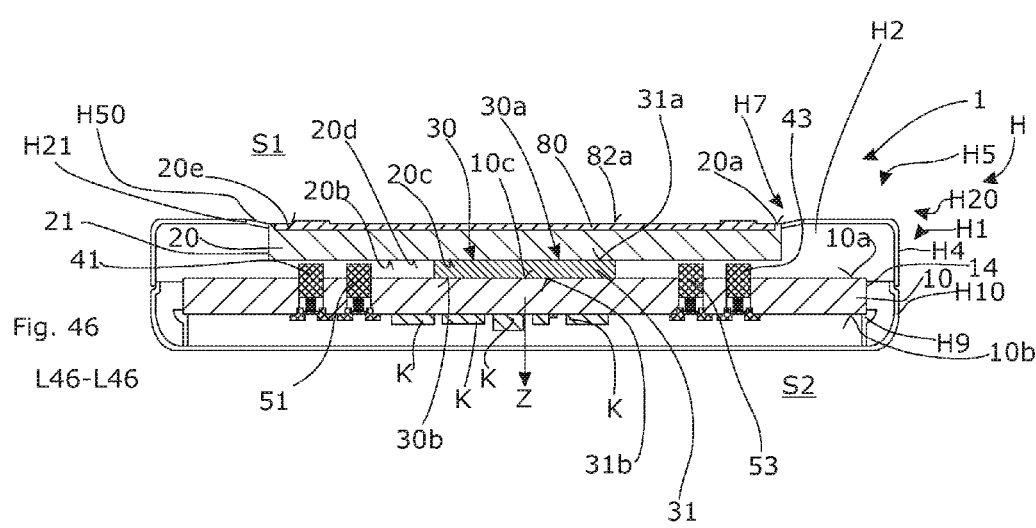
Figure 51:
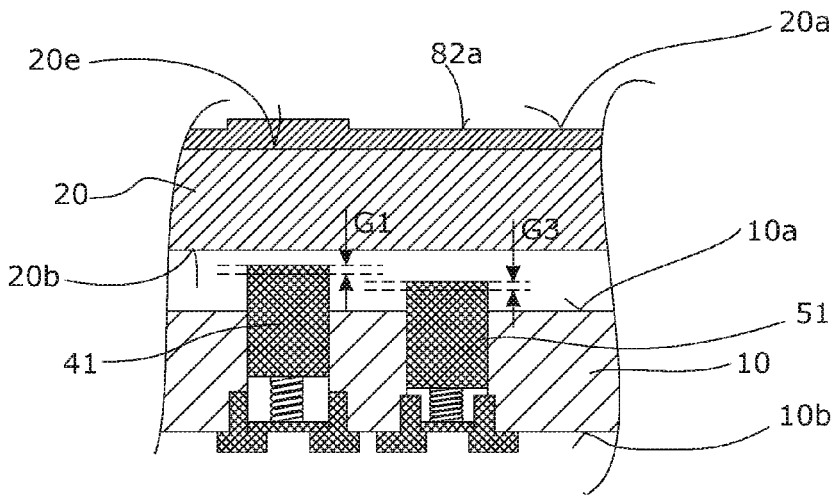
Figure 52:
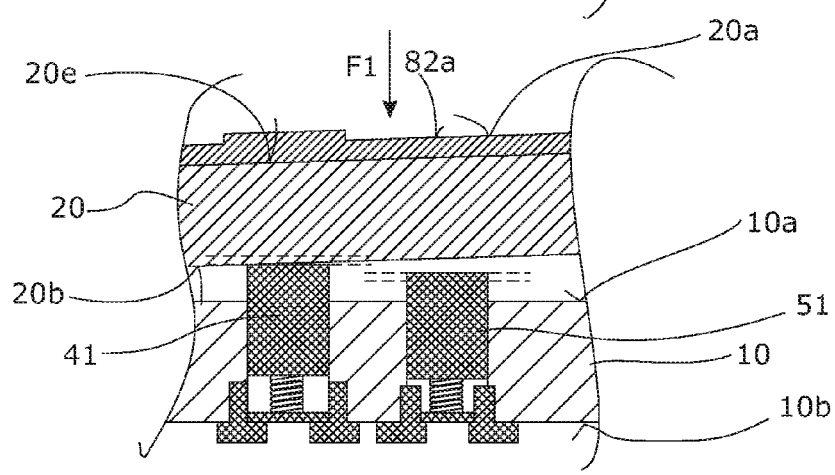
Figure 53:
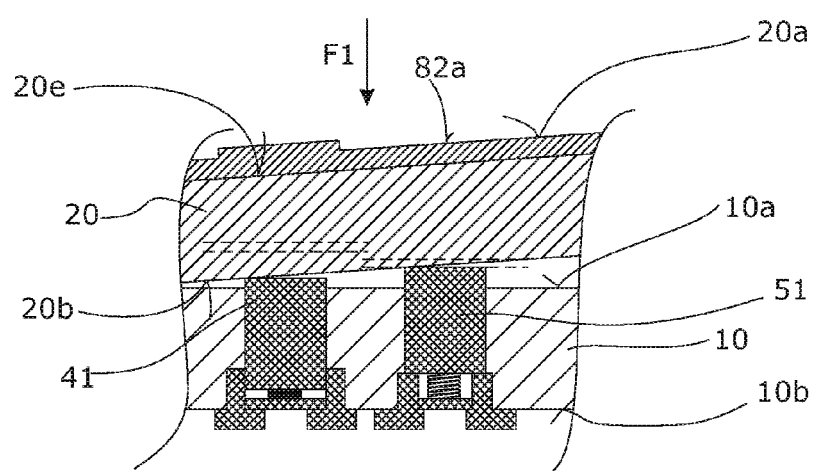
Figure 54:
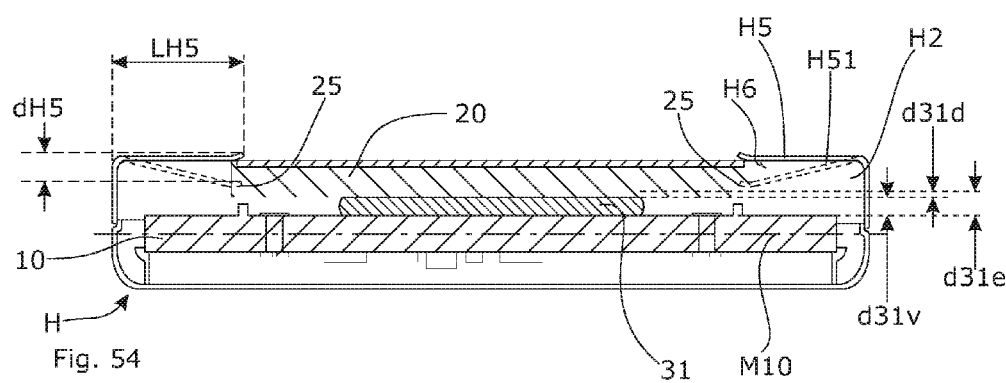
Figure 55:
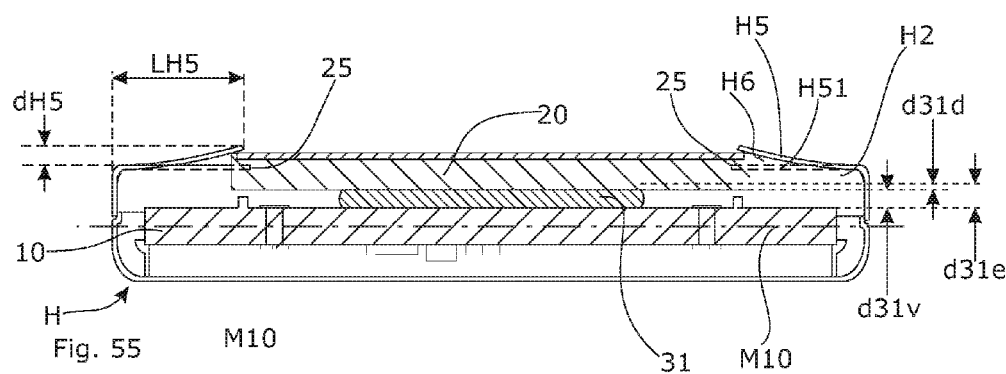
Figure 56:
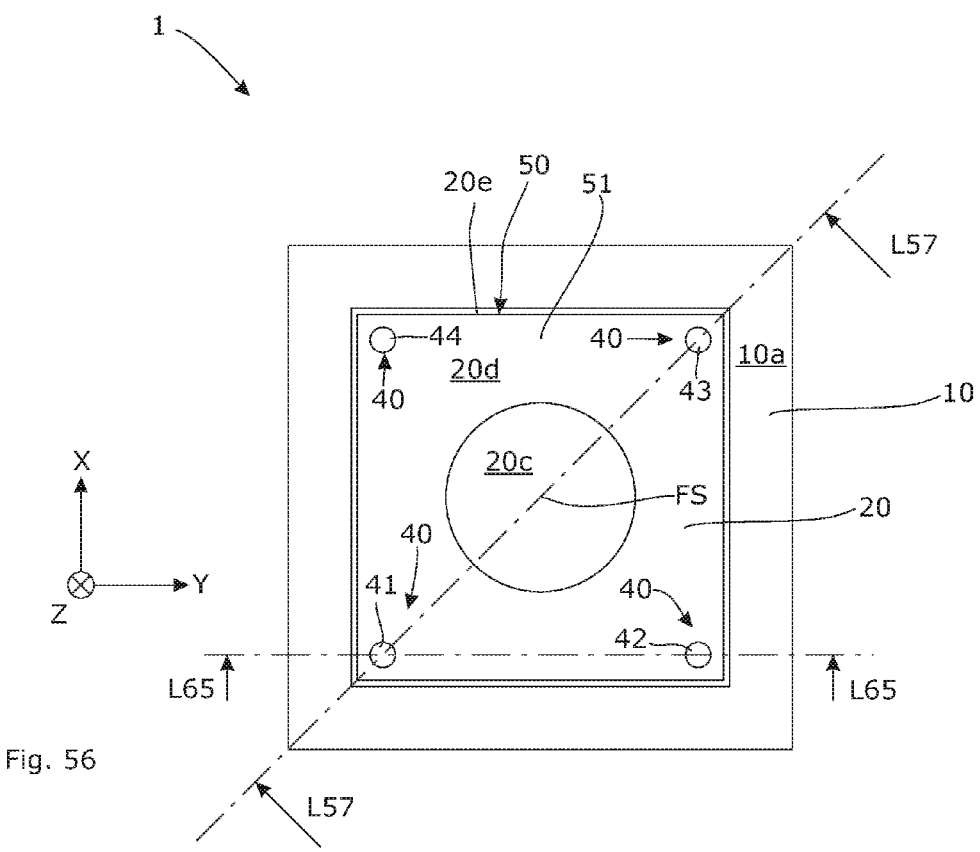
Figure 57:
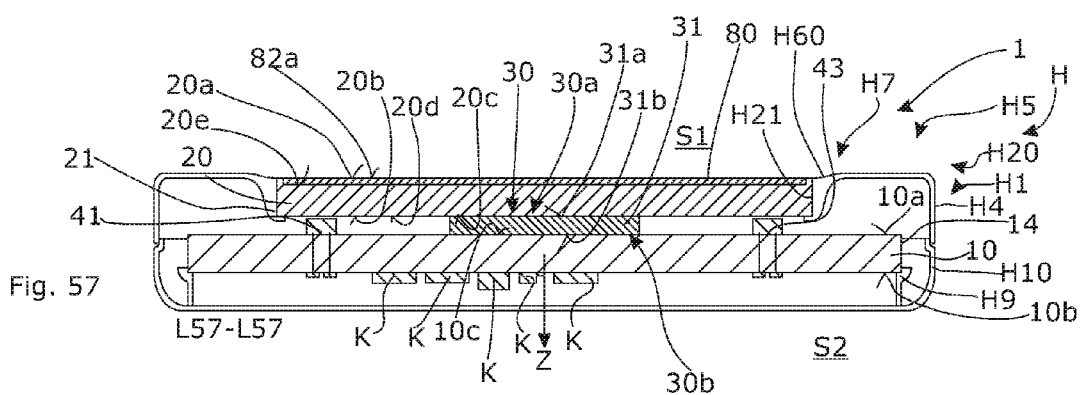
Figure 58:
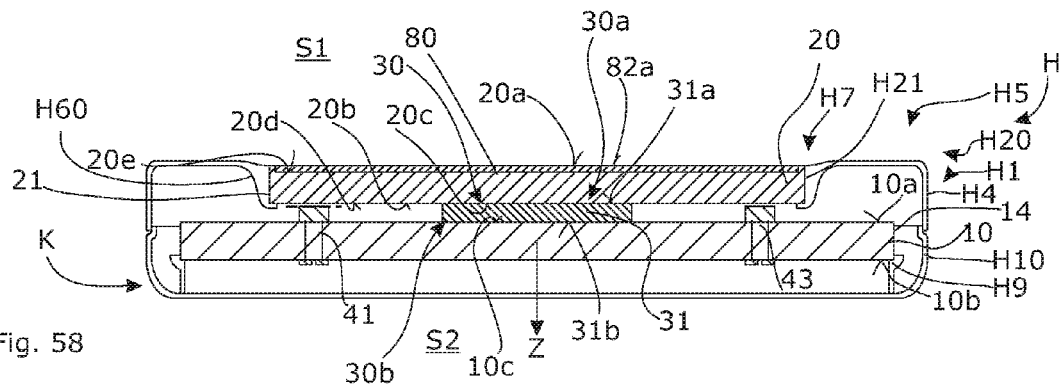
Figure 59:
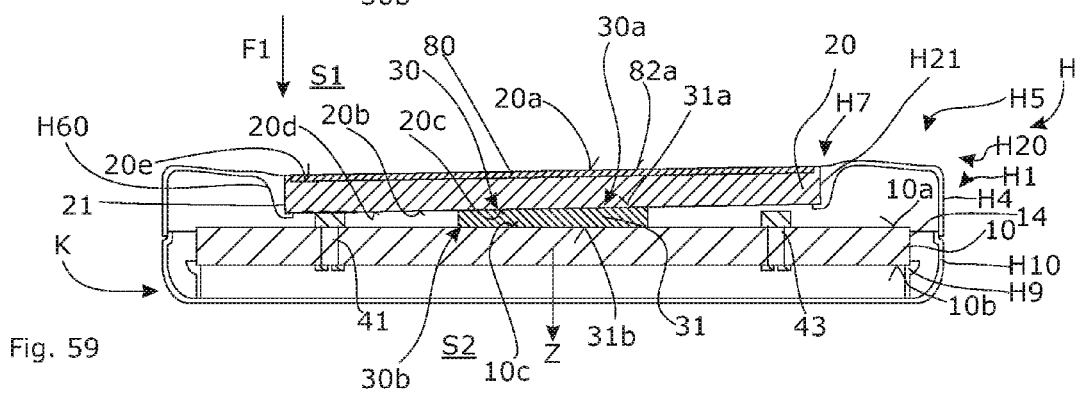
Figure 60:
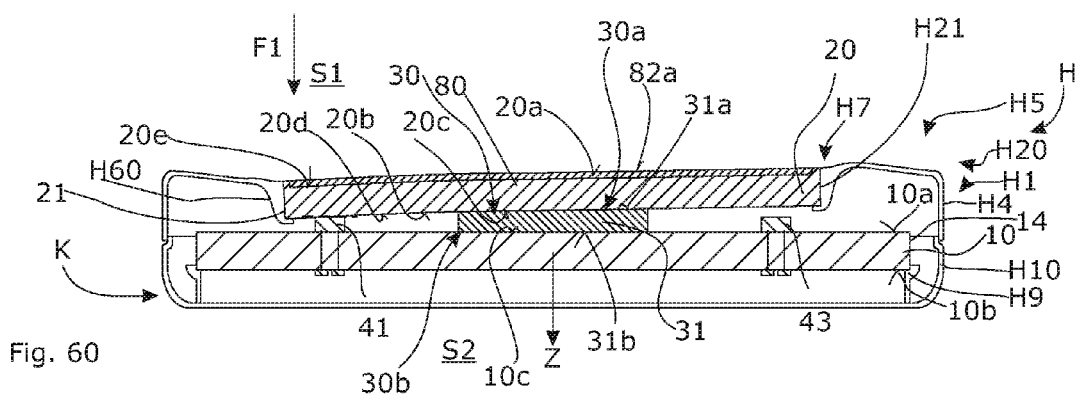
Figure 61:
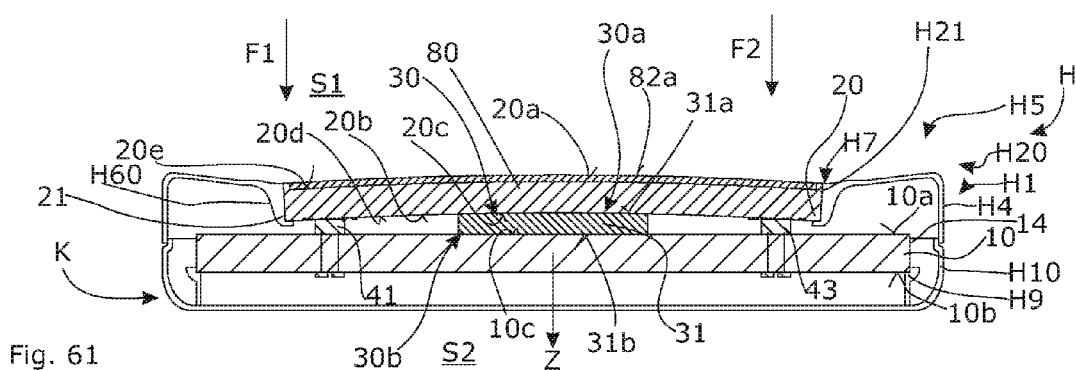
Figure 62:
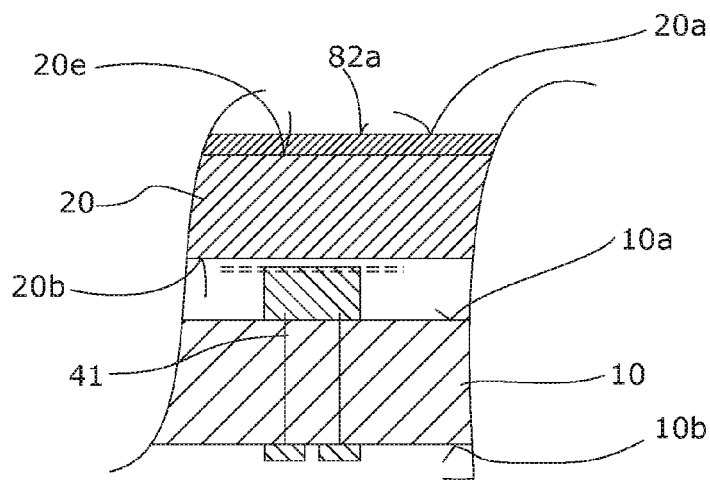
Figure 63:
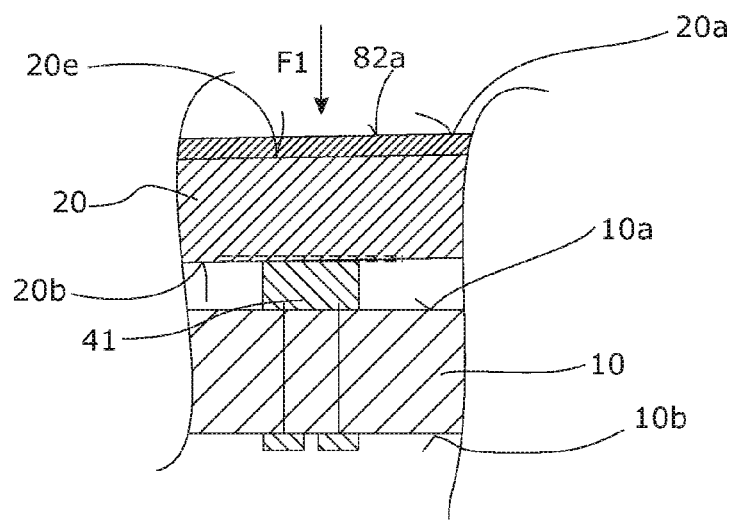
Figure 64:
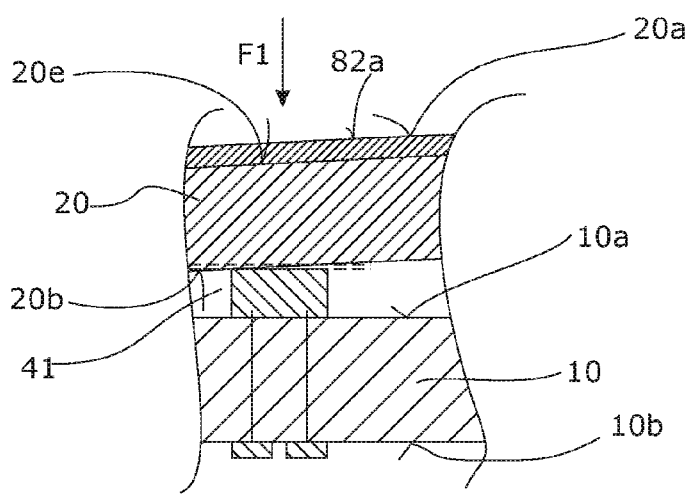
Figure 78:
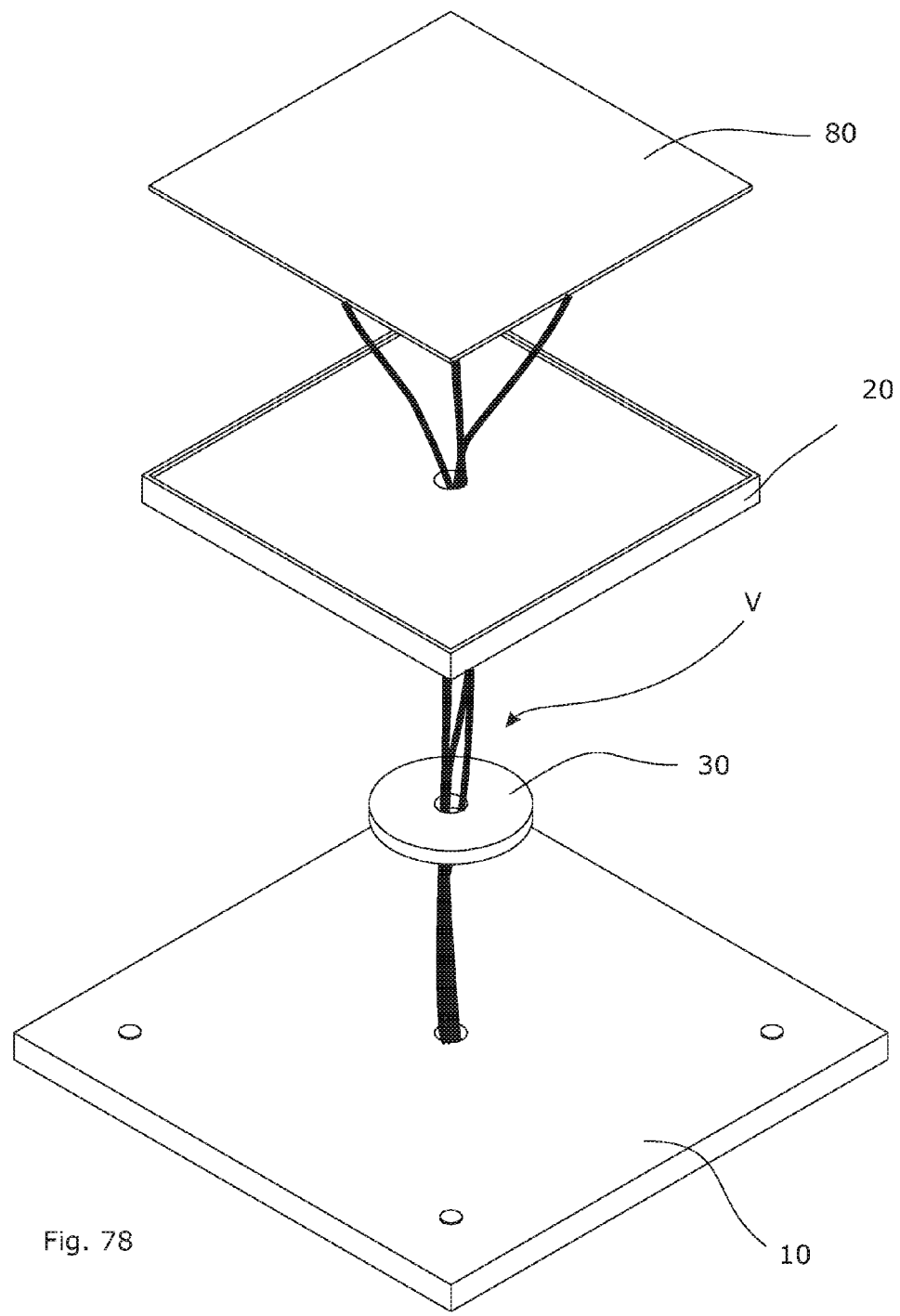
Figure 79:
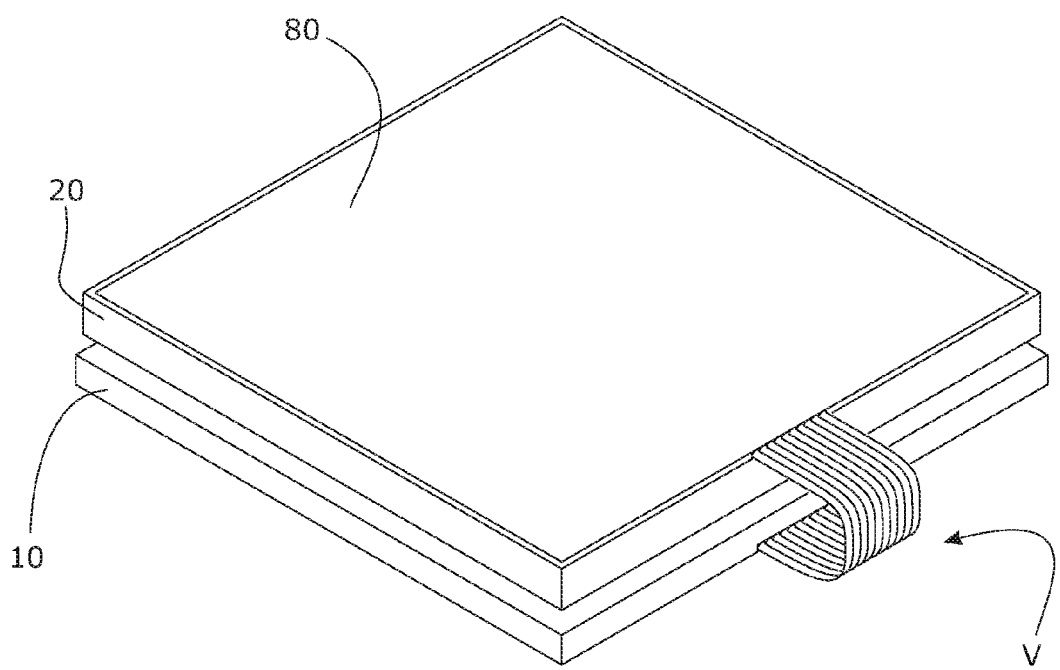
Figure 80:
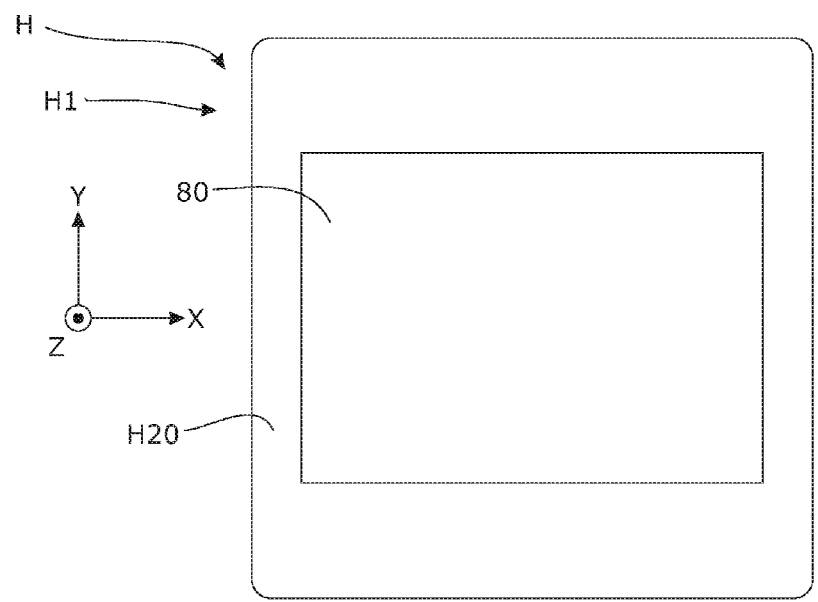
Figure 81:
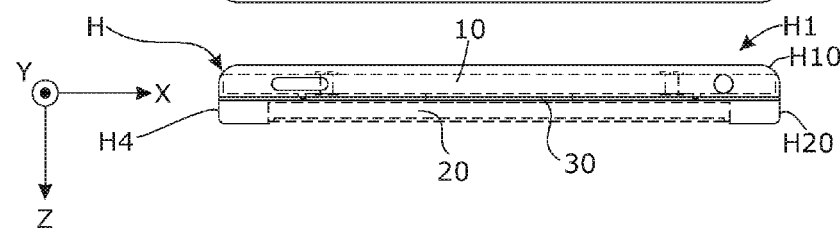
Figure 85:
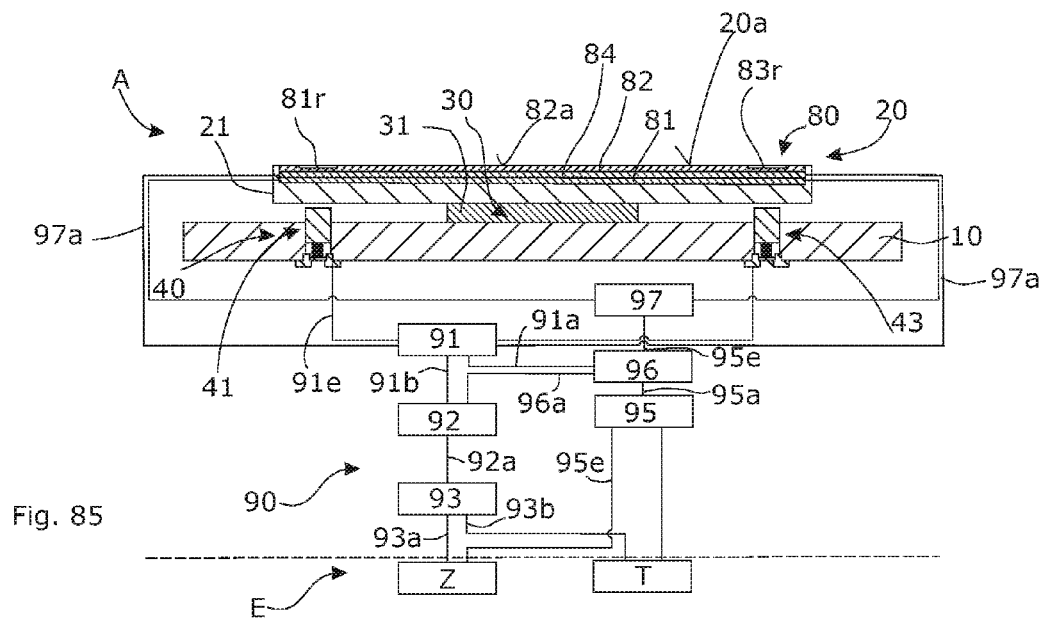
Figure 86:
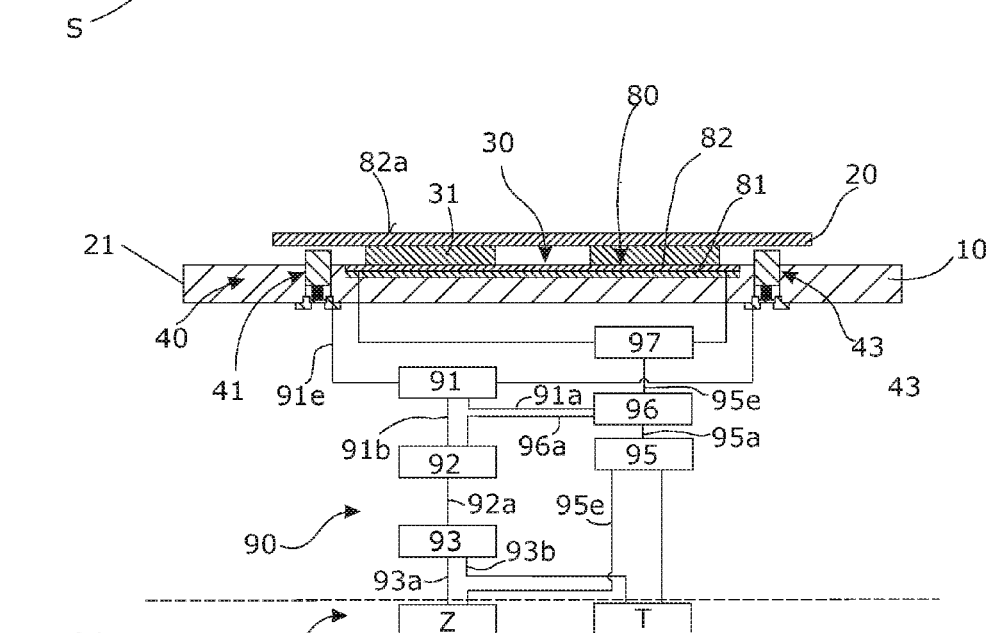
Figure 95:
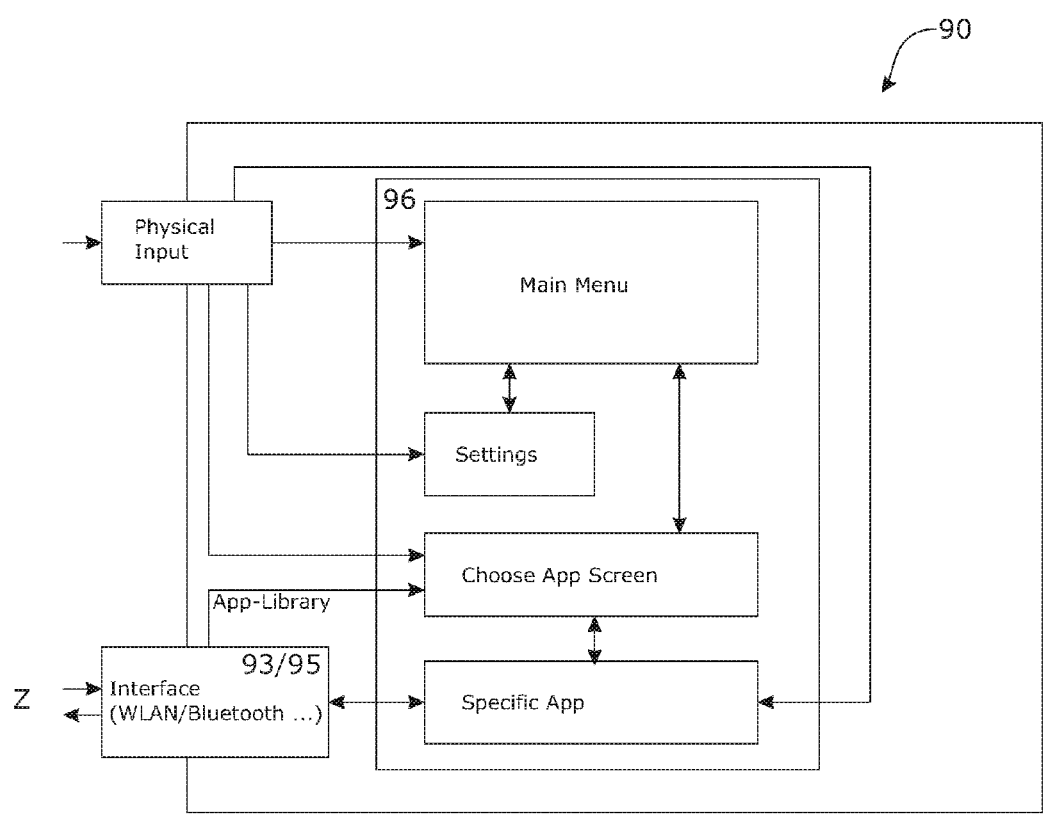
Figure 96:
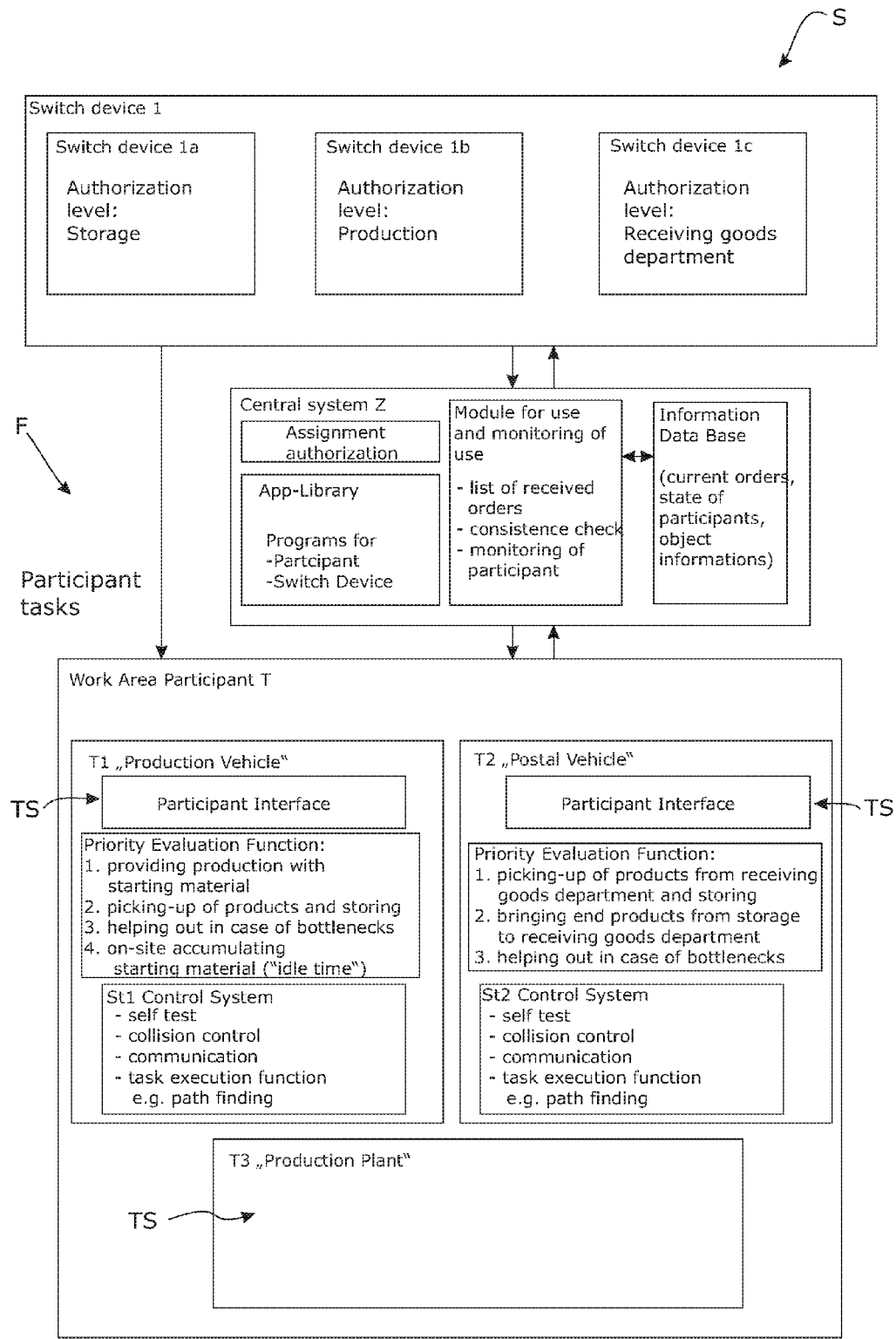
Figure 97:
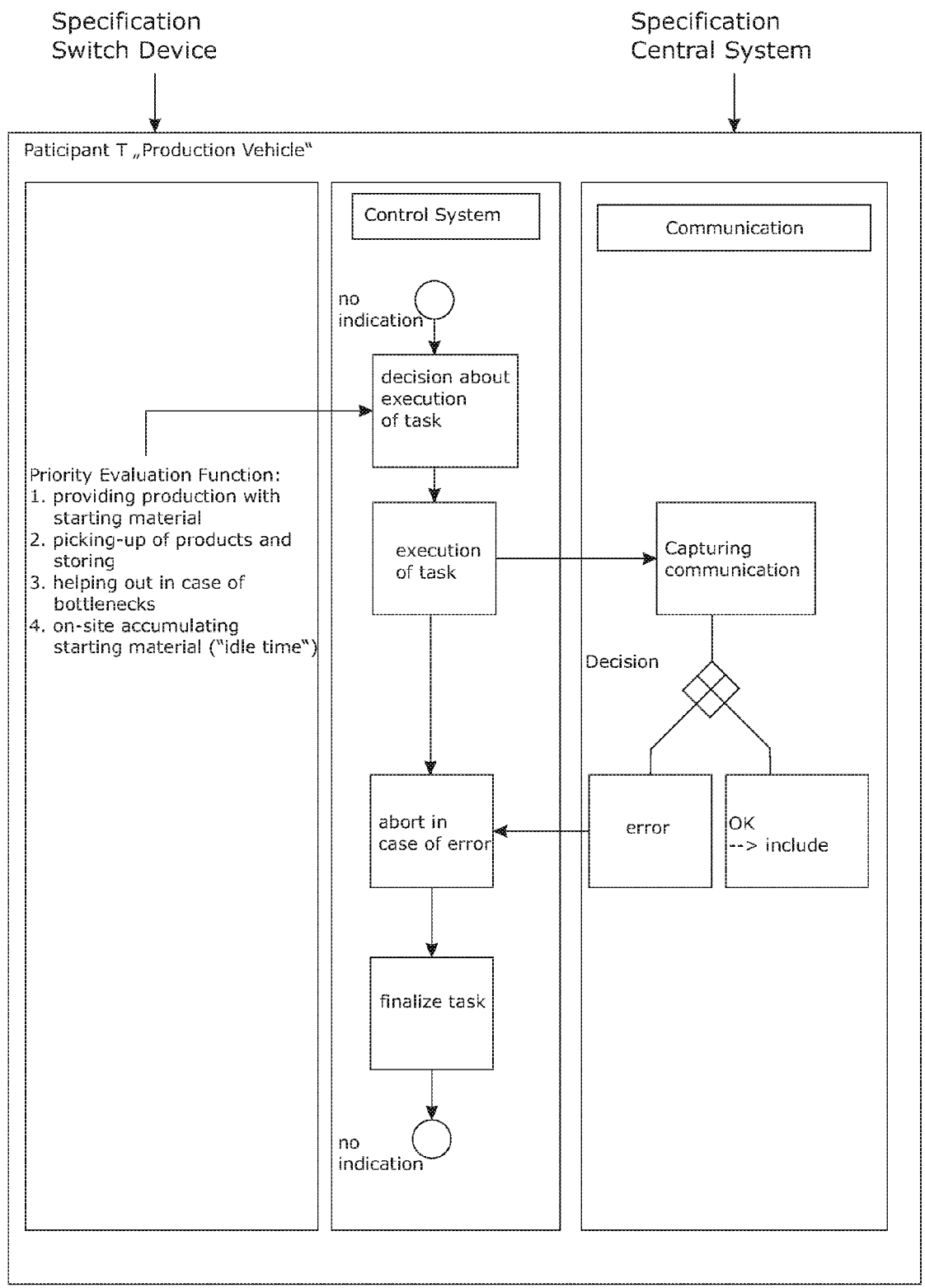

Hereafter embodiments of the invention are described by reference to the enclosed drawings, which show:

FIG. 1 a plan view of an embodiment of the electrical switch device with a housing, a main body arranged therein, an actuation part and a connection device located between these in a first embodiment, as well as sensors, wherein the sensors are shown dashed as they are hidden parts in the plan view, FIG. 2 a sectional view of the embodiment of the electrical switch device according to FIG. 1 along the line L2-L2 drawn in FIG. 1, wherein contactless sensors in the form of optical sensors are used, FIG. 3 a sectional view of the embodiment of the electrical switch device according to FIG. 1 along the line L3-L3 drawn in FIG. 1, FIG. 4 another plan view of the embodiment of the electrical switch device according to FIG. 1, in which actuation areas of the actuation part are shown dashed, FIG. 5 as a first step of a sequence of steps, the sectional view of the embodiment of the electrical switch device according to FIG. 1 along the line L2-L2 drawn in FIG. 1, wherein the switch device is shown in an initial position, FIG. 6 the embodiment of the electrical switch device according to FIG. 1 in the representation of FIG. 5, wherein the switch device is shown in an actuation position, in which an external compressive force is exerted on a first lateral edge section of the actuation part from an actuation side, FIG. 7 the embodiment of the electrical switch device according to FIG. 1 in the representation of FIG. 5, wherein a greater external compressive force is exerted in comparison to that of FIG. 6, FIG. 8 the embodiment of the electrical switch device according to FIG. 1 in the representation of FIG. 5, compared to FIG. 7 a further external compressive force is exerted on a second lateral edge section of the actuation part, which is situated opposite to the first lateral edge section, FIG. 9 a plan view of a further embodiment of the switch device with another embodiment of the connection device, FIG. 10 a plan view of a further embodiment of the switch device with another embodiment of the connection device, FIG. 11 a plan view of a further embodiment of the switch device with another embodiment of the connection device, FIG. 12 a perspective view of the base plate and the connection device of a further embodiment of the switch device, wherein the connection device is a variant of the connection device of FIG. 11, FIG. 13 a perspective view of the base plate and the connection device of a further embodiment of the switch device, wherein the connection device is a variant of the connection devices of FIG. 11 or 12, FIGS. 14 to 16 different deformation states of the actuation part of a switch device according to FIG. 12 in a sectional view, FIG. 17 a variant to the embodiment of connection device shown in FIG. 12, in which switch parts are integrated as areas of greater elasticity in the connection layer, FIG. 18 a plan view of a further embodiment of the connection device without the actuation part, having a ring-shaped connection layer and a substantially inelastic spherical switch part in the centre thereof, FIG. 19 as a first step of a sequence of steps, the sectional view of the embodiment of the electrical switch device according to FIG. 18 along the line L19-L19 drawn in FIG. 18, wherein the switch device is shown in an initial position, FIG. 20 a plan view of a variant of the embodiment shown in FIG. 18, with a connection device having an alternative design thereto, FIG. 21 a sectional view of a further embodiment of the switch device analogous to the line L2-L2 in FIG. 1, wherein the actuation part is designed as a display, FIGS. 22 and 23 are each sectional views, obtained analogous to the line L2-L2 of FIG. 1, of other embodiments of the switch device, in which the connection surfaces of the base plate and the actuation part are curved, FIG. 24 a detailed view of the embodiment of the electrical switch device according to FIG. 1 with the first lateral edge section of the actuation part, wherein the switch device is in the output state shown in FIG. 5, FIG. 25 the detailed representation of FIG. 24, wherein the switch device is in the actuation state shown in FIG. 6, FIG. 26 the detailed representation of FIG. 25, wherein the switch device is in the actuation state shown in FIG. 7, FIG. 27 a plan view of a further embodiment of the electrical switch device, wherein the sensors are shown dashed as they are hidden parts in the plan view, FIG. 28 a sectional view of the embodiment of the electrical switch device according to FIG. 27 along the line L28-L28 drawn in FIG. 27, FIG. 29 as a first step of a sequence of four steps, the sectional view of the embodiment of the electrical switch device according to FIG. 27 along the line L28-L28 drawn in FIG. 27, wherein the switch device is shown in an initial position and the embodiment of the switch device shown has a flexible actuation part, FIG. 30 the embodiment of the electrical switch device according to FIG. 27 in the view of FIG. 29, wherein the switch device is shown in an actuation position, in which an external compressive force is exerted on a first lateral edge section of the actuation part from an actuation side, FIG. 31 the embodiment of the electrical switch device according to FIG. 1 in the view of FIG. 29, wherein a greater external compressive force is exerted in comparison to that of FIG. 30, FIG. 32 the embodiment of the electrical switch device according to FIG. 1 in the view of FIG. 29, compared to FIG. 31 a further external compressive force is exerted on a second lateral edge section of the actuation part, which is situated opposite to the first lateral edge section, FIG. 33 a detailed view of the embodiment of the electrical switch device according to FIG. 27 with the first lateral edge section of the actuation part, wherein the switch device is in the output state shown in FIG. 29, FIG. 34 the detailed representation of FIG. 33, wherein the switch device is in the actuation state shown in FIG. 30, FIG. 35 the detailed representation of FIG. 33, wherein the switch device is in the actuation state shown in FIG. 31, FIG. 36 as a first step of a sequence of five steps, the sectional view of the embodiment of the electrical switch device according to FIG. 27 along the line L36-L36 drawn in FIG. 27, wherein the switch device is shown in an initial position and the embodiment of the switch device shown has a rigid actuation part, FIG. 37 the embodiment of the electrical switch device according to FIG. 27 in the representation of FIG. 36, wherein the switch device is shown in an actuation position, in which an external compressive force is exerted on a first lateral edge section of the actuation part from an actuation side, FIG. 38 the embodiment of the electrical switch device according to FIG. 27 in the representation of FIG. 36, wherein a greater external compressive force is exerted in comparison to that of FIG. 37, FIG. 39 the embodiment of the electrical switch device according to FIG. 27 in the representation of FIG. 36, wherein compared to FIG. 38 a further external compressive force is exerted on a second lateral edge section of the actuation part, which is situated opposite to the first lateral edge section, FIG. 40 the embodiment of the electrical switch device according to FIG. 27 in the representation of FIG. 36, wherein compared to FIG. 39 in a further operating state no external pressure force is exerted on a lateral edge section of the actuation part, FIG. 41 as a first step of a sequence of four steps, a sectional view of the embodiment of the electrical switch device according to FIG. 27 along the line L41-L41 drawn in FIG. 27, wherein the switch device is shown in an initial position and the embodiment of the switch device shown has a rigid actuation part, FIG. 42 the embodiment of the electrical switch device according to FIG. 27 in the representation of FIG. 41, wherein the switch device is shown in an actuation position, in which external compressive forces are exerted from an actuation side on lateral edge sections of the actuation part which are located opposite to each other, FIG. 43 the embodiment of the electrical switch device according to FIG. 27 in the representation of FIG. 41, wherein a greater external compressive force is exerted in comparison to that of FIG. 42, FIG. 44 the embodiment of the electrical switch device according to FIG. 27 in the representation of FIG. 41, wherein compared to FIG. 43, in a further operating state again no external pressure force is exerted on a lateral edge section of the actuation part, FIG. 45 a plan view of a further embodiment of the electrical switch device, wherein the sensors are shown dashed as hidden parts in the plan view, FIG. 46 a sectional view of the embodiment of the electrical switch device according to FIG. 45 along the line L46-L46 drawn in FIG. 45, FIG. 47 as a first step of a sequence of four steps, a sectional view of the embodiment of the electrical switch device according to FIG. 45 along the line L46-L46 drawn in FIG. 45, wherein the switch device is shown in an initial position and the embodiment of the switch device shown has a rigid actuation part, FIG. 48 the embodiment of the electrical switch device according to FIG. 45 in the representation of FIG. 7, wherein the switch device is shown in an actuation position, in which an external compressive force is exerted on a first lateral edge section of the actuation part from an actuation side, FIG. 49 the embodiment of the electrical switch device according to FIG. 45 in the representation of FIG. 47, wherein a greater external compressive force is exerted in comparison to that of FIG. 48, FIG. 50 the embodiment of the electrical switch device according to FIG. 45 in the representation of FIG. 47, wherein compared to FIG. 49 no external compressive force is exerted on lateral edge sections of the actuation part, FIG. 51 a detailed view of the embodiment of the electrical switch device according to FIG. 45 with the first lateral edge section of the actuation part, wherein the switch device is in the output state shown in FIG. 47, FIG. 52 the detailed representation of FIG. 51, wherein the switch device is in the actuation state shown in FIG. 48, FIG. 53 the detailed representation of FIG. 51, wherein the switch device is in the actuation state shown in FIG. 49, FIG. 54 a sectional view of the embodiment of the electrical switch device as a variant of the embodiments of FIGS. 27 and 45, resulting in the sectional view analogous to lines L28-L28 or L46-L46 and wherein an edge section of the actuation part is pretensioned by an edge section of the housing, FIG. 55 a sectional view of the embodiment of the electrical switch device as a further variant of the embodiments of FIGS. 27 and 45 compared to the embodiment of FIG. 54, in the representation of FIG. 54 and wherein an edge section of the actuation part is pretensioned by an edge section of the housing, FIG. 56 a plan view of a further embodiment of the electrical switch device, wherein the sensors are shown dashed as hidden parts in the plan view, FIG. 57 a sectional view of the embodiment of the electrical switch device according to FIG. 56 along the line L57-L57 drawn in FIG. 56, FIG. 58 as a first step of a sequence of four steps, the sectional view of the embodiment of the electrical switch device according to FIG. 56 along the line L57-L57 drawn in FIG. 56, wherein the switch device is shown in an initial position, FIG. 59 the embodiment of the electrical switch device according to FIG. 56 in the representation of FIG. 58, wherein the switch device is shown in an actuation position, in which an external compressive force is exerted on a first lateral edge section of the actuation part from an actuation side, FIG. 60 the embodiment of the electrical switch device according to FIG. 56 in the representation of FIG. 58, wherein a greater external compressive force is exerted in comparison to that of FIG. 59, FIG. 61 the embodiment of the electrical switch device according to FIG. 56 in the representation of FIG. 58, compared to FIG. 60 a further external compressive force is exerted on a second lateral edge section of the actuation part, which is situated opposite to the first lateral edge section, FIG. 62 a detailed view of the embodiment of the electrical switch device according to FIG. 56 with the first lateral edge section of the actuation part, wherein the switch device is in the output state shown in FIG. 58, FIG. 63 the detailed representation of FIG. 62, wherein the switch device is in the actuation state shown in FIG. 60, FIG. 64 the detailed representation of FIG. 62, wherein the switch device is in the actuation state shown in FIG. 61, FIG. 65 as a first step of a sequence of three steps, a sectional view of the embodiment of the electrical switch device according to FIG. 56 along the line L65-L65 drawn in FIG. 56, wherein the switch device is shown in an initial position, FIG. 66 the sectional view of the embodiment of the electrical switch device according to FIG. 56 as shown in FIG. 65, wherein the switch device is shown in an actuation position, in which a force F1 is exerted centrally on the actuation part, FIG. 67 the sectional view of the embodiment of the electrical switch device according to FIG. 56 as shown in FIG. 65, wherein the switch device is again shown in the initial position, FIGS. 68 to 71 representations of operating states of a further embodiment of the electrical switch device, wherein the switch device has no connection layer and a circumferential edge section of the housing part is connected to the actuation part, wherein the operating states include an initial state (FIG. 68), a first deformation state due to the exertion of a lateral force F1 on the actuation part (FIG. 69), a further deformation state due to the exertion of the lateral force F1 with a larger component on the actuation part (FIG. 69) and a deformation state due to the exertion of the lateral force F1 together with an additional lateral force F2 on the actuation part (FIG. 70), FIG. 72 a plan view of a further embodiment of the electrical switch device, wherein the sensors are shown dashed as hidden parts in the plan view, wherein the connection device is designed differently than in the previous Figures and wherein a display is integrated in the main body, FIG. 73 a sectional view of the embodiment of the electrical switch device according to FIG. 72 along the line L73-L73 drawn in FIG. 72, FIG. 74 a sectional view of the embodiment of the electrical switch device according to FIG. 72 along the line L74-L74 drawn in FIG. 72, FIG. 75 a plan view of a further embodiment of the electrical switch device, wherein the sensors are shown dashed as hidden parts in the plan view, wherein the connection device is designed differently than in the previous Figures as a transparent layer, and wherein a display is integrated in the main body, FIG. 76 a sectional view of the embodiment of the electrical switch device according to FIG. 75 along the line L76-L76 drawn in FIG. 75, FIG. 77 a sectional view of the embodiment of the electrical switch device according to FIG. 75 along the line L77-L77 drawn in FIG. 75, FIG. 78 a perspective exploded view of an embodiment of the electrical switch device with a representation of the electrical connection of a display integrated in the actuation part to electrical components of the main body, FIG. 79 a perspective view of a further embodiment of the electrical switch device compared to that shown in FIG. 78, with a representation of the electrical connection of a display integrated in the actuation part, FIGS. 80 to 84 representations of a further embodiment of the electrical switch device with a housing, FIG. 85 a functional representation of one embodiment of the switch device with a display and a processing device, and with an external operating device with a central system and external participants, wherein the display is arranged in the actuation part, FIG. 86 a functional representation of one embodiment of the switch device with a display and a processing device, and with an external operating device with a central system and external participants, wherein the display is arranged in the main body, FIGS. 87 through 94 display formats of a display used in embodiments of the switch device, FIG. 95 a flow diagram for a logistics system that can be implemented with embodiments of the switch device with a display, FIG. 96 a view of the menu control, with which menu displays with tasks to be executed are displayed in visual form in a display of an embodiment of a switch device, FIG. 97 is a functional representation of one embodiment of an operating system.

According to the invention an electrical switch device 1 for generating a plurality of switch states is provided, which can be accessed by a control device via electrical conductors or an electrical contact, in particular for generating adjustment commands for an actuating device. To generate the switch states the electrical switch device 1 is actuated on an actuation side S1 of the same. In the representations in the Figures, a Cartesian coordinate system with an x-axis, a y-axis, or thickness direction Z and a z-axis is shown. The z-axis extends in the thickness direction Z of the electrical switch device 1. In relation to the thickness direction Z of the electrical switch device 1, in the Z direction opposite to the actuation side S1 a rear side S2 of the electrical switch device 1 of the same is located.

With the switch device 1, a participant task to be carried out by one or more participants T or T1, T2, T3 of the operating system S can be determined, and if necessary displayed, and submitted as a task execution command over a transmission path 93a to the central system Z or to one or more participants T or T1, T2, T3 of the operating system S, which can be an industrial operating system S and in particular a warehouse system or a production plant.

The electrical switch device 1 has a main body 10 with a first or upper surface or connection surface 10a, which is facing the actuation side S1 of the electrical switch device 1, and a second or lower surface 10b which is located opposite the upper surface 10a. The main body 10 may in particular be plate-shaped, and as such, rectangular in particular. The areal extension of the main body 10 extends perpendicular to the thickness direction Z and along the X coordinate and the Y coordinate. The X coordinate can be defined in particular as a central connecting line for the area centroids of each of the smallest cross sectional areas that result along a longitudinal direction, or an averaged connection line through these.

Furthermore, the electrical switch device 1 has an actuation part or an actuation plate 20, which extends perpendicular to the thickness direction Z and which, viewed in the thickness direction Z, is arranged on the main body 10 on the side of its first surface 10a. The actuation part 20 can be designed in particular as an actuation plate. In this case the actuation part 20, as is shown in the embodiment of FIG. 1, is rectangular or at least substantially rectangular in shape, seen in plan view or in the Z direction. The term "substantially rectangular" is understood as meaning a shape in which the perimeter lines run parallel or approximately in parallel to one another, and at least one of the corner areas can have rounded corner line sections. An "approximately parallel" extension of perimeter lines relative to each other is intended to mean herein that the respective perimeter lines extend relative to each other in such a way that a maximum angle of 20 degrees exists between the tangents to the respective perimeter lines at opposite points of the respective perimeter lines, wherein the points lying opposite each other are points each having a minimum distance from each other, based on one of the perimeter lines. The actuation part 20 can also be oval or circular in shape, in plan view or viewed in the Z direction.

Furthermore, the switch device according to the invention can have a housing device H, that can be formed by a housing part H1, which extends essentially along the actuation side S1.

The actuation part 20 has an actuation surface 20a which is facing the actuation side S1 of the electrical switch device 1, and a connection surface 20b, located opposite to this and facing the connection surface 10a of the main body 10. The actuation surface of 20a appears in the plan view of the actuation part 20, in particular in the thickness direction or the Z direction.

The main body 10 can be designed in particular as a PCB arrangement, which has a circuit board 10L made of a circuit board material, and electronic components integrated with this. In the representation of FIG. 2 a plurality of electronic components K are arranged on the lower surface 10b of the main body 10, that are connected to conductor tracks of the PCB 10L. The electronic components K can also be implemented in ways other than that shown.

Furthermore, the electrical switch device 1 comprises a connection device 30 with at least one connection layer made of an elastic material. It can also be provided that the connection device 30 consists of at least one connection layer, i.e. that the switch device 1 does not comprise any further connection means. Each of the at least one connection layers can be designed to be contiguous in its surface extension. In other embodiments of the switch device 1 it can be provided that the at least one connection layer or a single connection layer of the at least one connection layers has or have a recess, extending in its thickness direction Z and passing through the entire thickness of the connection layer. The at least one connection layer of the connection device 30 or the connection device 30 is generally attached with a first surface 30a to a connection area or inner area 20c, viewed in the Z-direction, of the connection surface 20b of the actuation part 20, and with a second surface 30b is attached to an inner area 10c of the connection surface 10a of the main body 10, or is connected to the respective inner area 10c, 20c.

In the embodiment of FIG. 1 the connection device 30 consists of a connection layer 31, which is attached with a first surface 31a to a connection area or inner area 20c, viewed in the thickness direction, of the connection surface 20b of the actuation part 20, and is attached with a second surface 31b to an inner area 10c, viewed in the thickness direction, of the connection surface 10a of the main body 10, or is connected to the respective inner area 10c, 20c.

The elastic material can be—in particular in any of the embodiments mentioned herein—a self-adhesive material, so that the connection layer 31 adheres to the inner areas 10c, 20c. Alternatively or additionally thereto, as is shown in an example in FIG. 16, it can be provided that the connection layer 31 is affixed by means of an adhesive layer to one of the inner areas 10c, 20c or to both of the inner areas 10c, 20c. In particular, in this arrangement it can be provided that the connection device 30 is formed from a connection layer 31, a first adhesive layer 30i, situated between the connection layer 31 and the connection surface 10a of the main body 10, and of a first adhesive layer 30i, situated between the connection layer 31 and the connection surface 10a of the main body 10, or is composed of these layers. The adhesive material can in particular be an elastic material.

In the embodiment of the switch device with a central connection layer 31, as is shown in FIGS. 1 to 3, the connection layer 31 can extend over the entire connection surface 10b or the entire connection surface 20b, in case one of the connection surfaces is larger than the other in at least one extension direction, and depending on which of the connection surfaces is greater. Alternatively, the size of the inner areas 10c, 20c, as is shown in FIGS. 1 to 4, can also be defined in such a way that in terms of surface area it is no larger than 75% of the size of the connection surface 20b of the actuation part 20 or is located within a circle whose area is no larger than 75% of the size of the connection surface 20b of the actuation part 20. Alternatively or additionally, it can be defined so that the area centroid FS of the actuation surface 20a of the actuation part 20 or of the opening H7, viewed in its respective surface extension, is situated within the inner area 20c of the connection surface 20b of the actuation part 20 and within the connection layer 31.

Hereafter the area centroid FS will be related either to the control surface 20a of the actuation part 20 or, to describe an alternative embodiment, to the opening H7 in its respective surface extension.

In the embodiments of the switch device in accordance with FIGS. 1 to 44, for example, the actuation part 20 projects beyond the connection layer 31, viewed from the area centroid FS, so that the switch device 1 comprises an area 20d protruding beyond the connection area or inner area 20c of the connection surface 20b, viewed in the surface extension of the main body 10. It can be provided in particular that the above area 20d completely surrounds the connection area or inner area 20c or the connection layer 31, i.e. it encloses the connection area or internal area 20c or the connection layer 31. The protruding area is labelled with the reference numeral 20d. In the embodiment of FIG. 1 this is designed so that it encircles the connection layer 31. The connection surface 20b of the actuation part 20 is then formed from the connection area 20c and the protruding area 20d.

The material of the connection layer 31 is elastic, to the extent that it generates a return force of the actuation part 20 in response to a compression relative to the main body 10. The material of the connection layer 31 can in particular be formed of an acrylic material. In particular, the material can be a foam-like acrylic material. In particular, a material which is both self-adhesive on both sides and elastic from the field of industrial adhesive technology can be used, as is sold for example under the product name "ACXplus" by the company "tesa SE". The connection layer 31 can also be formed from silicone or a foam material. The connection layer 31 can also consist of a foam material with acrylic components. In particular in the event that a display is arranged in the main body 10 and the display viewed in the thickness direction Z is located at least partly within the connection layer 31, the connection layer 31 can be formed from an optically transparent material, so that display elements positioned behind the connection layer 31 are visible.

The thickness of the connection layer 31 in the Z direction can be between 0.2 mm and 10 mm, but preferably between 0.2 mm and 5 mm. Also, the thickness of the connection layer 31 in the Z direction can be defined by the size of the actuation part 20 in such a way that the thickness of the connection layer 31 in the Z-direction is from 1/100 to 1/10 of the greatest longitudinal extension of the actuation plate perpendicular to the Z-direction. For the thickness range, an edge region of the connection layer 31 can in particular be excluded, which in particular can have a value between 1 mm and 2 mm.

The housing part H1 of the housing device H comprises: a side wall H4, which at least in some sections surrounds the connection device 30, provided this is a part of the switch device 1, the actuation part 20 viewed in the thickness direction Z, and an edge section H5 which adjoins to the side wall H4 towards the actuation side S1, extends along the extension direction of the actuation part 20 and forms a central opening H7, in which the display 80 extends at least in some sections.

The housing part H1 may be designed in particular be relatively flat, i.e. with a relatively low overall height. These terms are meant to indicate herein that the maximum width of the housing part H1 in the X-Y plane is at least five times greater than the largest thickness of the housing part H1 viewed in the Z direction.

In the design of the switch device 1 with a display, the opening H7 of the housing part H1 is preferably formed substantially rectangular, as is shown for example in FIGS. 1 and 5. In particular, it is provided that the inner edge H8 is formed from two pairs of side edge sections H81, H83 and H82, H84, which extend at least in sections along relative to each other such that they essentially provide a substantially rectangular visible display area in a plan view in the Z direction. Accordingly the inner edge H8 can be formed from four corners or corner sections H85, H86, H87, H88, each one of which is located between two adjacent side edge sections H81, H82, H83, H84. In the embodiment of FIGS. 1 and 5, one corner H85, H86, H87, H88 is each formed between two corresponding adjacent side edge sections H81, H82, H83, H84. Alternatively, it can be provided that curved and, in particular, viewed from the FS, concave curved corner sections H85, H86, H87, H88 are each formed between two corresponding adjacent side edge sections H81, H82, H83, H84.

The side wall H4 extends along the Z direction and can be designed as a wall continuously surrounding the actuation part 20. Also, the side wall H4 can be designed in such a way that this surrounds the actuation part 20 in some sections along its circumference, that is, it has e.g. a plurality of recesses arranged distributed along the circumference of the actuation part 20. In this case the side wall H4 can start e.g. from the side of the base body 10, and in particular adjoin to the resulting outer surface 14 viewed in the Z-direction, or to an outer edge section 15 of the main body 10 that is adjacent thereto. In this case the side wall H4 can be connected directly to the outer surface 14 via an intermediate part, or on the outer edge section 15. The side wall H4 can be an outer part of the housing part H1 located on the second side S2.

Also, as shown in FIGS. 2 and 3, the housing part H1 can comprise a holding device H9, which receives the main body 10 and to which the main body 10 can be attached. The holding device H9 can be designed as a base, or in accordance with FIG. 2, as a support arm.

The housing part H1, as shown in FIG. 1, can comprise a base section H10 and a cover section H20 arranged on the rear side S2 of the electrical switch device 1, wherein the base section H10 and cover section H20 form an interior space H2, in which the main body 10 and the actuation part 20 are located. The holding device H10 can be designed as an attachment to the base section H10. The base section H10 and the cover section G20 can be manufactured together in a single piece or from a single piece, e.g. by a casting process and in particular, a plastic injection moulding process. In the representation of FIGS. 1 to 3 the housing is designed as a two-part housing, wherein the base section H10 and the cover part H20 are designed as a first part and a second part respectively and the cover part H20 is mounted on the base part H10 and fixed thereto, so that the housing forms a single part overall. The base part H10 and the cover part G20 in particular can each be shell-shaped. The housing part H1 can also be designed in such a way that only the base part H10 or only the cover part G20 is shell-shaped.

In the embodiment of FIGS. 1 to 3, the side wall H4 is located at least partially outside of the actuation part 20, viewed in the thickness direction Z. In this case the side wall H4 can surround the main body 10 along its perimeter. Adjoining the side wall H4 in the direction of the actuation side S1 is an edge section H5 of the housing part H1, which has and forms an internal central opening H7, viewed in the Z direction. The outer edge of the actuation plate 20 extends along the inner edge H8 forming the opening H7.

In one embodiment of the switch device 1, this can be designed in such a way that the outer edge section 21 of the actuation plate 20, viewed in the Z-direction, is located within the inner rim edge section H5 of the housing part H1 viewed in the Z-direction, so that the actuation part 20 viewed in the Z direction is located within the opening H7 (FIG. 2).

In general, as is shown in FIG. 21, in the versions described herein it is provided that the actuation part 20 is designed as a display 80. This display 80 can have a rigid base plate, on which image generation components are arranged.

In all the embodiments described herein, even if not specifically described in relation to each of them, it can be provided that the actuation plate 20 viewed in the Z direction is located such that it is overlapping with the edge section H5 of the housing part H1. This is shown, for example, in the embodiments of FIGS. 21, 23, 27 to 53, 54, 55 and 56 to 71.

With this overlap feature, in particular the edge section H5 of the housing part H1 can be connected to an edge section 25 of the actuation part 20 when the actuation part 20 is in its initial position or neutral position. The edge section 25 of the actuation part 20 is defined as an external area of the actuation part 20 viewed in the Z direction, adjoining an external edge line 21 obtained in this viewing direction. The initial position or neutral position of the actuation part 20 is defined in such a way that, at any point of the outer circumference with its edge section 25, this has a distance from each of the sensors at which the limit value G1 is not exceeded. In other words, the initial position or neutral position of the actuation part 20 is defined in such a way that the situation shown in FIG. 6 does not arise at any of the sensors and no external force (e.g. F1 or F2) is engaged either. It can be provided that an internal surface H6 of the preferably circumferential edge section H5 facing toward the base plate 10 abuts against the first surface 20a of the edge section 25 of the actuation part 20, at least in some sections, when the actuation part 20 is in its initial position or neutral position (FIGS. 22, 23, 54, 55).

This means that the position of the edge section H5 fixes the position of the actuation part 20, since the position of the actuation part 20 is defined on the one hand by the connection layer 31 and on the other hand by the edge section H5. According to one embodiment it can be provided that the connection layer 31 is in its unstressed state and exerts no force on the actuation part 20 due to its elasticity when the actuation part 20 is in an initial position or neutral position, and there is also no external force acting on this. In an alternative embodiment thereto it can also be provided that the connection layer 31 is in a compressed state at least in some sections, and exerts an initial force on the actuation part 20 due to its elasticity when the actuation part 20 is in an initial position or neutral position, and there is also no external force acting on this. In this case, due to this condition of the device the edge section H5 can be part of the connection device 30. Such embodiments are shown in FIGS. 54 and 55. In the diagrams of FIGS. 54 and 55, the edge region labelled with the reference numeral H51 which is undeformed by the connection layer 31, is shown with dashed lines. Due to the deformation of the edge section H5 as a counter-bearing for the elasticity force that the connection layer 31 exerts thereon, the connection layer is compressed from a thickness $d31e$ occurring in its unstressed state to a thickness $d31v$ occurring in the condition where it is compressed by the edge section H5, so that a thickness difference $d31d$ thereby results. The deformation of the edge section H5 can be hinge-like (FIG. 54), or can occur over its length LH5 along the Y-direction (FIG. 55).

A pretensioning by the edge section H5 on the actuation part 20 can also be present in the embodiments of FIGS. 56 and 57.

In general, but particularly in the case of embodiments in which the edge section H5 of the housing part H1 and the actuation part 20 overlap viewed in the Z direction, a seal H40 can be located between the edge section H5 of the housing part H1 and the edge section 25 or the external edge surface 21 of the actuation part 20, which connects the edge section H5 and the actuation part 20 together, in particular in order to seal the interior space H2 of the housing part H1 to the outside. Examples of one embodiment of the electrical switch device 1 with a sealing device are shown in FIGS. 27 to 53. In this case the seal H40 can be part of the connection device 30, since due to this a connection is established between the main body 10 which is mounted on the housing H1, and the actuation part 20. This seal H40 can be formed from an elastic material, so that this supports the resilience of the connection layer 31. Some sections of the seal H40 can also be located along the perimeter of the edge section H5.

In addition, in the embodiments of FIGS. 54 and 55 the surface H6 can be in contact with the surface 20a of the actuation part 20 around its circumference and thereby forming a seal, so that these embodiments also provide a sealing of the interior space H2.

In embodiments with a seal H40 between the edge section H5 and the edge section 25 or the outer edge surface 21, viewed in the Z-direction a distance can also exist between the outer edge section 21 of the actuation plate 20 and the inner rim edge section H5 of the housing part H1, (FIGS. 28 to 44), wherein a sealing device or a covering device H50, e.g. in the form of a cover ring or a cover membrane, connects the outer edge section 25 of the actuation plate 20 and the edge section H5 of the housing part H1, to seal the interior space H2 of the housing part H1 to the outside. In a further embodiment, if the seal H40, H50 is present the switch device 1 can be designed without a connection layer 31, so that the seal H40 forms the connection device 30 (FIGS. 56 to 71).

A further embodiment of the switch device 1 can be designed in such a way that the outer edge section 21 of the actuation plate 20 viewed in the Z direction protrudes beyond the inner rim edge section H5 of the housing part H1, so that the actuation part 20 and the outer edge section 25 of the actuation plate 20, viewed in the Z direction, overlap (FIGS. 27 to 44). In this situation, any of the sealing devices mentioned herein can be implemented.

With a sealing device H40, H50, by analogy to the embodiments of FIGS. 54 and 55 a pretensioning can also be exerted on the connection layer 31. In accordance with FIGS. 56 to 71, in a further embodiment of the electrical switch device 1 it can also be provided that the circumferential edge section H5 of the housing part H1 is connected to the actuation part 20, and in particular to an external edge of the same, wherein, as shown, in particular the edge section H5 is designed in one piece with the side wall H4. In this case it can be provided that the switch device 1 does not have a connection layer and the edge section H5 of the housing part H1 is designed as the reset device for the actuation part 20, by this being elastically deformable.

In this case also, in particular, the edge section H5 or sections of the same via a connection section H60, which in particular can be designed as part of the boundary section H5 and in particular formed in one piece therewith, can be directly connected to a side edge section 25 of the actuation plate 20 or attached thereto (FIGS. 56 to 71). Here, the edge section H5 is designed in such a way that this provides an elastic mounting of the actuation plate 20, which generates a return force when a deflection of the same occurs. In this case the connection layer 31 can also be present. According to an alternative embodiment when such an elastic mounting is used, no connection layer 31 is provided. In these embodiments the connection layer 31 can be omitted.

In particular in these embodiments in which a connection layer 31 is present, this can, but need not, be formed from an elastic material, and therefore one which can reset the actuation part 20. A connection layer 31 can be omitted entirely or a connection layer 31 from a non-resilient material can be provided if the connection device 30 comprises a further component which is able to reset the actuation part 20, e.g. a seal H40, H50 or a combination of an edge section H5 of the housing part of the actuation part 20. In this case, the respective seal assumes the reset function after actuation of the actuation part 20.

The electrical switch device 1 also comprises at least one sensor or at least two sensors, which is or are located between the main body 10 and the actuation part 20 and, viewed in the thickness direction Z, to the side of the connection layer 31, wherein the actuation part 20 extends perpendicular to the thickness direction Z and viewed in the extension of the X-Y plane, extends beyond the connection layer 31 and beyond each respective sensor.

In the embodiment of the connection device 30 with the connection layer 31 in accordance with FIG. 1, each of the at least one sensors, viewed in the thickness direction Z, is located behind the connection device 31 from the viewpoint of the area centroid of the actuation part 20.

On the basis of the respective position of the at least one sensor or sensors, a position of one region, arranged on said sensor, of the second surface in the thickness direction Z can be detected or determined. In particular, on the basis of the position of the sensors, the distance between the connection surface 10a of the main body 10 and the connection surface 20b of the actuation part 20, viewed in the thickness direction Z, at the position of the respective sensor viewed in the X-Y plane can be detected or determined.

The switch device 1 can comprise a sensor device 40, which comprises the at least one sensor and also a position determining device with a position determining function, wherein the position determining function is functionally connected to the respective sensor. The position determining function can be integrated in one of the electronic components K of the main body 10. Based on a comparison of an actual deflection relative with a specified limit value G1, the sensor device 40 is used to determine at an actuation area, e.g. the actuating area B41, whether during the deflection a specified limit value G1 for the deflection of the actuation part 20 has been exceeded at the area or actuation area due to a compression of the same in the Z direction in relation to the main body 10 at the area or actuation area. Such an exceeding of the specified limit value G1 determined by a comparison function is evaluated by the sensor device 40 as an actuation command.

The embodiment of the electrical switch device 1 that is shown in FIG. 1 has four sensors 41, 42, 43, 44. These are arranged evenly distributed along the outer circumference of the edge line, to detect a deflection of an actuation area of the actuation part 20 located above the respective sensor. In each case two sensors, namely the sensors 41 and 43 and the sensors 42 and 44, are arranged opposite one another in relation to the area centroid FS of the actuation surface 20a. Each sensor 41, 42, 43, 44 can be used to detect a position of one region, arranged on said sensor, of the second surface in the thickness direction Z.

The at least one sensor or the sensors can each be designed as a sensor for detecting, in a contactless manner, the distance from the respective sensor to the point of the connection surface 20b of the actuation part 20 opposite thereto. FIG. 3 shows a sectional view of the embodiment of the electrical switch device according to FIG. 1 along the line L3-L3 drawn in FIG. 1, wherein contactless sensors in the form of optical sensors are used. FIG. 4 shows a sectional view of the embodiment of the electrical switch device according to FIG. 1 along the line L3-L3 drawn in FIG. 1, wherein contactless sensors in the form of inductive sensors are used. In the switch device 1 shown in FIG. 2 therefore, each of the sensors 41, 42, 43, 44 is designed as an optical sensor.

According to one embodiment, sensors 41, 42, 43, 44 are provided, each of which detects in a contactless manner the distance from the same to the point of the connection surface 20b of the actuation part 20 that is opposite to the respective sensor.

The sensors can not only be contactless sensors, such as optical sensors, but also magnetically sensitive sensors or ones which exploit the piezo-electric effect.

In FIGS. 27 and 53 an embodiment of the sensors 41, 42, 43, 44 is shown, in which the sensors 41, 42, 43, 44 are each mechanical sensors, which are designed e.g. as switch sensors with a switch component.

In the embodiment of the sensors 41, 42, 43, 44 as mechanical sensors, each of these or only some of them can have a locking mechanism, which provides one or more locking positions. In FIGS. 29 to 32 and in particular the detailed drawings of FIGS. 33 to 35, actuation states of the actuation part 20 are shown in a design of the switch device 1 with sensors, each of which has two locking positions. In an initial position or an unstressed condition of the respective sensor 41, its surface 41 a facing towards the actuation part 20 assumes a position G0 relative to the surface 10a (FIG. 33). If the actuation area B41 of the actuation part 20 is moved in the direction of the base plate 10, a first limit value G1 or a relative position of a point of the surface 20b in contact with the surface 41 a is reached, at which a first locking position is perceptible to a user. In this first locking position the switch device 1, and in particular an actuation area identification function 91 of a processing device or evaluation device 90 of the same (FIGS. 85, 86), determines whether the limit value G1 has been reached. If the actuation area B41 of the actuation part 20 is moved further in the direction of the base plate 10, a second limit value G2 or a second relative position of a point of the surface 20b in contact with the surface 41 a is reached, at which a second locking position is perceptible to a user. In this second locking position the switch device 1, and in particular an actuation area identification function 91 of a processing device or evaluation device 90 of the same, determines whether the limit value G1 has been reached. Depending on a request generated in the display, in particular by means of an image generator 97 (FIGS. 85, 86), in response to this the user can effect an actuation of the actuation part 20, at which a limit value G1, G2 is reached.

On manual exertion of a pressure on the actuation part 20, each locking position can be sensed on this as a noticeable resistance against a further movement from the respective locking position. A respective locking position can be implemented by a mechanical resistance, such as a projection in a guide of the sensor.

According to one embodiment of the electrical switch device 1, this can comprise a display 80 or a display panel, so that this embodiment is formed by an input and output device. The display 80 can be arranged, and in particular located, on the connection surface 10a of the main body 10 or on the actuation surface 20a of the actuation part 20. In embodiments of the switch device 1 the display 80 can be located at least partially in a recess, which is formed by the connection surface 10a of the main body 10 or on the actuation surface 20a of the actuation part 20.

Figure 82:
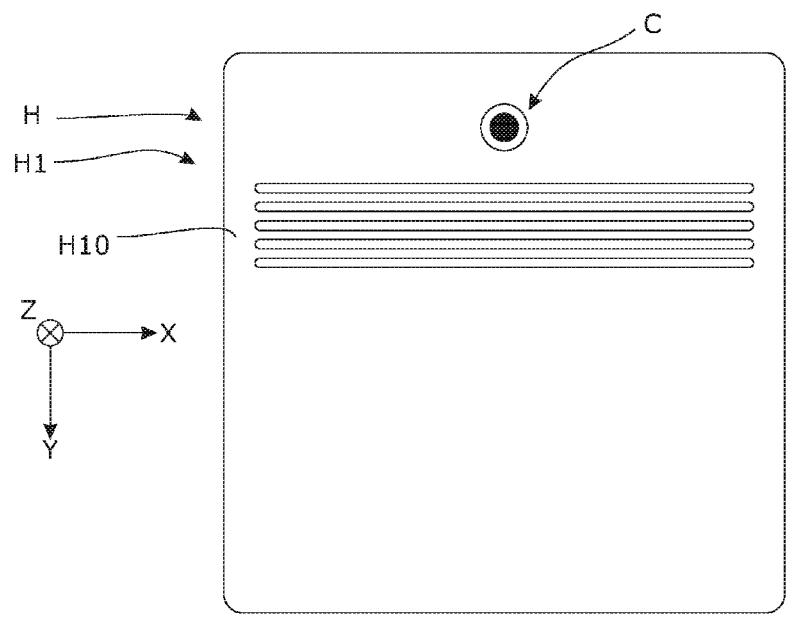
Figure 83:
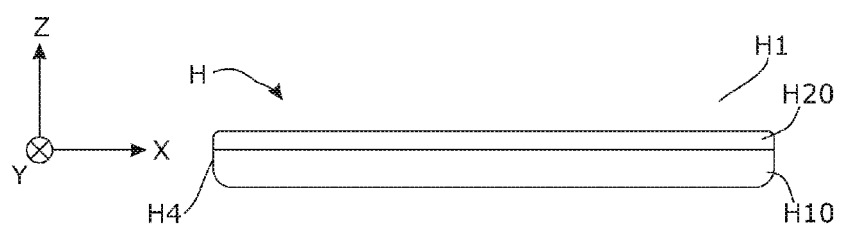
Figure 84:
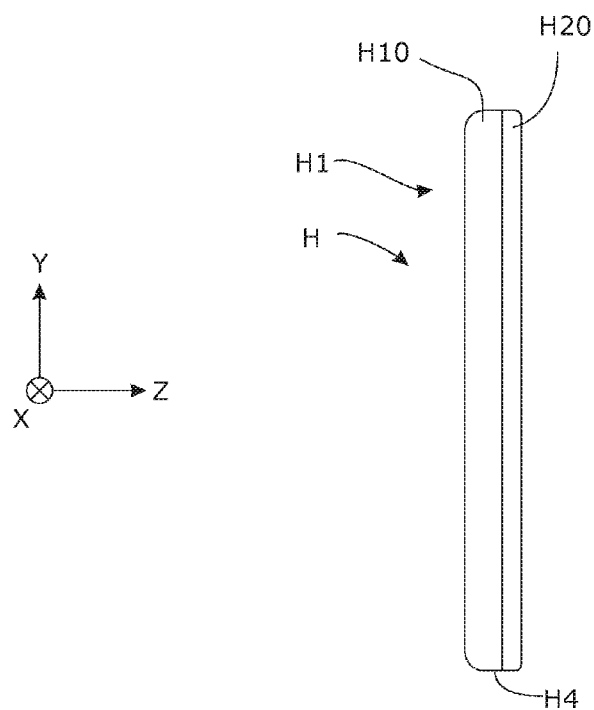

In general, the switch device 1 can comprise a camera device C. In FIG. 82, a camera device C is shown schematically by a lens integrated in the housing part H1. The camera device C can comprise in particular an optical system with a lens and camera actuation device, and an image capture device. The image capture device can comprise in particular a bar code detection function, with which a bar code detected by means of the camera can be interpreted with respect to the functions contained therein.

The housing part G1, and in particular the base part H10, can also be formed from a magnetic and/or magnetizable material, to be able to arrange the housing part G1 in an application space on a metallic attachment of this application space.

In particular in the embodiments of the switch device 1 shown in FIGS. 1 to 19, 24, 26 to 71 and FIG. 85, the actuation part 20 comprises a display 80 or display panel, which is located in an internal display area 20e of the actuation surface 20a of the actuation part 20, viewed in the thickness direction Z. By means of the display device, a display area is provided, and possibly also an operating area for a user. The display area 20e can be designed, as shown in FIGS. 1 to 19, as a recess formed on the actuation surface 20a. The display 80, viewed in the thickness direction Z, can be located entirely or partially, i.e. at least partially, in the recess.

In the embodiments according to the invention, as is described with reference to FIGS. 72 to 77, it can be provided that the main body 10 has a display 80 or display panel, which is located in an internal display area of the surface 10a of the main body 20, viewed in the thickness direction Z, which in particular comprises or forms a recess.

From a functional perspective the display 80 or the display panel is an output device. The display 80 can in particular comprise a flat image generation module 81 and a screen cover plate or support plate 82 placed over this, in the direction of the actuation side S1. The image generation module 81 can in particular be an image output device with a display device, such as a fluid display device.

The display 80 in functional terms can also be an output device, that can additionally be designed as an input device, and in this case therefore as an input and output device. In the embodiment of the display 80 as an input and output device, this can also have a proximity-sensitive and/or touch-sensitive panel or a touch panel. The proximity and/or touch-sensitive panel 84 or touch panel can be located in particular on or under the support plate 81. In each of FIGS. 85 and 86 an embodiment of the display 80 is shown, in which the display 80 comprises a proximity and/or touch-sensitive panel 84.

In a further embodiment of the switch device 1, this can be designed with the proximity and/or touch-sensitive panel 84, but without the elastic connection layer 31 and the sensors for determining a value corresponding to a distance between the main body 10 and the actuation part 20.

In relation to the operational and in particular actuation functions of the switch device 1, actuation areas can be assigned on the actuation surface 20a of the same, depending on the point at which the respective sensor of the at least one sensor is located in the surface extension of the switch device 1 or viewed along the X-Y plane.

In FIG. 4, for the four sensors 41, 42, 43, 44 and each of their specific positions on the actuation surface 20a of the switch device 1 according to FIG. 1, four actuation areas B41, B42 or B43 or B44 are assigned. These are located in corresponding edge regions of the actuation part 20, in which the respective one of the at least one sensors is arranged. The actuation areas, viewed in the Z-direction, are located in front of or above a sensor that detects a deflection of the actuation part 20 in such a way that an actuation or exertion of a compressive force F1, F2 with a minimum value in a respective actuation area leads, for example, to a reduction in the gap between the main body 10 and the actuation part 20 only in this particular actuation area, and therefore only at the sensor which is located at the respective actuation area. If the exceeding of a limit value G1 due to a corresponding compressive force is identified by an actuation area identification function 91, as a result of the actuation or any motion resulting from it, then this force is evaluated as an actuation which acts effectively on the switch device 1, and in particular its actuation part 20.

FIGS. 5 to 8 illustrate an actuation of an actuation area B41 in a series of steps.

In embodiments of the switch device 1 having at least two, thus also more than two sensors, for example, four sensors can generally be located in the corner areas or at central areas of side edge sections of the actuation part 20 or the opening, wherein at least one sensor is located at two opposite points of the actuation part 20. In particular, two sensors can also be provided for determining actuations of the actuation part 20, which in relation to the area centroid FS are located at opposite corners, or at central areas of side edge sections of the actuation part 20 or the opening.

In the embodiment of FIG. 1, the at least four sensors 41, 42, 43, 44 and therefore the actuation areas B41 or B42 or B43 or B44, are located in a respective corner are of the actuation part 20 and in particular in a respective corner area of the opening H7. In the embodiments described herein, an example of which is shown in FIG. 12, four of the at least four sensors 45, 46, 47, 48 are each located in a respective central area of side edges of the actuation part 20 or the opening H7 located opposite each other, wherein the respective sensor is preferably located centrally on such a side edge. In these embodiments the actuation areas are also centrally located on a respective side edge. Such actuation areas are labelled in FIG. 12 with the reference numerals B45, B46, B47 or B48. In both variants, additional sensors and therefore corresponding actuation areas, i.e. more than four sensors, can be provided. Irrespective of this, a plurality of sensors can be arranged at one actuation area each.

In general it can also be provided that, in addition to at least one sensor located in each corner of the opening H7 and e.g. four sensors 41, 42, 43, 44, each located in a respective corner of the opening H7, at least one and e.g. four sensors 45, 46, 47, 48 are each located in a respective central area of side edges of the actuation part 20 or the opening H7 situated opposite each other.

The connection layer 31, viewed in the Z direction, can be configured in various different ways, as will be described by reference to a series of Figures:

In the embodiment of FIG. 1 in plan view, i.e. viewed in the Z-direction, the connection device 30, here labelled as 300, comprises a connection layer 310 with four side-arm sections 311, 312, 313, 314, which extend in the shape of a cross from a central area 315, in which the area centroid FS of the actuation part 20 or of the opening H7 is located, towards an edge region of the actuation part 20 or the opening H7, which in each case is located between two actuation areas. The provision of the side-arm sections 311, 312, 313, 314 supports the actuation of the actuation part 20 with a movement of the same by a minimum amount G1 on an area in which a corresponding sensor is located for determining an actuation command, by avoiding or preventing the simultaneous actuation of an adjacent actuation area, for example by simultaneously or inaccurate pressing an actuation area from the actuation side S1. The side-arm sections 311, 312, 313, 314 are thus "switch parts" with regard to the actuation of the actuation plate 20 at a respective actuation area.

In one variant the connection layer can comprise two or three side-arm sections, which each extend from the central area 315 in opposite directions from each other or in a cross shape in the direction of an edge region of the actuation part 20 or the opening H7, which in each case is located between two actuation areas. In an arrangement of the sensors according to the embodiment of FIG. 1, the two or three side-arm sections can extend in opposite directions to each other in such a way that, viewed from the area centroid FS, they extend between two sensors, in each case both of the pair of sensors on a respective side edge section H81, H83 or H82, H84. If the connection layer has three side-arm sections then three appropriately located sensors are provided, in each case for determining an actuation of the actuation part 20.

It can be provided, in particular, that the four side-arm sections 311, 312, 313, 314 each extend at least 50% of the distance from area centroid FS of the actuation surface 20a in the direction of the respective side-arm segment to the corresponding side edge section 21 of the actuation part 20.

In this embodiment of the connection layer 310, this is preferably formed from a single resilient material, or uniformly consists of a resilient material.

In one variant of the embodiments described, at least one substantially inelastic switch part 321, 322, 323, 324 can be located within each side-arm section 311, 312, 313, 314. The term "essentially inelastic" means in general that the switch part 321, 322, 323, 324 has an elasticity at least five times lower than that of the connection layer 301. This supports the described function of the side-arm sections 311, 312, 313, 314. The switch parts 321, 322, 323, 324 can be designed in particular as webs or fins, which project from the actuation surface 20a and extend in the direction of the respective side-arm section 311, 312, 313, 314. The webs or fins can have an oblong design.

In one variant of the connection layer 310 this has only two side-arm sections 311, 312, 313, 314, which extend in opposite directions to each other.

The result of the side arm sections is that, when the actuation part 20 is pressed at a point in a first actuation area (e.g. the actuating range B43) which is located within the same near to an adjacent second actuation area (e.g. the actuating range B42), it is determined with greater reliability whether a specified limit value G1 for the first actuation area (e.g. the actuation area B43) has been exceeded, in order to generate an actuation command corresponding to the first actuation area. Thus, in particular by means of a respective side-arm section, in the case of an inaccurate actuation of an actuation area of the actuation part 20, any deflection at an actuation area whose actuation is not intended is avoided with greater reliability.

In particular, on the basis of the position of the sensors, the distance between the connection surface 10a of the main body 10 and the connection surface 20b of the actuation part 20, viewed in the thickness direction Z, at the position of the respective sensor viewed in the X-Y plane can be detected or determined.

FIG. 9 shows an embodiment of the connection layer 31 of a connection device 400, which is shown there with the reference numeral "410". The connection layer 410 seen in plan view, i.e. in the Z direction, is diamond-shaped or substantially diamond shaped. Accordingly, the outer edge line viewed in the Z-direction of the connection layer 410 comprises four corners or corner regions 411, 412, 413, 414, one of which in each case is located between two corresponding side edge sections 415, 416, 417, 418 that are adjacent to each other and, viewed from the area centroid FS of the actuation part 20, have a concave profile. In the embodiment of FIG. 10, one corner 411, 412, 413, 414 is formed in each case between two corresponding side edge sections 415, 416, 417, 418 adjacent to each other. Alternatively, it can be provided that between two corresponding adjacent side edge sections 415, 416, 417, 418, curved and, in particular viewed from the area centroid FS of the actuation part, concave curved corner sections (not shown) are formed. In these embodiments, each corner or corner section, viewed from the area centroid FS of the actuation part 20, is located in each case between two corresponding and adjacent sensors for one actuation area. At the corners of the 411, 412, 413, 414, a substantially inelastic switch part 405, 406, 407 or 408 in the form of a switch part protruding from the surface 10a or 10b can be arranged, in the form of e.g. a projection, a web, or a rib.

As a variant to the diamond shape of the connection layer 410 shown in FIG. 9, the latter can comprise three corners or corner sections instead of four, which seen from the area centroid FS of the actuation part 20 are located between two of three corresponding sensors adjacent to each other for one actuation area each.

FIG. 10 shows an embodiment of the connection device 31 which is shown there with the reference numeral "500". The connection device 500 comprises a connection layer 510 which, viewed in the Z direction, is circular in shape. The connection layer 510 is provided with a first elasticity in a main area 520 and with additional elasticity regions 521, 522, 523, 524 having a second elasticity, wherein the second elasticity is lower than the first elasticity. It can be provided that the value of the second elasticity is at least 1.5 times less than the first elasticity. The additional elasticity regions 521, 522, 523, 524 viewed from the area centroid FS are located at a position in the connection layer 510 that is located between two sensors adjacent to each other, e.g. the sensors 41, 42, or actuation areas. In this way the additional elasticity regions 521, 522, 523, 524 fulfil the function of switches for adjusting the actuation directions in the actuation of the actuation part 20.

If the connection layer 510 is formed of a foam material it can be provided that the additional elasticity regions 521, 522, 523, 524 of lower elasticity have a lower porosity than the main area 520, whereby a lower resilience is provided.

It can additionally be provided that the connection layer 510 is not circular in shape, but e.g. square. In general the shape of the connection layer 510 can be different if the additional elasticity regions 521, 522, 523, 524 viewed from the area centroid FS are located at a position in the connection layer 510 that is located between two sensors adjacent to each other, e.g. the sensors 41, 42, or actuation areas.

In the connection device 500, additional switch parts 501, 502, 503, 504 can be provided, which viewed in the Z-direction are located outside of the connection layer 510, wherein the additional switch parts 501, 502, 503, 504 seen from the area centroid FS are located at a position in the connection layer 510 between two adjacent sensors, e.g. the sensors 41, 42, or actuation areas.

In FIGS. 11 and 12 an embodiment of the switch device 1 is shown, which comprises sensors 641, 642, 643, 644 for generating actuation commands at actuation positions B45, B46, B47, B48, which are located in a respective central area of side edges of the actuation part 20 or the opening H7 that are located opposite to each other. The connection device 600 has a connection layer 610 which, viewed in the Z direction is circular in shape, but can also have a different shape and can be designed, for example, square or diamond shaped in accordance with FIG. 9. Also, the connecting device 600, as is described by reference to FIG. 10, with a main area with a first elasticity and with additional elasticity regions with a second elasticity, preferably at least 1.5 times lower in value, wherein the additional elasticity regions, seen from the area centroid FS, are situated at a position in the connection layer 610 between two sensors adjacent to each other, e.g. the sensors 641, 642, or actuation areas.

In general, the switch device 1 can have a connection device with a main area with a first elasticity and with additional elasticity regions with a second elasticity, preferably at least 1.5 times lower in value compared to the first elasticity, which seen from the area centroid FS are located at a position in the connection layer which is located between two adjacent sensors or actuation areas.

In the connection device 600, additional switch parts 601, 602, 603, 604 can be provided, which viewed in the Z-direction are located outside of the connection layer 610, wherein the additional switch parts 601, 602, 603, 604 seen from the area centroid FS are located at a position in the connection layer 610 between two adjacent sensors, e.g. the sensors 641, 642, or actuation areas.

In FIG. 13 an embodiment of components of the switch device 1 is shown, in which optional elastic intermediate layers, 651, 652, 653, 654 are arranged, one of which is located between the connection layer 610 and one of the sensors 641, 642, 643, 644.

In principle, a connection device, e.g. the connection device 500 or 600 in embodiments of the switch device 1 according to the invention with or without a connection layer, can have additional switch parts, e.g. in the form of fins or webs, which are substantially inelastic or elastic and are each located between the main body 10 and the actuation part 20 and at a position in the connection layer which, seen from the area centroid FS of the actuation part 20, is located between two adjacent sensors or actuation areas, each for detecting a deflection of the actuation part 20 of the respective actuation area. Generally, any switch parts of the respective embodiments of the switch device 1 that are provided can be mounted on the connection surface 10a of the main body 10 or on the connection surface 20b of the actuation part 20. These switch parts that may be provided cab also be designed as one piece with the main body 10 or the actuation part 20.

Figure 14:
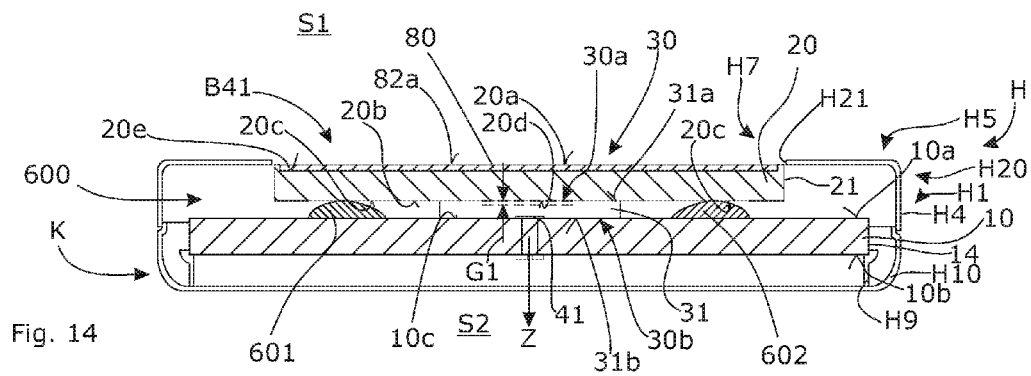

In providing relatively inelastic switch parts it is preferable that the actuation part 20 has an elasticity at which when activated, the actuation part 20 deforms at an actuation area, to exceed the limit value G1 for the deflection of the respective actuation area. In FIGS. 14 to 16 an example is shown of how, by deformation of the actuation part 20, the limit value G1 is exceeded between substantially inelastic switch parts 601, 602 occurs. A relevant area 20c of the surface of 20a is in contact with the switch parts 601, 602, 603, 604.

FIG. 17 shows a variant of the embodiment of the connection device 700 shown in FIG. 13, in which switch parts 701, 702, 703, 704 are integrated in the connection layer 710 as areas of greater elasticity, FIG. 18 shows a further embodiment of the connection device, which is labelled with the reference numeral 700. The connection device 700 has a ring-shaped connection layer 710 viewed in the Z direction, whose centre is located at the area centroid FS of the actuation part 20. In the interior of the connection layer 710 there is a spherical switch part 720, the outer circumferential edge of which rests against the inner edge of the connection layer 710. The spherical switch part 720 is inelastic or substantially inelastic, i.e. has a lower or second elasticity compared to a first elasticity of the optional connection layer 710. It can be provided that the value of the second elasticity is at least 1.5 times lower than the first elasticity. In the connection device 700, additional switch parts 701, 702, 703, 704 can be provided, which viewed in the Z-direction are located outside of the connection layer 710, wherein the additional switch parts 701, 702, 703, 704 seen from the area centroid FS are located at a position outside of the connection layer 710 and between two adjacent sensors, e.g. the sensors 41, 42, or actuation areas.

Alternatively, as is shown by reference to the embodiment 800 of FIG. 20, a gap can also be present between the outer circumferential edge of the spherical switch part 820 and the inner edge of the connection layer 810. The connection device 800 has no additional switch parts.

In the embodiments of the switch device 1 in accordance with FIGS. 18 and 20, this has four sensors 41, 42, 43, 44, each located in the corner areas. In a variation on this, as is also the case in other corresponding embodiments, the four sensors 41, 42, 43, 44 can be at central areas of side sections of the actuation part 20.

In the embodiments of the switch device 1 given herein with a connection layer 31 it can be provided that one or both of the following surfaces:

(a) connection surface 10*a* of the main body 10,
(b) the connection surface 20*b* of the actuation part 20, at least in the area of the respective connection layer 31, i.e. in particular in the area in which these surfaces are connected to the connection layer 31, are designed concave or convex, as seen from the centre of mass of the connection layer 31. The convexity and concavity of the main body 10 or actuation part 20 can be defined in particular by the largest distance d10*b* or d20*b* (FIGS. 22, 23) in the Z direction, which is obtained between different points of the connection surface 10*a* or connection surface 10*a* in the area of the connection of the main body 10 or actuation part 20 to the connection layer 31. For distances d10*b* or d20*b*, in particular a value of one tenth of the maximum thickness of the connection layer 31 in the Z direction can be defined.

In the embodiment of FIG. 22 both the connection surface 10*a* and the connection surface 20*b* are convex in the view shown. In the embodiment of FIG. 22 both the connection surface 10*a* and the connection surface 20*b* are convex in the view shown.

The steps according to FIGS. 27 to 30 show that with at least two limit values G1, G2 on the same sensor and actuating range B41, two actuation possibilities, and thus selection options, can be implemented.

With the embodiment according to FIG. 43 it is shown, alternatively or in addition, that on an actuation area, e.g. the actuation area B41, multiple actuation options and thus selection options can be implemented if two sensors are arranged on at least one actuation area, with which it can be determined using the actuation area identification function 91 on the same actuation area, whether at least one limit value G1, G3 has been exceeded. Thus, at each sensor 41, 42, 43, 44, one additional internal sensor 51, 52, 53, 54, is arranged in relation to the area centroid of the actuation part 20, each of which is located between an external sensor 41, 42, 43, 44, and the area centroid of the actuation part 20. In this context, as shown in FIGS. 35 to 38, it is provided in particular that the limit value G1 of the external sensor, seen from the viewpoint of the area centroid of the actuation part 20, is smaller than the limit value G3 of the respectively assigned internal sensor 51, 52, 53, 54, wherein in particular a factor of at least 1.1 can be provided.

In FIGS. 34 to 37 it is shown that the actuation part can be designed to be elastic in its surface extension, in such a way that for at least two actuation areas located opposite to each other, e.g. actuation areas located diametrically opposite to each other (e.g. B41 and B42) or actuation areas located on the same side edge of the actuation part 20 (e.g. B41 and B43), or optionally also three or four actuation areas (e.g. B41, B42, B43 and B44), a sufficient reduction in distance from two sensors can be obtained by appropriate actuation (F1, F2) while providing an appropriate resilience of the actuation part 20.

In order to implement the actuation function of the switch device 1 when a plurality of sensors of a switch device 1 are present, the areal relation of the actuation areas viewed in the thickness direction Z at points is equal to the spatial relation of the points at which the sensors S are located. In addition, the regions are viewed in the thickness direction Z and the positions of the sensors are located on top of one another, so that the respective relation is obtained.

The term "areal relation" is understood herein to mean the relative assignment of the actuation areas in the X-Y plane. The term "positions of the sensors" is understood to mean the positions of the sensors in the X-Y plane.

Figure 68:
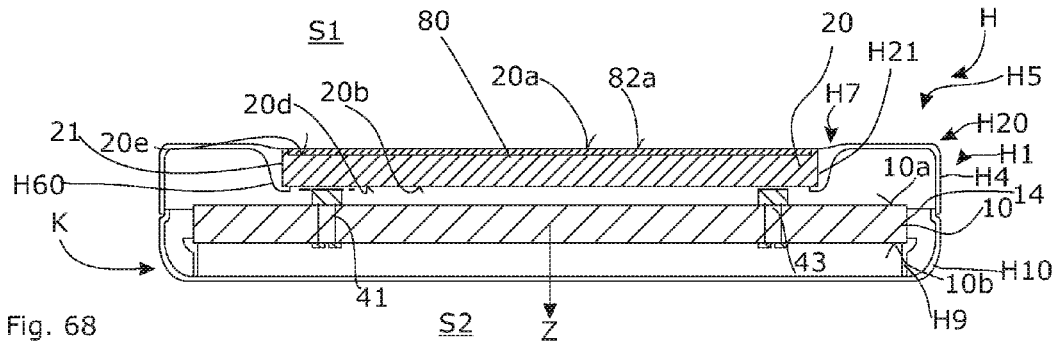
Figure 69:
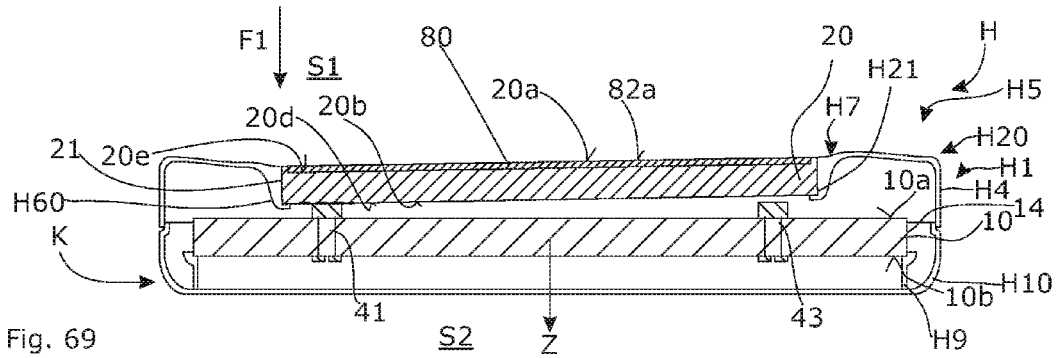
Figure 70:
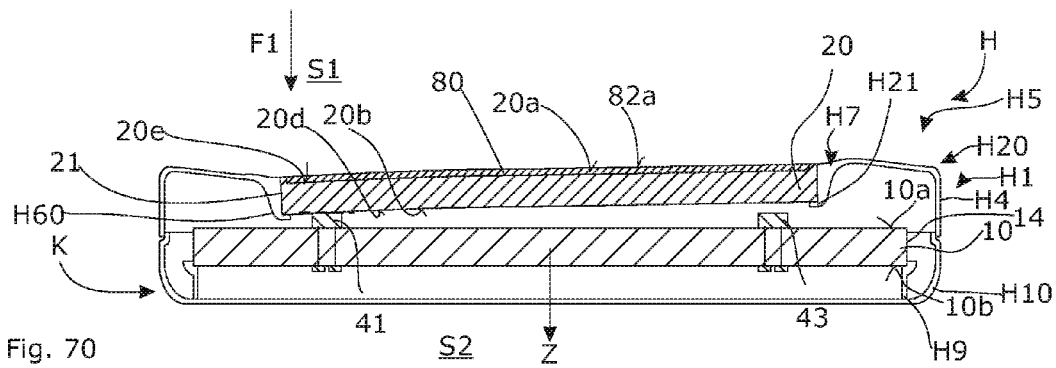

In the embodiment of the switch device 1 according to FIG. 68, the connection device 30 thereof does not have a central connection layer. Rather, the connection device 30 is formed of a plurality of connection layers 61, 62, 63, 64, that are arranged around the area centroid of the actuation part 20, distributed along the outer edge section 21 of the actuation part 20. This arrangement of distributed connection layers 61, 62, 63, 64 can also be used in other embodiments described herein. The connection layers 61, 62, 63, 64 are oblong shaped.

Figure 87:
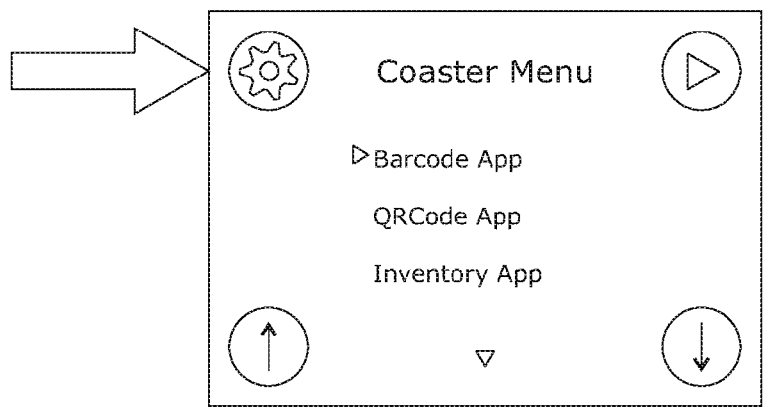
Figure 88:
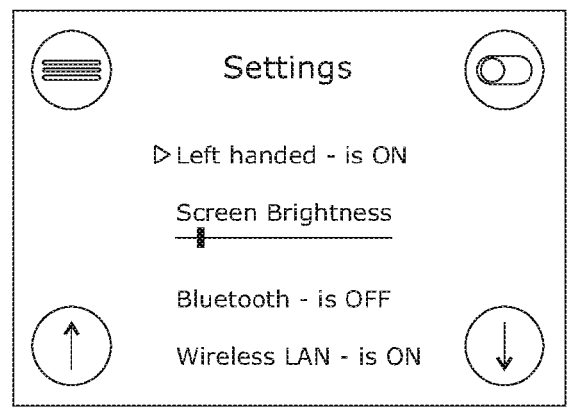
Figure 89:
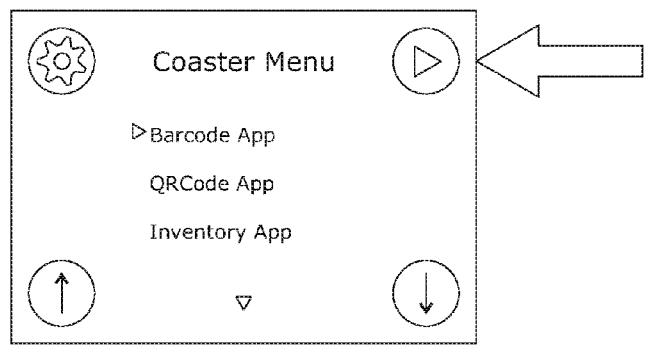
Figure 90:
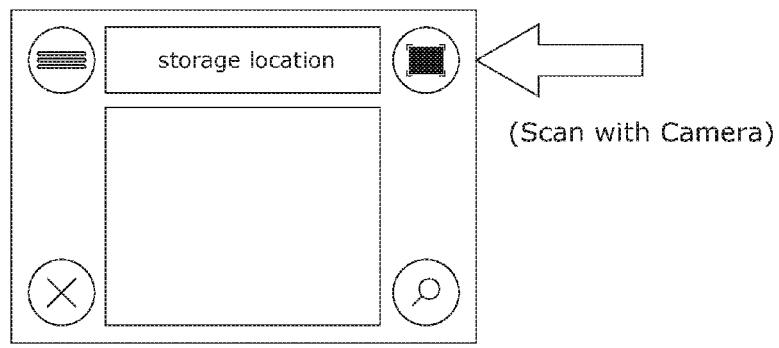
Figure 91:
Figure 92:
Figure 93:
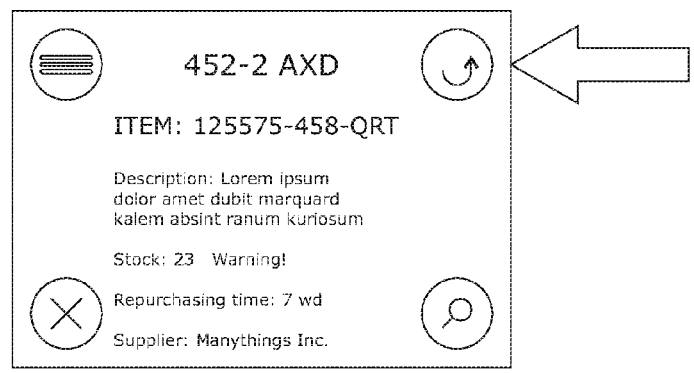
Figure 94:

In the embodiment of the switch device 1 according to FIG. 87, the display 80 is integrated in the base plate 10, wherein the display 80 can be located on the first surface 10*a* of the base plate 10. In this case the actuation part is formed of a transparent material, so that views of the display 80 can be identified on the actuation side S1.

Figure 71:
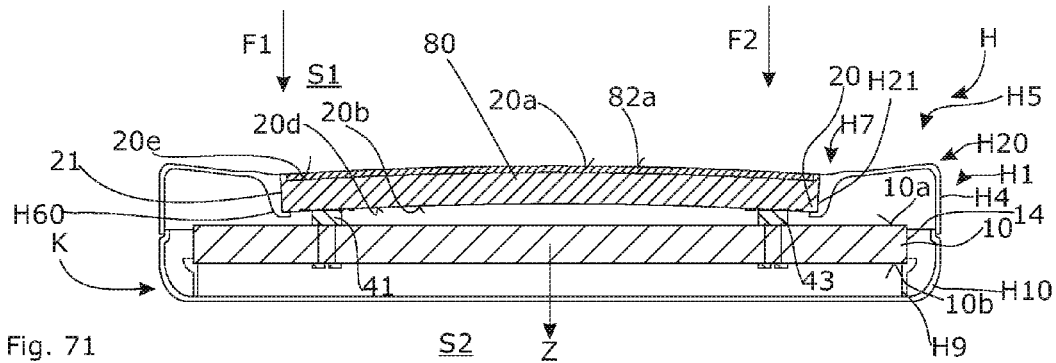

In the embodiment of the switch device 1 according to FIG. 71 it has a connection device 30, which also has no central connection layer, but compared to the switch device 1 according to FIG. 68 comprises circular connection layers 61, 62, 63, 64, that are arranged around the area centroid of the actuation part 20, distributed along the outer edge section 21 of the actuation part 20. In the embodiment of the switch device 1 according to FIG. 90 also, the display 80 is integrated in the base plate 10.

The switch device 1 according to FIG. 68 or 71 can comprise an additional central connection layer 31 located at the area centroid of the actuation part 20, e.g. according to FIG. 1.

FIGS. 78 and 79 show examples of different embodiments of an electrical connection of the display 80 to electrical components K of the base plate 10 by means of a connection device V, and therefore the implementation of a functionality of the switch device. In the embodiment shown in FIG. 79 the switch device 1 comprises a signal connection device V in the form of a cable harness V1 of conductors, which are connected both to electrical components of the display 80 and to electronic or electrical components K of the base plate 10. This cable harness extends through a central opening in the actuation part 20 and, in the case of a centrally arranged connection layer 31, through a central opening of the connection layer 31. In the embodiment shown the cable harness V1 extends through at least one opening of the actuation part 20 and where appropriate, through the connection device 30. In the embodiment in which the electronic components K are arranged on the main body 10, these are connected to electrical conductors of the same. In this case the cable harness is connected to conductors of the main body 10. Optionally, as is shown in FIG. 78 it can also be provided that the cable harness extends through the base plate 10 and if appropriate, is connected on the second side S2 to the conductors that are connected to the components K of the main body 10. In the embodiment shown in FIG. 79 the signal connection device V comprises a cable harness V2 in the form of a broadband cable. In the switch device 1 according to FIG. 79, the cable harness V2 is guided on one side of the switch device 1, i.e. seen from the display 80, away from the side of the actuation part 20 and fed to the main body 10, wherein the cable harness V2 is electrically connected to conductors of the main body 10, thus implementing a wiring of the conductors of the cable harness V2 with the components K mounted on the main body 10.

In general and in particular when a plurality of sensors of a switch device 1 are present, the actuation areas are located in such a way that actuating or exerting a compressive force with a minimum value in a respective actuation area
- depending on the design of the connection device and in particular the shape, number and position or arrangement of the at least one connection layer
- in the direction of the actuation side S1 towards the main body 10 a sufficient reduction occurs in the distance between the main body 10 and the actuation part 20 only in this particular actuation area and therefore only on the sensor, which is located at the respective actuation area or control field. The sensor and a function processing device or evaluation device 90 functionally connected thereto (FIGS. 85 and 86) are designed in such a way that, in the event of such an action, the actuation of the respective actuation area is detected by means of an activation identification function 91.

If a proximity-sensitive and/or touch-sensitive panel 82 is present, which is arranged e.g. on an in particular plate-shaped image generation module 81, then images can be displayed in the display 80 in predetermined display formats using an image production generator 97. A respective control field in the display area of a display panel or in the e.g. plate-shaped image generation module 81 of the display 80 is visualised by being generated by means of the image production generator 97. A control field can be an actuation area (e.g. B41 according to FIG. 4), so that when this actuation area is manual pressed a sensor located at the position of this actuation area and in particular in the Z direction adjacent to it (e.g. the sensor 41), determines a movement of the actuation part 20 at the respective actuation area beyond the limit value G1. It may be the case that control fields are displayed at other positions, in relation to the position of the sensors 40.

The evaluation device 90 described hereafter, can be provided in particular in a switch device 1 according to an embodiment described by reference to the FIGS. 1 to 77. Alternatively, the evaluation device 90 can be provided in combination with a switch device designed in other ways, in particular a switch device known from the prior art with at least one control field that can be generated on the display thereof.

According to one embodiment of the switch device 1, the functions of the evaluation device 90 are functionally integrated in the components K which are mounted on the main body 10 or integrated therein.

The evaluation device 90 can be so designed that the activation identification function 91 of the at least one sensor of the switch device 1 receives signals via a functional conductor 91*e* which correspond to a sufficient reduction of the distance between the main body 10 and the actuation part 20 beyond the limit value G1, at which the actuation area identification function 91 identifies an actuation. In this way the detection of a sufficient reduction in the distance by means of a sensor 40 can be confirmed by the actuation identification function 91.

If a proximity-sensitive and/or touch-sensitive panel 82 is present, the respective control field which may correspond in its position to the relative position of a display actuation area, and in particular can be located therein, can be displayed in particular on a display actuation area by means of a menu control module 96 and an image generator 97 functionally connected thereto, by means of the image generation module 81 functionally connected to the latter, or in the image generation module 81, thus in the display 80. The activation identification function 91, which is functionally connected via the conductor 97*a* to the proximity sensitive and/or touch-sensitive panel 82, can be used to detect whether the control panel displayed in the display 80 has been actuated by a manual gesture, i.e. In particular by pressing a respective actuation area.

Using the menu control module 96, depending on the user functions provided and on a menu format rendered with these on the display 80, meanings can be assigned to the respective control field, which in particular are associated with tasks of an external operating device E to be executed and in particular by participants T or a central system Z.

In general, and in particular in the case of an embodiment of the switch device 1 with the proximity and/or touch-sensitive panel 84 and without the connection device with an in particular elastic connection layer 31, optionally also without actuation part 20, and without sensor system 40, the switch device 1 can be so designed that the actuation of a control field in a menu selection can be effected by selecting an option specified in the control area by touching or approximately touching such an option with the finger by a switch device user, which option is made available in the display area of the display 80.

In general, and in particular in the case of an embodiment of the switch device 1 without a proximity and/or touch-sensitive panel 84 and without the elastic connection layer 31, optionally also without operating part 20 and sensors 40, the switch device 1 can be so designed that the actuation of a control field in a menu selection can be effected by conventional activation or selection of an option specified in the control area, which is made available in the display area of the display 80, thus e.g. by means of keys or a computer mouse or other manual input device.

The actuation of a control field in a menu selection by touching or approximate touching and alternatively or additionally by conventional activation, can also be provided in the embodiment of the switch device with the elastic connection layer 31 and sensors 40.

As shown in FIGS. 85 and 86 shown, in an embodiment of the switch device 1 with the elastic connection layer 31 and sensors 40, the sensor signals generated by the at least one sensor, which correspond to distance values of distances between the main body 10 and the actuation part 20 as a function of an actuation force F1, F2 exerted on the respective actuation area, are passed via functional conductors 91*e*, each connected to one sensor, to the actuation area identification function 91. In general, when actuating a control field of the switch device that is present in the display or is generated by the menu control module 96, an activation of the control field is identified in the activation identification function 91.

In particular in a switch device 1 according to an embodiment described by reference to FIGS. 1 to 77, the activation identification function 91 determines from these sensor signals on the basis of pre-defined actuation minimum values, whether due to the applied force F1, F2 an actuation of an actuation area, in the embodiment of FIG. 1 one of the actuation areas B41 or B42 or B43 or B44, and in what way (possibly a special locking position) has occurred. The actuation area identification function 91 determines, on the basis of at least one pre-defined minimum actuation value assigned to each sensor, whether the distance between the main body 10 and the actuation part 20 at the site of the sensor, which is located on an actuation area moved by an actuation force F1, F2, exceeds at least one pre-defined minimum actuation value (e.g. G1 or G2). If this comparison finds such an excess value, the actuation area identification function 91 determines that an actuation of the actuation part 20 has taken place at the respective actuation area. It can also be provided here that a plurality of limit values G1,G2 or G1, G3 are compared with the sensor values of a sensor or the sensors, so that a plurality of force levels of an actuation force F1, F2 can be determined as different actuations on the same actuation area. The at least one actuation minimum value can be stored in the actuation area identification function 91 as at least one pre-defined value. Alternatively or in addition, the at least one actuation minimum value can be supplied to the actuation area identification function 91 via an interface 95 and by means of the menu control module 96, for example again via a menu function which can be selected via the actuation of an actuation area in a specified menu level or menu selection.

If the actuation area identification function 91 determines that an actuation of an actuation area has taken place on the basis of the procedure described above or in some other manner, such as touch or proximity, then the actuation area identification function 91 sends this actuation information over a functional line 91b to an actuation module 92.

Depending on the embodiment of the switch device 1, the actuation information that is transmitted over a function line 91b to an actuation module 92 can in particular also be generated differently in any of the switch devices, e.g.

in the case of an input gesture of the finger of a switch device user, by touching or approximate touching in or on a control area or control field generated by the generator 97 in the image generation module 81, which is provided in the display area of the display 80 as an input option, or by conventional activation of such an option by means of keys or a computer mouse or another manual input device.

For the input of actuation information in connection with tasks in the area of logistics it is also possible in principle to resort to other devices than those according to the invention, and to this end to use equipment from the prior art (in particular so-called smartphones or so-called tablet PCs). The use of the switch devices according to the invention for this purpose is especially advantageous from the point of view of usability, in particular under industrial conditions (e.g. if the operating person is wearing work gloves).

A participant task to be executed and transmitted to a participant device of a participant of a system by means of the switch device is made available by the menu control module 96 to the actuation module 92 via a function line 96a in a respective control field as a logical task request in a predetermined display format, in particular in the form of an option. An option or logical question can be, e.g.: "Send a Number N1 of storage objects O1 to a goods out area", wherein this option is to be directed to a warehouse vehicle.

The interface 95 comprises in particular an input device, with which data can be received from a participant or from a central system Z or from both. In particular, an optional task and in particular also optionally available commands for fulfilling the task for actuation of the respective participant can be read in from the send and receive device of the interface 95 which can be stored in the central system Z, in particular in the app library or a control system of the respective participant. An output interface 93 may in particular be used to transmit instructions to a or the respective participant.

The menu control module 96 can also be designed such that this is used to display the selection of a menu level or a menu selection format, in particular with a selection option using a selectable selection format in or on the actuation area, in order to identify a participant task to be executed and to display it. For this purpose the menu control module 96 displays one task via one menu and in particular via a corresponding menu selection or one request via a menu, e.g. a request via one menu level, i.e. a menu selection format, on the display 80. The selection of a menu format in a displayed menu selection is made via an actuation of the switch device and an actuation detected using the actuation area identification function 91, in particular based on one of the options in this regard described herein, and on the basis of this actuation, by actuation information being transmitted over the functional line 96a to the menu control module 96, which thereupon provides the selected menu format on the display 80.

In the same manner on the basis of a displayed menu selection a task is selected and is transmitted as command by a participant via the interface 95 to the respective participant for task execution by the same. This is realized by an actuation of the switch device which is determined by the actuation area identification function 91 and by a transmission of an actuation information based on the actuation via the function line 96a to the menu control module 96, which thereupon transmits the selected participant task or a task execution command for execution of the selected participant task to the respective participant.

The respective participant and particularly the control system thereof is realized such that the participant executes the transmitted or received task execution command and thereby realizes the task fulfillment.

The menu control module 96 can also be designed such that in this manner, i.e. with selection options using a selectable selection format, an application function, designated in FIGS. 87, 89, 95 and 96 with the label "app", or one of a plurality of application functions, can be selected by an actuation as described. Such an application function can particularly comprise a participant task and at least a task execution command for fulfilling this task which is assigned to this participant task. It can be provided here that the application function "app" can be called up and is transmitted via the interface 95 by such an actuation, or is available in the menu control module 96 and can be selected there. The application function "app" contains at least a corresponding task execution command which—as described—can be transmitted to a participant for execution of a selected task.

Thus, according to one embodiment of the operating method, in the selected application function App, at least one participant task to be completed by one or more participants T; T1, T2, T3 of the operating system S is selected on the display 80 and the execution of the respective task can be realized based on the transmittal of a task execution command by this participant to a participant.

From the information about the requested participant task and from the actuation information, the actuation module 92 determines a task execution command, which is transmitted over an output line 92a to an output interface 93. The task execution command is a command for a participant T, to execute a task TA. The output interface 93 transmits the signal to an external unit, such as the central system or a participant T or T1, T2, T3 of the operating system S.

Alternatively, it can be provided that the information about the requested participant task, instead of being sent over the functional line 96a, is sent over the functional line

91a to the actuation area identification function 91, which transmits the information about the requested participant task together with the actuation information over the functional line 91 a to the output interface 93.

The output interface 93 transmits the task execution command over a transmission path 93a to the central system Z or to one or more participants T or T1, T2, T3 of the operating system S.

The output interface 93 can in particular comprise a transmission function for sending the task execution commands over a network link in general, and in particular by radio. Furthermore, the output interface 93 can also be configured in such a way that the task execution command can be sent and is sent to the central system Z and all the participants, or to all participants and not to the central system Z. The output interface 93 can also be designed in such a way that alternative participant tasks and at least a respective task execution command can be individually selected and transmitted to a participant on the basis of a menu selection specified by the menu control module 96, or in a corresponding menu level.

The functions described in relation to FIGS. 96 and 97 can also be combined and integrated with each other in other ways, so that in particular the specified functional connections can be simple functional interfaces of a programming system.

The lines designated for the evaluation device 90 can also be transfer procedures within a program product.

Therefore, the switch device according to any one of the embodiments described herein can be used to determine a participant task to be executed by one or more participants T or T1, T2, T3 of the operating system S, and where appropriate display it, and to transmit it as a task execution command over a transmission path 93a to the central system Z or to one or more participants T or T1, T2, T3 of the operating system S.

The functions of the evaluation device 90 described herein can in particular be integrated in the components K of the main body 10, and thus generally form part of a mobile, and in particular portable, switch device and in particular of the switch device 1 according to an embodiment shown in FIGS. 1 to 95. However, the described functions of the evaluation device 90 can be integrated in a switch device integrated which is designed as a smartphone or a laptop, and in particular as a portable computer.

In FIG. 95, the functions of the switch device are shown in a user-related form. The actuation of the switch device in conjunction with a menu selection displayed in a control field by the menu control module 96, is identified with the block "Physical input". An example of the menu selection displayed in a control field by the menu control module 96 is shown in the block designated with the reference numeral "96".

In sections of the actuation areas, at least one spatially distinct surface section 81r, 83r or one spatially distinct surface structure can be formed on the display interface 82a, for the tactile sensing of the respective actuation area. The spatially distinct surface sections can be designed as recessed and/or raised positions relative to the surface extension of the display surface 82a. In this way, a user can sense an actuation area by touch within the otherwise flat, i.e. planar extending surface 11 a. The term "physically distinct structure" is herein understood to mean that this has a plastic structure, thus a shape in which the surface points of the structure can only be defined by means of all three spatial coordinates.

FIG. 96 shows functions and steps of one embodiment of the operating method. In general, in the operating method a plurality of switch devices can be used, and optionally in particular at the same time.

According to one embodiment of the operating method, for all or individual switch devices used, authorizations can exist for the actuation of participant tasks to be executed by participants or for task areas such as storage, production, goods receipt, to each of which a participant task to be executed belongs. It can be provided as part of this that in order to actuate and issue commands for carrying out a participant task to be executed, or to select an associated task area, a corresponding authorization must be enabled. Such a security function can be provided in the central system ("Assignment authorization"). The enabling can be accessed via the interfaces 93, 95 through appropriate actuation of the switch device in conjunction with a menu selection displayed in a control field by the menu control module 96. It can also be provided that appropriate authorizations are issued by the central system Z, by the central system Z being enabled based on the receipt of an access code from a switch device. On this basis the condition can be implemented in the application function or the control function that a participant task and a corresponding task execution command only transmits to a switch device in the case that the same is positioned at maximum a minimum distance from the control device of the respective participant. This condition can also be implemented such that it can be switched off or is engageable.

According to one embodiment of the operating method, after selection of a participant task a selected participant task is submitted by actuation of the switch device 1 to multiple participants T; T1, T2, T3. As examples of a participant T, a production vehicle T1, a post vehicle T2 and a production plant T3 are shown.

The operating system S, in which the operating method takes place, can in particular be a storage system wherein at least two participants T; T1, T2, T3 are operating devices such as e.g. forklift trucks, cranes, moveable vehicles on a storage rack, or a combination of at least one of selection of the same.

The operating system S can also be a production plant.

The participants T or T1, T2, T3 can each comprise a participant system TS, which has an interface in particular for receiving a task execution command submitted by an output interface 93. The participant system TS can also have a priority evaluation function, with which task execution commands received over a working period are each subject to a prioritization of the participant tasks received over a specified working period that correspond to the task execution commands received. The meaning and content of tasks which belong to a respective task execution command can be available in the participant T or T1, T2, T3. Alternatively or additionally it can be provided that where appropriate and in particular on automatic request, these are provided by the relevant participant T or T1, T2, T3 to the central system Z by the central system Z to the respective participant T or T1, T2, T3.

In each or in more than one of the participants T or T1, T2, T3 or the one priority evaluation function, a function for consistency checking by comparison of the participant tasks received at a point in time or in a time period in the active participants T or T1, T2, T3 can take place, e.g. by formation of an overall list of the participant tasks in each participant system TS and a reconciliation of the participant tasks between the participants T or T1, T2, T3, in such a way as to avoid the highest priority being assigned to the same task.

Alternatively or additionally, such a consistency checking function can also be provided in the central system Z. In a case in which the highest priority has been assigned to the same task, a reconciliation is carried out by shifting the priorities, e.g. according to a predetermined prioritization of the participants concerned, in such a way as to avoid the highest priority being assigned to the same task.

In this way, by means of a control system the task with highest priority is processed by each respective participant T or T1, T2, T3, in such a way that each participant T or T1, T2, T3 executes a task with top priority. A control system for this purpose comprises in particular a task implementation function, with which the content-based participant tasks, which belong to a given received task execution command, are executed by the relevant participant T or T1, T2, T3.

It can also be provided that this operating method proceeds over a longer period of time, such as a half or full day or several days, so that several participant tasks are therefore performed. The time period involved can be at least three times the period of time required for the task which is to be executed in the shortest time.

The invention claimed is:

1. A switch device (1), comprising:
    a housing device (H) with a main body (10) with a connection surface (10a), which is facing an actuation side (S1) of the switch device (1), and with a housing part (H1),
    a plate-shaped actuation part (20) arranged thereon, viewed in the thickness direction (Z), with an actuation surface (20a) facing the actuation side (S1) and a connection surface (20b) located opposite to this,
    a display (80) integrated in the actuation part (20) for displaying images on the actuation side (S1), wherein the housing part (H1) comprises: a side wall (H4), which surrounds a connection device (30) and the actuation part (20) viewed in the thickness direction (Z) at least in some sections, and an edge section (H5) which adjoins to the side wall (H4) towards the actuation side (S1) and forms a central opening (H7), in which the display (80) extends, at least in some sections,
    the connection device (30, 300, 400) having at least one connection layer (31, 310, 410) made from an elastic material, which is attached to an inner area (20c) of the connection surface (20b) of the actuation part (20) and is fixed to a second surface (30b) on an inner area (11) of the connection surface (10a) of the main body (10),
    at least two sensors (41, 42, 43, 44), which are located between the main body (10) and the actuation part (20) and viewed in the thickness direction (Z), at the side of the connection device (30), so that each sensor (41, 42, 43, 44) can be used to detect a position of one actuation area, arranged on said sensor, of the second surface (20b) of the actuation part (20) in the thickness direction (Z),
    wherein the connection device (30, 300) has actuation switches located between the main body (10) and the actuation part (20) and seen from the area centroid (FS) are arranged at a point which is located between two adjacent sensors of the same actuation areas.

2. The switch device (1) according to claim 1, wherein the connection layer (310) viewed in the thickness direction (Z) comprises a central area (315), in which the area centroid FS of the actuation part (20) or the opening (H7) is located, and at least two side-arm sections (311, 312, 313, 314), which each extend from the central area (315) in the direction of an edge region of the actuation part (20) or the opening (H7), which region is located in each case between two actuation areas.

3. The switch device (1) according to claim 2, wherein the connection layer (310) comprises four side-arm sections (311, 312, 313, 314), each of which extends from the central area (315) in a cross shape in the direction of an edge region of the actuation part (20) or opening (H7), which region is located in each case between two actuation areas.

4. The switch device (1) according to claim 1, wherein the connection layer (410) viewed in the thickness direction (Z) comprises side edge sections (415, 416, 417, 418), which viewed from the area centroid (FS) of the actuation part (20) are concave and which each connect two of a total of four corners or corner sections (411, 412, 413, 414), wherein a corner or a corner section is located in each case between two corresponding sensors, adjacent to each other as seen from the area centroid (FS), for one actuation area each.

5. The switch device (1) according to claim 1, wherein the connection device (30, 300, 400) comprises switch parts that are inelastic and are each located between the main body (10) and the actuation part (20) and, viewed in the Z direction of the area centroid (FS) of the actuation part (20), at a point between two adjacent sensors, in each case for detecting a deflection of the actuation part (20) of a respective actuation area.

6. The switch device (1) according to claim 1, wherein the connection layer (31, 310, 410) has a main area with a first elasticity and second elasticity regions with a second elasticity that is lower compared to the first elasticity, wherein the second elasticity regions are located at a position in the connection layer which, seen from the area centroid (FS) of the actuation part (20), is in each case located between two adjacent sensors or actuation areas.

7. The switch device (1) according to claim 1,
    wherein the actuation part (20) comprises the display (80), which is located in an inner area (20e) of the actuation surface (20a) of the actuation part (20), viewed in the thickness direction (Z),
    wherein an internal display area (20e) is designed as a recess formed on the actuation surface (20a) and the display (80), viewed in the thickness direction (Z), is located at least partially in the recess.

8. The switch device (1) according to claim 1, wherein actuation part (20) is optically transparent, at least in portions of its area, and wherein the main body (10) has an internal display area (10e) viewed in the thickness direction (Z), in which the display (80) is arranged, the position of the internal display area (10e) being defined according to one of the following alternatives:
    the display area (20e) viewed in the thickness direction (Z) is situated within an area defined by the sensors (41, 42, 43, 44) or between sensors (41, 42, 43, 44) and outside of the at least one connection layer (31) viewed in the thickness direction (Z),
    the display area (20e) viewed in the thickness direction (Z) is situated within an area defined by the sensors (41, 42, 43, 44) or between sensors (41, 42, 43, 44) and viewed in the thickness direction (Z), at least partially inside at least one of the at least one connection layers (31), wherein the at least one connection layer, which is located within the display area (20e), is optically transparent.

9. The switch device (1) according to claim 8, wherein the internal display area (10e) is designed as a recess formed on the actuation surface (10*a*) and the display (80), viewed in the thickness direction (Z), is located at least partially in the recess.

10. The switch device (1) according to claim 1, wherein the plate-shaped actuation part (20) is designed as a rigid part.

11. The switch device (1) according to claim 1, wherein the plate-shaped actuation part (20) is designed as a flexible elastic part.

12. A method for controlling vehicles in a storage area, to deposit storage units in the storage area or to change their storage locations or remove them from the storage area comprising using the device according to claim 1.

13. A method for inputting logistical data or for outputting logistical data, in a warehouse area comprising using the device according to claim 1.

* * * * *